United States Patent
Ziaja et al.

(10) Patent No.: US 12,243,604 B1
(45) Date of Patent: Mar. 4, 2025

(54) SCANNABLE MEMORY ARRAY AND A METHOD FOR SCANNING MEMORY

(71) Applicant: SambaNova Systems, Inc., Palo Alto, CA (US)

(72) Inventors: Thomas Ziaja, Austin, TX (US); Paul Jordan, Austin, TX (US)

(73) Assignee: SambaNova Systems, Inc., Palo Alto, CA (US)

(*) Notice: Subject to any disclaimer, the term of this patent is extended or adjusted under 35 U.S.C. 154(b) by 0 days.

(21) Appl. No.: 18/752,634

(22) Filed: Jun. 24, 2024

Related U.S. Application Data

(60) Provisional application No. 63/569,722, filed on Mar. 25, 2024.

(51) Int. Cl.
  *G11C 29/12* (2006.01)
  *G11C 29/10* (2006.01)

(52) U.S. Cl.
  CPC ........ *G11C 29/12015* (2013.01); *G11C 29/10* (2013.01)

(58) Field of Classification Search
  CPC ............. G11C 29/10; G11C 29/12015
  See application file for complete search history.

(56) References Cited

U.S. PATENT DOCUMENTS

| | | | |
|---|---|---|---|
| 4,293,919 A | 10/1981 | Dasgupta et al. | |
| 6,115,836 A * | 9/2000 | Churchill | G01R 31/31858 714/726 |
| 6,519,729 B1 * | 2/2003 | Whetsel | G01R 31/31721 714/729 |
| 8,553,482 B2 | 10/2013 | Chow | |
| 11,443,822 B2 | 9/2022 | Ziaja et al. | |
| 11,443,823 B2 | 9/2022 | Ziaja et al. | |
| 11,961,575 B2 | 4/2024 | Ziaja et al. | |
| 2017/0115342 A1 * | 4/2017 | Wang | G11C 29/1201 |

* cited by examiner

*Primary Examiner* — Cynthia Britt
(74) *Attorney, Agent, or Firm* — Flagship Patents; Sikander M. Khan; Andre Henri Grouwst

(57) ABSTRACT

An array of memory cells includes a scan chain with one or more chain segments of storage memory cells. Chain segments are separated by chain buffer memory cells. Memory cells of each chain segment are coupled with a sequence generator that generates a sequence of non-overlapping pulses from a pulse in a scan clock (SCLK) signal. The duration of the sequence equals at most a cycle of the SCLK signal. The scan chain applies the pulses to the memory cells backwards starting from the chain buffer memory cell. Memory cells may include a single latch. The array of memory cells may be included in a semiconductor memory subsystem. A scan chain that has a fault condition may be repaired by rerouting the scan chain to avoid the location of the fault condition and to add one or more redundant chain segments.

22 Claims, 39 Drawing Sheets

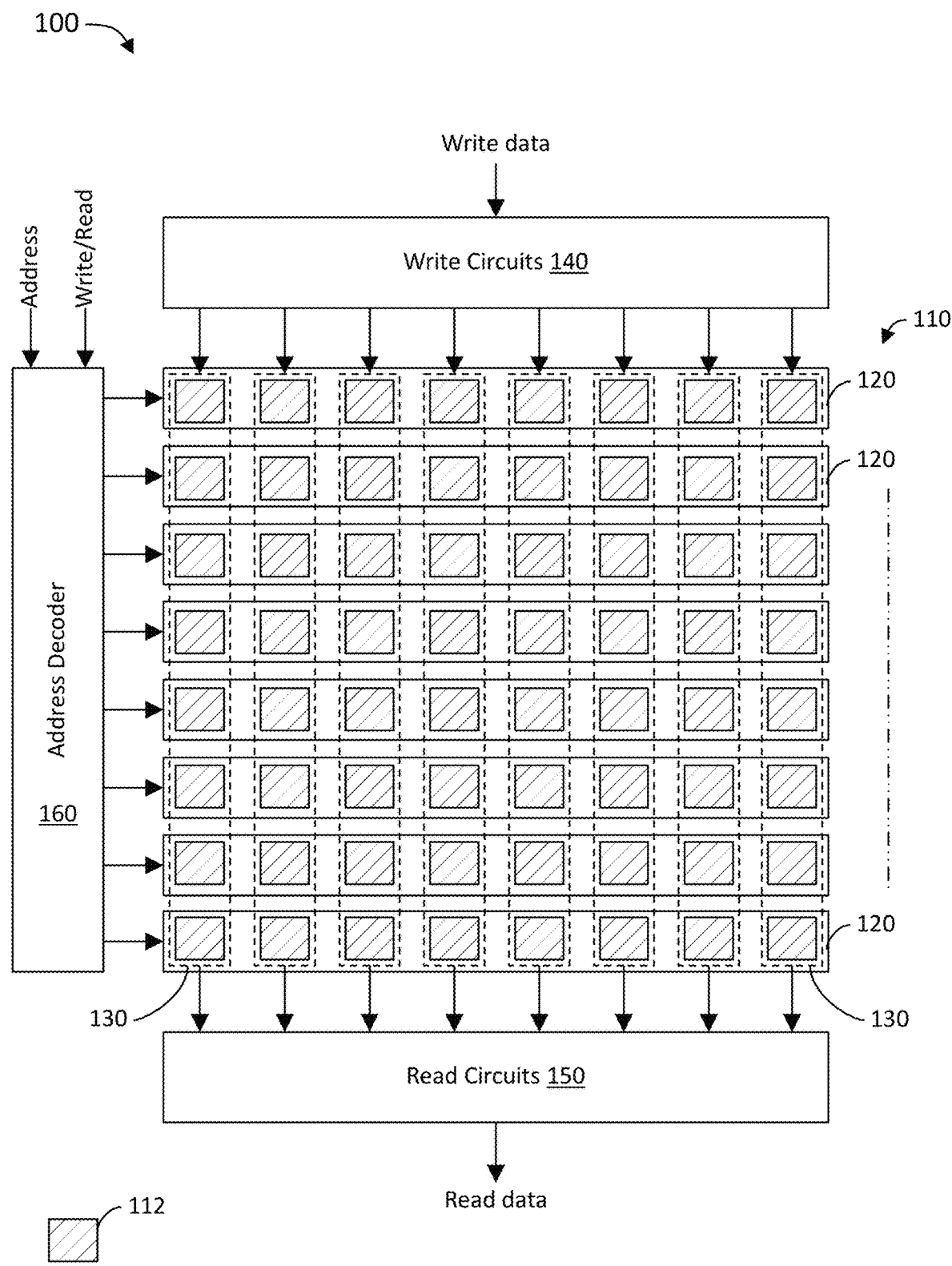
FIG. 1 - Prior Art

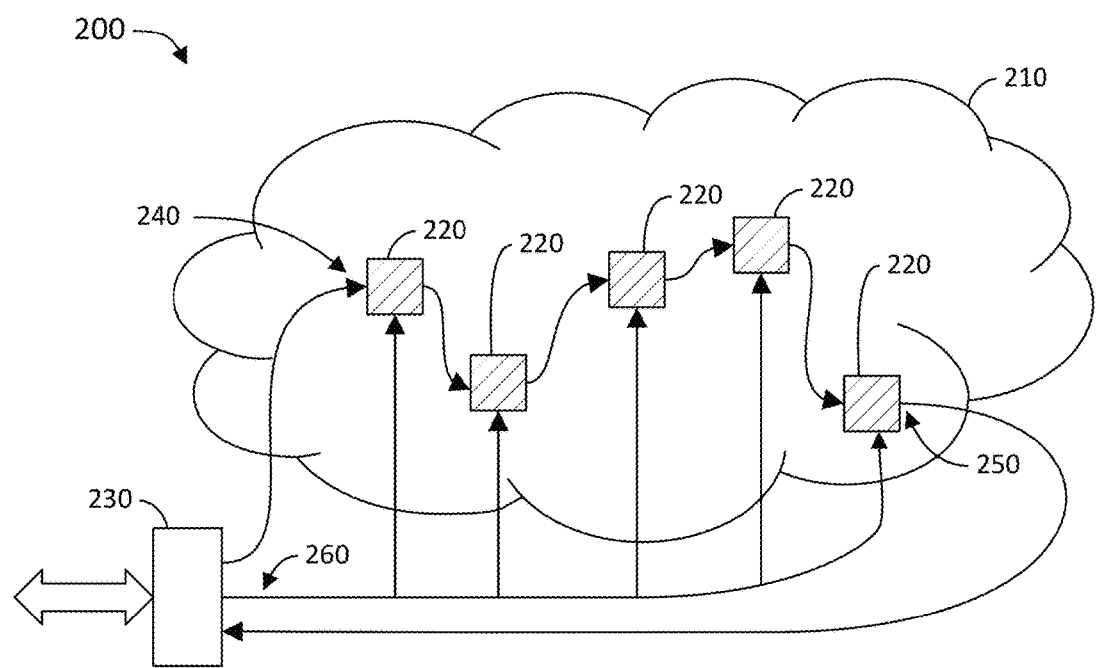
FIG. 2 - Prior Art
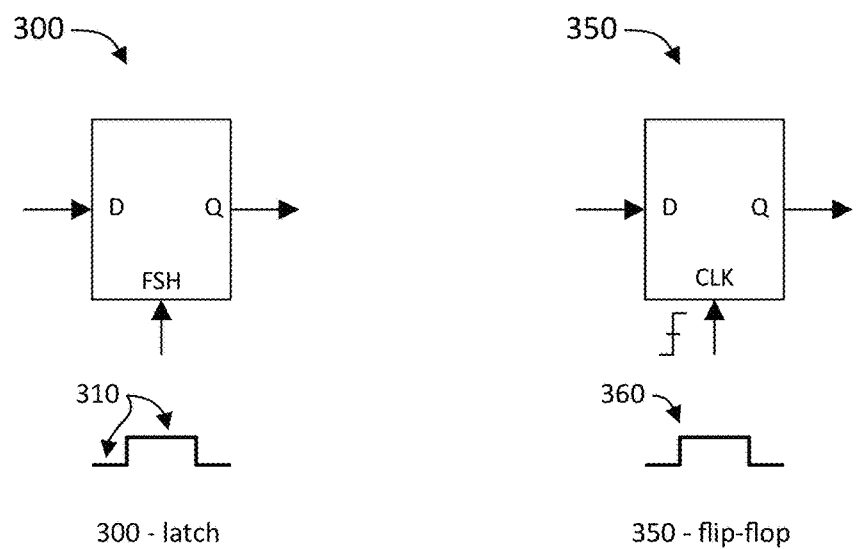
FIG. 3 - Prior Art

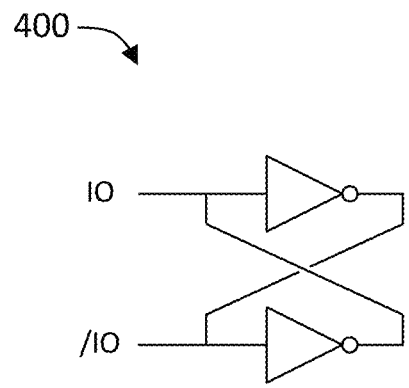
FIG. 4A - Prior Art
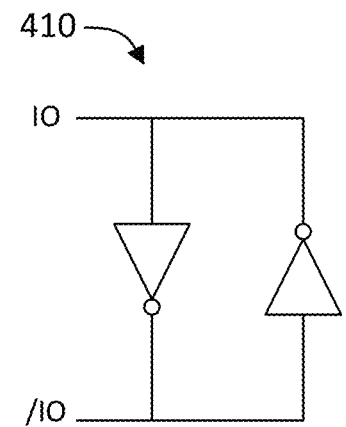
FIG. 4B - Prior Art
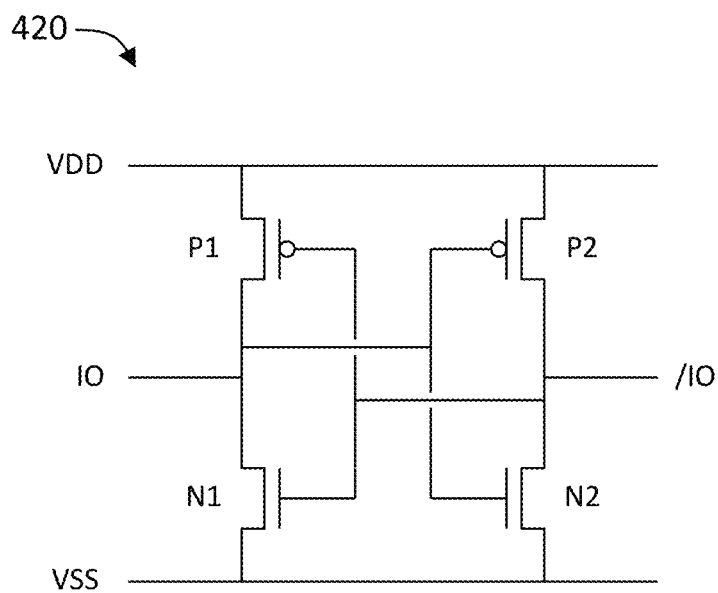
FIG. 4C - Prior Art

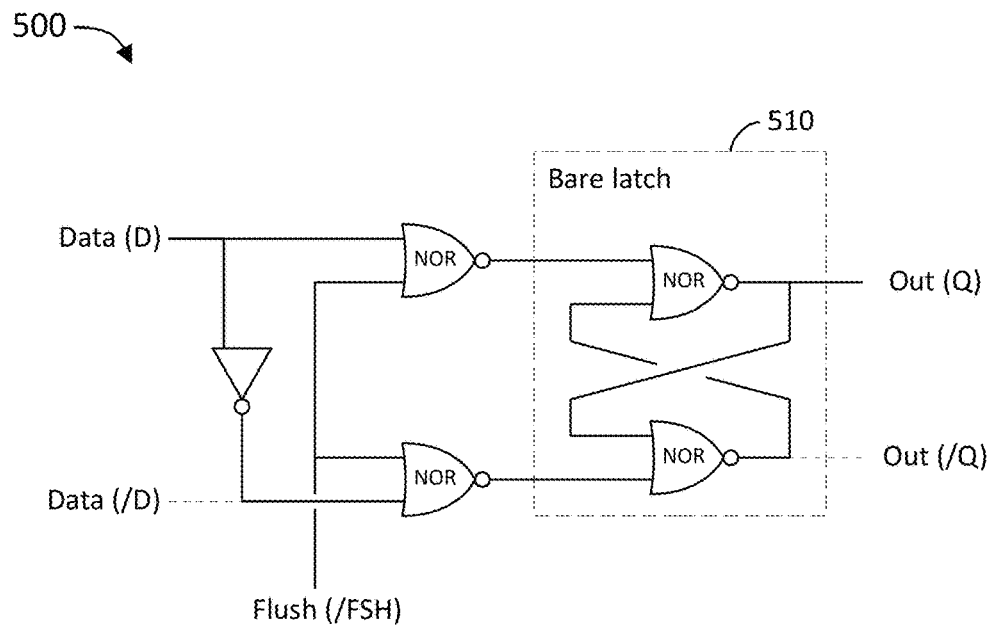
FIG. 5A - Prior Art
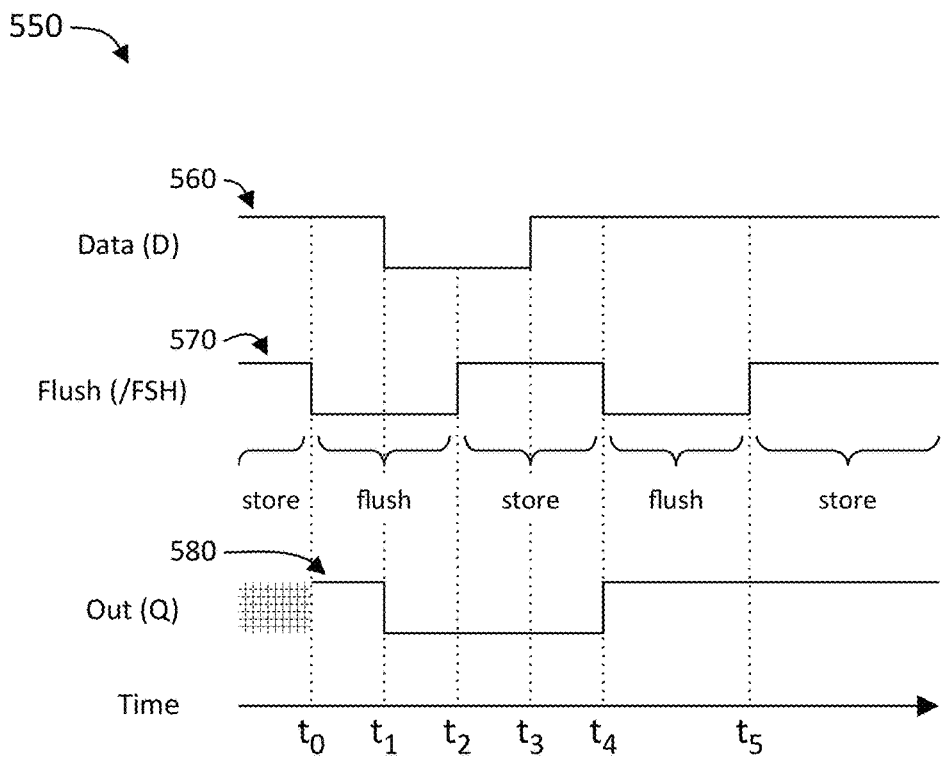
FIG. 5B - Prior Art

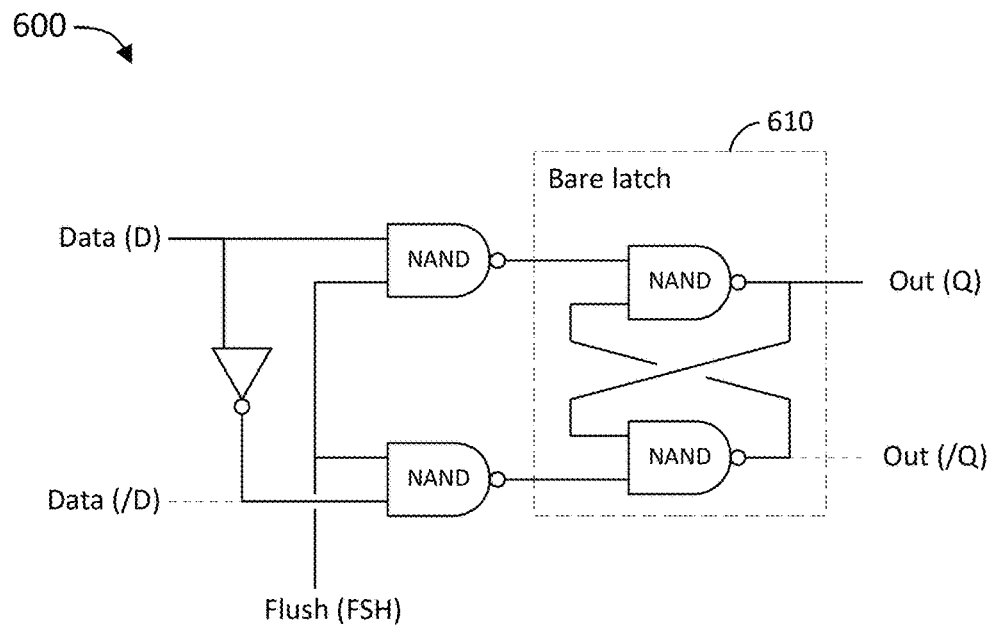
FIG. 6A - Prior Art
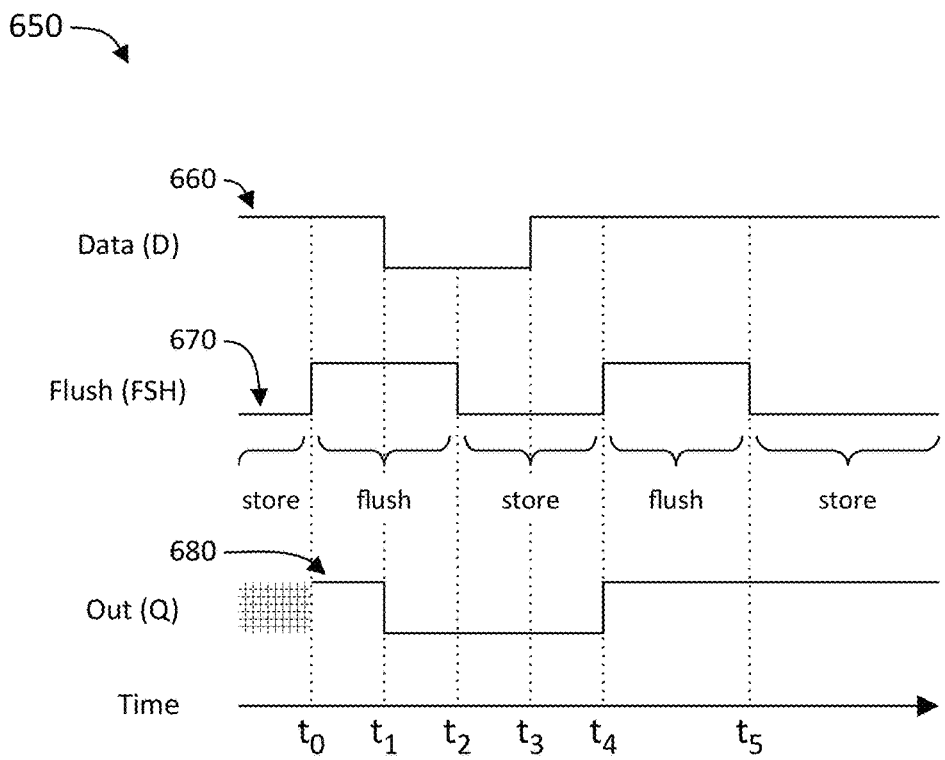
FIG. 6B - Prior Art

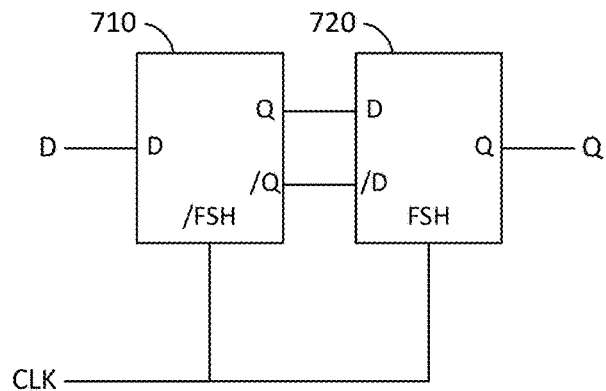
FIG. 7A - Prior Art Flip-flop
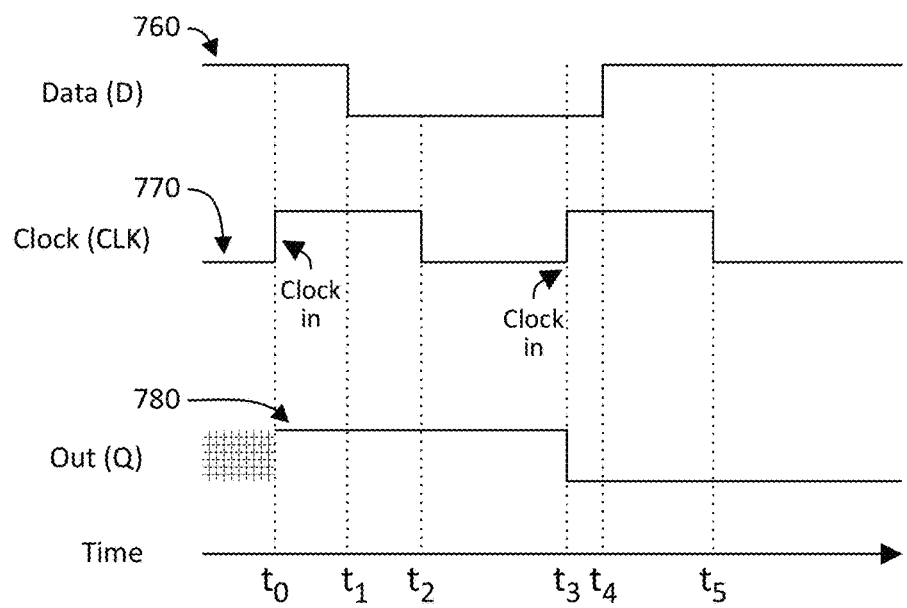
FIG. 7B - Prior Art

800 ↘
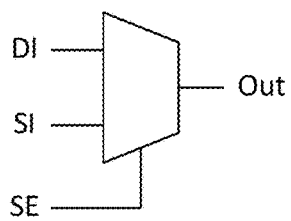
810 ↘
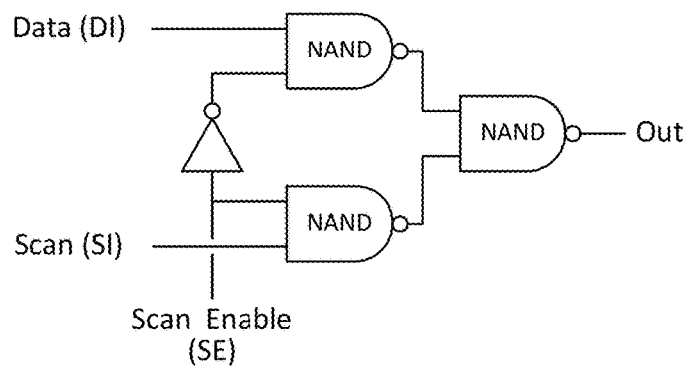
FIG. 8A -
Prior Art
FIG. 8B -
Prior Art
820 ↘
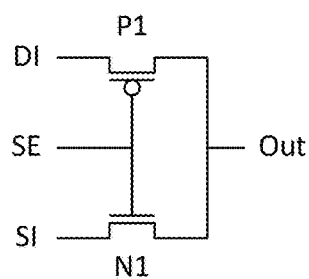
FIG. 8C -
Prior Art

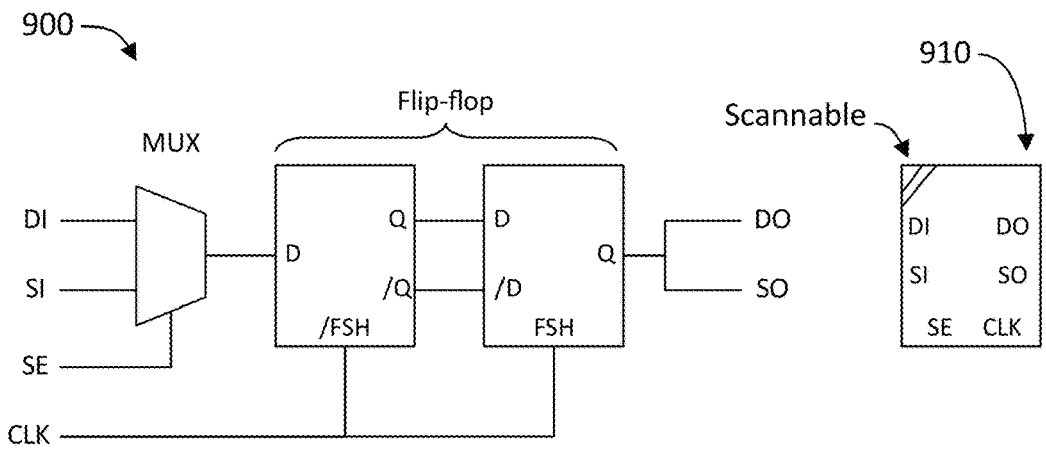
FIG. 9 - Prior Art
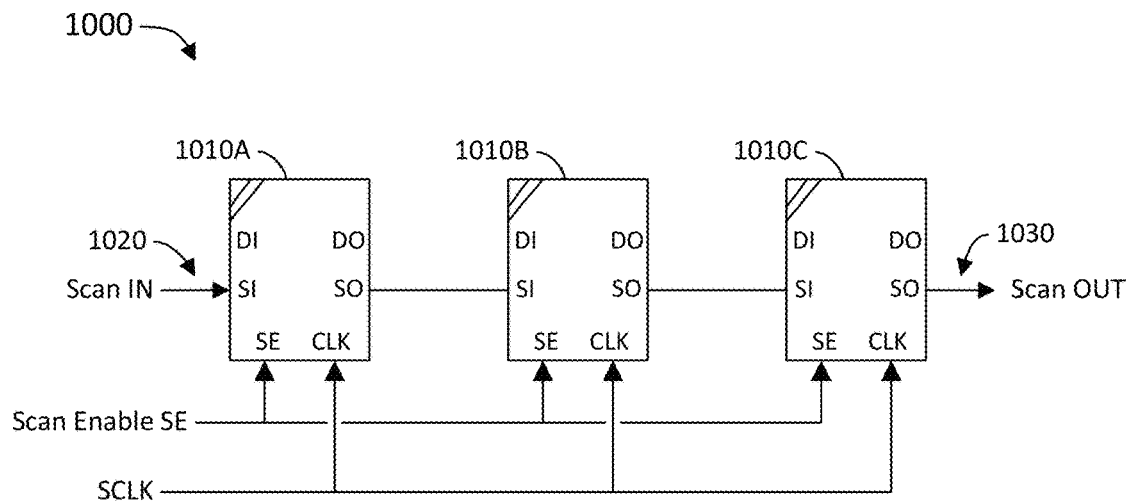
FIG. 10 - Prior Art
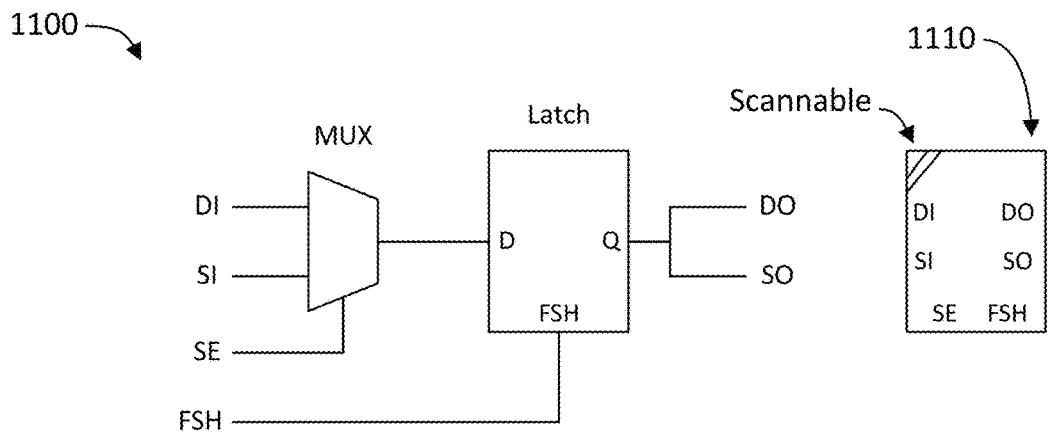
FIG. 11

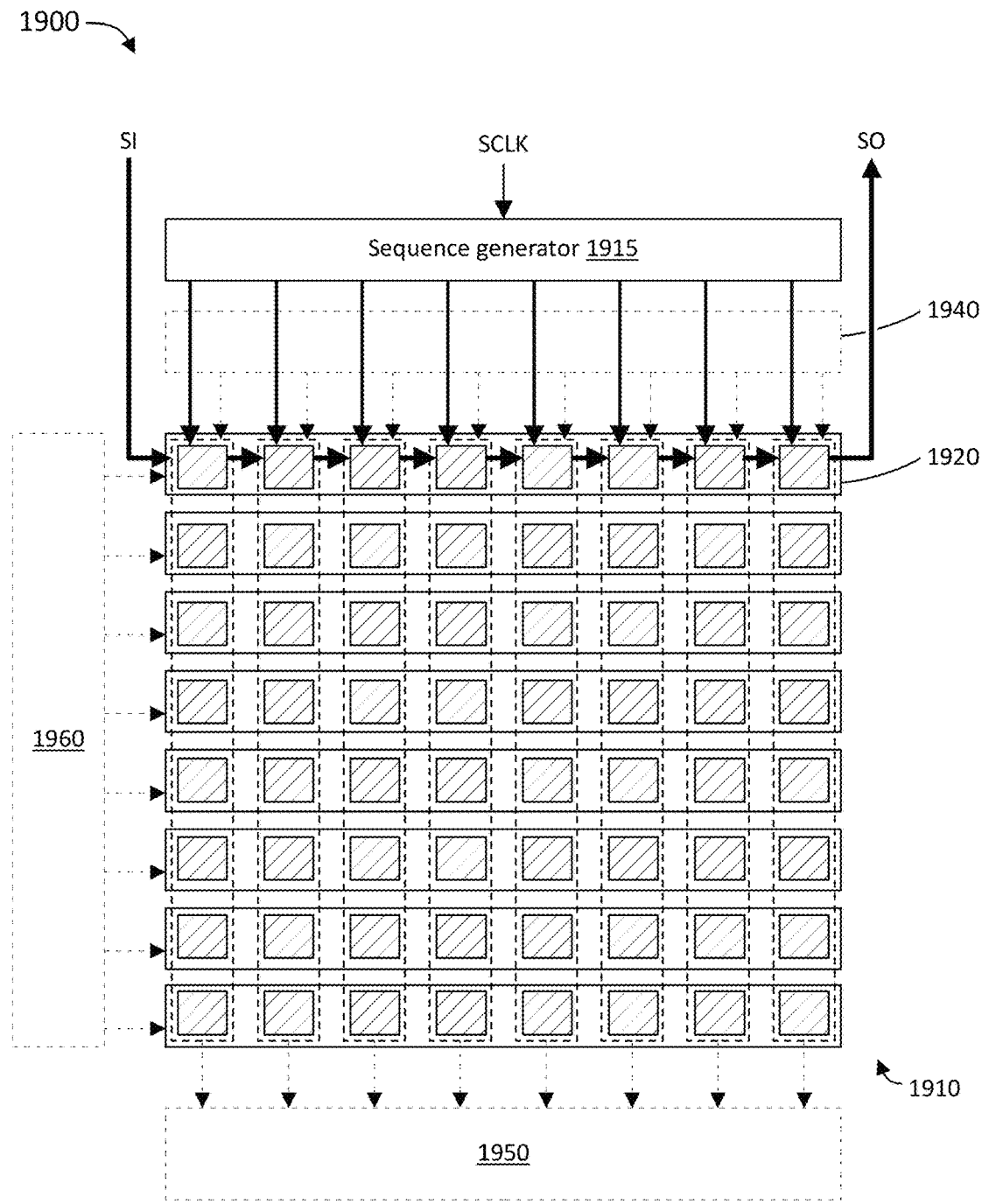
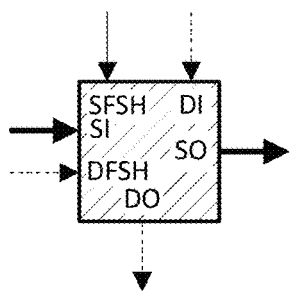
1910 – array
1920 – row
1940 – write circuits
1950 – read circuits
1960 – address decoder
Storage memory cell
FIG. 19

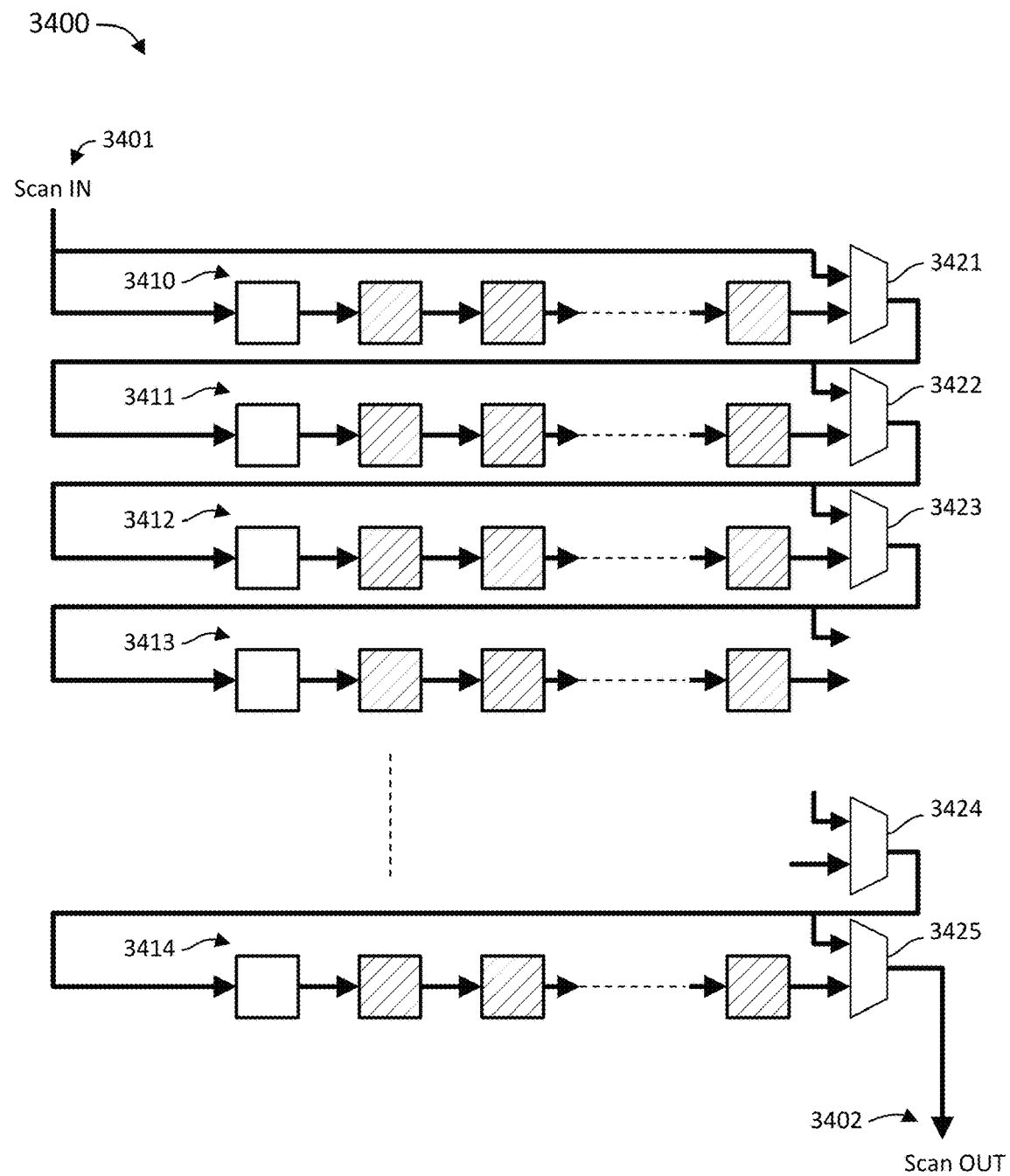
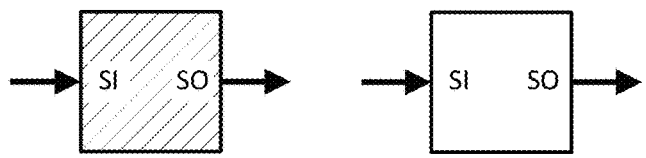
FIG. 34

3500

Shift scan bit values in at least a part of N memory cells in a scan chain using a sequence of non-overlapping pulses during a cycle of a scan clock pulse

3510

Apply the first pulse in the sequence to memory cell N in the scan chain to copy the scan bit value from memory cell N-1 to memory cell N

3520

Apply the second pulse in the sequence to memory cell N-1 to copy the scan bit value from the memory cell N-2 to memory cell N-1

FIG. 35

SCANNABLE MEMORY ARRAY AND A METHOD FOR SCANNING MEMORY

REFERENCES

This application claims priority from U.S. provisional patent application Ser. No. 63/569,722, entitled "Scannable Memory," filed on Mar. 25, 2024. The priority application is hereby incorporated by reference, as if it is set forth in full in this specification.

This application is related to U.S. patent application Ser. No. 18/207,482, entitled "Fully Scannable Memory Arrays", filed on Jun. 8, 2023, by the same inventors and applicant, and which is co-owned by the same assignee. This application is further related to U.S. patent application Ser. No. 17/468,024, entitled "Method and Circuit for Row Scannable Latch Array", filed on Sep. 7, 2021 and subsequently issued as U.S. Pat. No. 11,443,822; U.S. patent application Ser. No. 17/468,066, entitled "Method and Circuit for Scan Dump of Latch Array", filed on Sep. 7, 2021 and subsequently issued as U.S. Pat. No. 11,443,823; and U.S. patent application Ser. No. 17/942,059, entitled "Single 'A' Latch with an Array of 'B' Latches", filed on Sep. 9, 2022 and subsequently issued as U.S. Pat. No. 11,961,575. This application is further related to U.S. patent application Ser. No. 18/752,638, entitled "Scannable Memory Subsystem," and to U.S. patent application Ser. No. 18/752,645, entitled "Hybrid Scan Chains with Flip-flops and Latches," both filed concurrently herewith. The related patent applications are hereby incorporated by reference, as if it is set forth in full in this specification.

BACKGROUND

Technical Field

The disclosed implementations relate generally to electrical computers and digital data processing systems: input/output, and more specifically to systems and methods used in testing of integrated circuits (ICs), and design-for-test (DFT) of memory ICs.

Context

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves can also correspond to implementations of the claimed technology.

Memories on integrated circuits have until now been tested in a variety of ways, including functional tests, built-in self-test (BIST) specially adapted for memory (MBIST), and random or pseudo-random tests. Scan test is seldom or never used because of the high cost of the flip-flop required in a conventional scan chain architecture. However, a scannable memory can offer large benefits both for debugging prototypes and for production testing.

A prior patent, U.S. Pat. No. 11,443,822 entitled "Method and Circuit for Row Scannable Latch Array" described a scannable latch array that scanned data one bit per scan clock pulse.

BRIEF DESCRIPTION OF THE DRAWINGS

The technology will be described with reference to the drawings, in which:

FIG. 1 illustrates the architecture of an example memory block that includes an array of memory cells arranged in rows and columns. A row of the memory cells stores a data line that typically includes one or more successive data bytes.

FIG. 2 illustrates a conventional scan chain. Even though it is based on memory elements (scannable flip-flops), it is too expensive for a memory array on a commercial system-on-a-chip (SoC) or processor IC.

FIG. 3 compares two memory elements, a latch and a flip-flop. This example looks at a D-latch and a D-flip-flop and compares their behavior.

FIGS. 4A-C illustrate a bare latch in a cross-coupled configuration, redrawn in a ring configuration, and an example transistor-level implementation in complementary metal-oxide-semiconductor (CMOS) technology. A bare latch is made of inverting gates, such as inverters, not- and (NAND) gates, or not-or (NOR) gates.

FIGS. 5A-B illustrate an example gate-level implementation of a D-latch using NOR gates, and an example timing diagram that illustrates when it is transparent and when it is storing data. A D-latch can be implemented with 18 or 16 transistors.

FIGS. 6A-B illustrate an example gate-level implementation of a D-latch using NAND gates, and an example timing diagram that illustrates when it is transparent and when it is storing data. This D-latch, too, can be implemented with 18 or 16 transistors.

FIGS. 7A-B illustrate an example of a D-flip-flop and a timing diagram that illustrates when it captures input data and copies the input data to its output. A flip-flop includes a "master latch" and a "slave latch". The D-flip-flop is never transparent. This D-flip-flop, using the D-latches of FIG. 5A or FIG. 6A, can be implemented with 34 or 36 transistors.

FIGS. 8A-C illustrate example implementations of a scan input multiplexer. The multiplexer, if built from standard gates, may use 14 transistors. However, in a mixed-signal implementation it may be realized with as few as 2 transistors.

FIG. 9 adds the scan input multiplexer of FIGS. 8A-C to the D-flip-flop of FIGS. 7A-B to create a conventional scannable D-flip-flop, such as may be used in a conventional scan chain. In a gate-level implementation it can be realized with 48 or 50 transistors. In a mixed-signal implementation it can be realized with 36 or 38 transistors.

FIG. 10 illustrates a conventional scan chain built from a series of D-flip-flops. Adjacent memory elements are clocked at the same time, and their clock inputs are connected to each other.

FIG. 11 illustrates an example scannable latch that can be used in the disclosed technology. A scan input multiplexer is combined with a latch, for example the D-latch shown here.

FIG. 19 illustrates an example array of memory cells with a scan chain that spans one row.

FIG. 34 illustrates details of an example scannable array of memory cells that supports built-in self-repair (BISR) along rows. A multiplexer at the input of each chain segment (or of each row) allows for bypassing one or more chain segments or rows that have shown a fault condition.

FIG. 35 illustrates an example method of scanning memory cells in a scan chain. This method does not assume that the scan chain is segmented and has segment buffer memory cells.

Figure 12A:
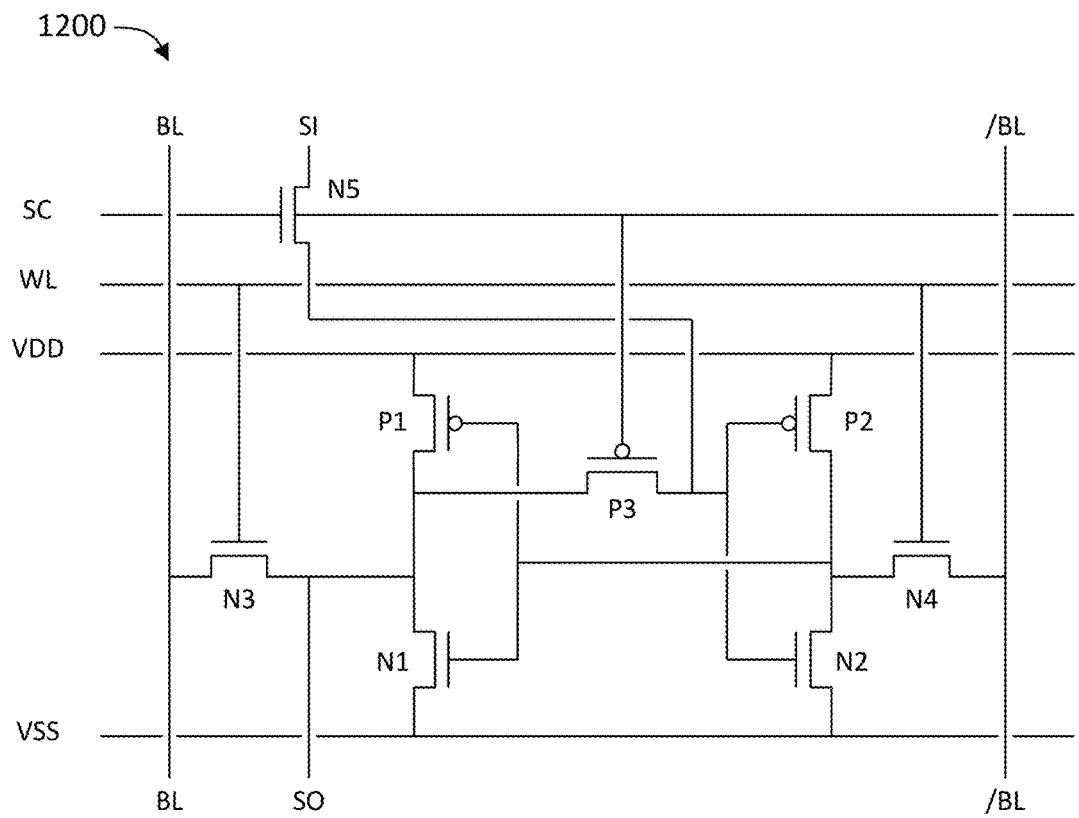
FIGS. 12A-B illustrate an example of a scannable latch configured as an SRAM cell. SRAM cells are optimized for use in large arrays, typically using only 6 transistors. Adding scannability adds only two transistors, for a total of 8 transistors.

In the figures, like reference numbers may indicate functionally similar elements. The systems and methods illustrated in the figures—and described in the Detailed Description below—may be arranged and designed in a wide variety of different implementations. Neither the figures nor the Detailed Description are intended to limit the scope as claimed. Instead, they merely represent examples of different implementations.

DETAILED DESCRIPTION

A popular method of testing large digital integrated circuits (ICs), especially a system-on-a-chip (SoC) or a processor IC, is the use of scan chains. Scan chains are formed of memory elements that are usually already embedded in the design. Scan chains are not enabled during normal operation, as the memory elements may be coupled with each other via digital gates and other circuits to achieve the design's function. When a scan is performed, the memories are temporarily linked with each other via dedicated circuits, forming one or more scan chains that can be used for presetting or reading out their content. Presetting their content allows controlling the memory content to provide known input data for testing the gates and circuits. Reading out their content allows observing the effect of the test on the state of the gates and circuits. The ability to control and observe allows a chip designer to verify correctness of the chip's operation. It also allows for low-cost testing of chips during volume production.

Conventional scan chains are built using scannable flip-flops, memory elements that may require at least 20 transistors to build. However, an array of memory cells can be very large, and is built using latches or other optimized cells to save chip area and thus reduce cost. A D-latch based memory cell may require only 8 or 10 transistors, and a static random-accessible memory (SRAM) cell normally requires only 6 transistors. Until now, no architecture was known that would affordably support scan in an array of latches. As a result, large memories blocked scan testing of surrounding logic and automated production test of memories required much more expensive tests, including built-in self-test for memory (MBIST) and functional test.

This document discloses methods, architectures, and circuits to create low-cost large scannable memories, with the potential to forever change design and test of large digital ICs.

Terminology

As used herein, the phrase "one of" should be interpreted to mean exactly one of the listed items. For example, the phrase one of A, B, and C should be interpreted to mean any of: only A, only B, or only C.

As used herein, the phrases "at least one of" and "one or more of" should be interpreted to mean one or more items. For example, the phrase "at least one of A, B, or C" or the phrase "one or more of A, B, or C" should be interpreted to mean any combination of A, B, and/or C. The phrase "at least one of A, B, and C" means at least one of A and at least one of B and at least one of C.

Unless otherwise specified, the use of ordinal adjectives "first", "second", "third", etc., to describe an object merely refers to different instances or classes of the object and does not imply any ranking or sequence.

The terms "comprising" and "consisting" have different meanings in this patent document. An apparatus, method, or product "comprising" (or "including") certain features means that it includes those features but does not exclude the presence of other features. On the other hand, if the apparatus, method, or product "consists of" certain features, the presence of any additional features is excluded.

The term "coupled" is used in an operational sense and is not limited to a direct or an indirect coupling. "Coupled to" is generally used in the sense of directly coupled, whereas "coupled with" is generally used in the sense of directly or indirectly coupled. "Coupled" in an electronic system may refer to a configuration that allows a flow of information, signals, data, or physical quantities such as electrons between two elements coupled to or coupled with each other. In some cases, the flow may be unidirectional, in other cases the flow may be bidirectional or multidirectional. Coupling may be galvanic (in this context meaning that a direct electrical connection exists), capacitive, inductive, electromagnetic, optical, or through any other process allowed by physics.

The term "connected" is used to indicate a direct connection, such as electrical, optical, electromagnetic, or mechanical, between the things that are connected, without any intervening things or devices.

The term "configured to" perform a task or tasks is a broad recitation of structure generally meaning having circuitry that performs the task or tasks during operation. As such, the described item can be configured to perform the task even when the unit/circuit/component is not currently on or active. In general, the circuitry that forms the structure corresponding to "configured to" may include hardware circuits, and may further be controlled by switches, fuses, bond wires, metal masks, firmware, and/or software. Similarly, various items may be described as performing a task or tasks, for convenience in the description. Such descriptions should be interpreted as including the phrase "configured to".

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B". This phrase specifies that B is a factor that is used to determine A or that affects the determination of A. This phrase does not foreclose that the determination of A may also be based on some other factor, such as C. This phrase is also intended to cover an implementation in which A is determined based solely on B. The phrase "based on" is thus synonymous with the phrase "based at least in part on".

The terms "substantially", "close", "approximately", "near", and "about" refer to being within minus or plus 10% of an indicated value, unless explicitly specified otherwise.

The following terms or acronyms used herein are defined at least in part as follows:

Assert and deassert—to "assert" a signal means to make it active, and to "deassert" the signal means to make it inactive. A signal may have two levels, for example a "high" voltage (usually meaning near a supply voltage level) and a "low" voltage (usually meaning near a ground or common voltage level). A signal, or an input, or output may be high when it is active, or activated or active when it is high, in which case its name may be written with capital letters, e.g., FSH. Alternatively, the signal, input, or output may be low when it is active, or activated or active when it is low. In this case, its name may be written with capital letters preceded by a forward slash, e.g., /FSH.

"BISR"—built-in self-repair—the capability of a (usually memory) array to repair itself, for example by skipping an area that contains a fault and using a spare area instead.

"BIST"—built-in self-test—the capability of an integrated circuit to test (a part of) itself, to reduce the time that external test equipment may need to be used to validate the chip's correct functionality. In some cases, BIST can be directed to a specific type of circuit. For example, memory BIST ("MBIST") is dedicated to testing memory arrays.

"Chain segment"—a part of a scan chain that includes a sequence of two or more storage memory cells. A chain segment is bounded on each side by either the scan chain's scan input (SI), the scan chain's scan output (SO), or a segment buffer memory cell. Although the number of memory cells in a chain segment is limited by the semiconductor process capabilities and the used frequency of the scan clock, a scan chain with multiple chain segments in the disclosed technology can be arbitrarily long.

"CLK" or "clock"—in this document, the clock or CLK is an input on a flip-flop, or the signal on that input, used for updating the logical value stored in the flip-flop at the time the flip-flop receives a leading edge of the CLK signal.

"Delay line"—in the context of this document, a delay line is an electronic circuit with one input and multiple outputs. It is sometimes referred to as a multi-tap delay line. A signal presented to the input travels through a chain of delay elements towards the end of the delay line, passing each of the multiple outputs. The outputs may be evenly spaced, in which case the signal is sequentially observable at the outputs, at roughly equidistant times.

"DLL"—delay-locked loop.

"Flip-flop", "D-flip-flop"—a flip-flop is a memory element that can store a logical value (0 or 1). In the context of this document, a flip-flop is never transparent, meaning its output value never follows its input value without a clock transition. When a flip-flop receives a leading edge of a clock pulse, it may update its stored value, which is observable at its output. In general, if the leading edge is positive going (from low to high) then its clock input is shown as CLK. If the leading edge is negative going (from high to low) then its clock input is shown as/CLK. Many types of flip-flops exist. A D-flip-flop is a commonly used type. A flip-flop typically includes two latches.

"FLL"—frequency-locked loop.

"FSH" or "/FSH"—"flush" input—the control input of a latch that determines whether the latch holds its stored value (storage mode) or is transparent (flush mode).

"IC" or "chip"—an "integrated circuit"—a monolithically integrated circuit, i.e., a single semiconductor die which may be delivered as a bare die or as a packaged circuit. For the purposes of this document, the term integrated circuit also includes packaged circuits that include multiple semiconductor dies, stacked dies, or multiple-die substrates. Such constructions are now common in the industry, produced by the same supply chains, and for the average user often indistinguishable from monolithic circuits.

"Latch", "D-latch"—a memory element that can store a logical value (0 or 1). A bare latch operates asynchronously, i.e., without a clock or enable signal. The asynchronous operation means that it is transparent, i.e., its output signal follows its input signal. Many types of latches exist that are "enabled", i.e., extra circuitry allows an enable signal to put the latch in one of two modes: store, or flush (transparent). For the purpose of this document, the enable input is renamed flush input (FSH or/FSH), which better reflects its effect. A D-latch is a commonly used type of latch. However, static random-access memory (SRAM) cells have a different latch configuration, which is smaller and thus better suited for large arrays of memory.

"MBIST"—see BIST.

"Memory cell"—a memory element that is part of a memory array, or array of memory cells. For the purpose of this document, memory cells can be used as storage memory cells or as segment buffer memory cells.

"Memory element"—an electronic device or circuit that can store an electric value. Many types of memory elements exist, including flip-flops, latches, dynamic random-access memory (DRAM) cells, magnetic memory cells, resistive memory cells (memristors), phase-change material cells, etc.

"Multiplexer"—a circuit with two or more data signal inputs and a control signal input. A control signal determines which of the two or more data signal inputs is selected to be electronically coupled with the multiplexer output.

"PLL"—phase-locked loop.

"Pulse shaper"—in the context of this document, a pulse shaper is an electronic circuit that outputs a short pulse when it is given a longer pulse on its input.

"Scan chain"—a chain of memory elements in digital ICs that is temporarily active during a test mode (scan test). The scan chain has an input and an output, so that memory element values can be shifted into the chain or shifted out of the chain by repeatedly applying a scan clock (SCLK) signal to the chain. Writing values into the chain allows controlling test points (at the outputs of the memory elements) and observing test points (at the inputs of the memory elements). Typically, an external test machine writes a test pattern into the scan chain (in scan mode), then operates the IC for one or a few clock cycles (in operational mode), then switches back to scan mode to read operational results out of the IC. If the operational results match required values, the test machine may proceed with additional test patterns (also called test vectors) to obtain an initial level of confidence in the IC's correct functionality. For large ICs, such as processors and SOCs, the test machine usually proceeds with more expensive or more extensive tests. Scan chains can also be used for validating functionality and debugging of ICs.

"Scan clock" or "scan shift clock" ("SCLK")—a signal used during scan mode to shift all stored values in the chain by one position per SCLK pulse (from the scan input towards the scan output).

"Scan enable" ("SE")—a signal used to place an IC, or part of an IC, in scan mode, as opposed to other modes such as operational mode, or various standby and sleep modes. The SE signal is applied to all memory elements in a scan chain, which then ignore data inputs in favor of scan inputs connected to prior memory element outputs in the chain.

"Scan sub-clock pulse" or "ripple pulse"—a pulse output by a sequence generator and used in a chain segment to update a single memory cell to the value of its predecessor in the chain segment. For example, a chain segment with five memory cells may need a sequence of five ripple pulses to shift values stored in all five memory cells by one position. Ripple pulses are non-overlapping to enable working with latches instead of flip-flops. The order of the ripple pulses depends on whether the chain segment includes a segment buffer memory cell, and the position of such a cell.

"Segment buffer memory cell"—a memory cell used in a chain segment that is not used for data storage (and not necessarily addressable) but that enables concatenating multiple chain segments to form an arbitrarily long scan chain. A segment buffer memory cell can be used functionally, as illustrated with reference to FIG. 29, and be temporarily repurposed to support scan.

"Sequence generator"—in the context of this document, a sequence generator is a circuit that receives a scan clock (SCLK) pulse, and outputs a sequence of scan sub-clock pulses on separate outputs.

"Storage memory cell"—a memory cell used in a chain segment, as well as in an IC's operational mode to store information.

"Sub-clock sequence"—a sequence of non-overlapping scan sub-clock pulses.

Latch-Based Scan Chains

FIG. 1 illustrates the architecture of an example memory block 100 that includes an array of memory cells 110 arranged in rows and columns. A row 120 of the memory cells 112 stores a data line that typically includes one or more successive data bytes. A column 130 of the memory cells stores bits that are in the same position on successive data lines. Some implementations may access an individual location in the array through its row address and column address, where a row may be addressed through one or more wordlines (not drawn) associated with the row, and a column may be written or read through one or more bitlines (not drawn) associated with the column. Other implementations may access a whole data line in the array through just its row address. Yet other implementations may access parts of a data line through its row address and selected column addresses.

An implementation may transfer write data into array of memory cells 110 via write circuits 140. Depending on the type of memory and its purpose, write circuits 140 may include segment buffer memory cells, line drivers, and/or other circuits. An implementation may obtain read data from array of memory cells 110 via read circuits 150. Depending on the type of memory and its purpose, read circuits 150 may include sense amplifiers, segment buffer memory cells, multiplexers, demultiplexers, and/or other circuits.

Some implementations share bitlines for writing data and reading data. Those implementations may not be able to simultaneously write into one (row) address and read from another (row) address. Other implementations have dedicated bitlines for writing data, separate from bitlines for reading data. Those two-port memories (or multiport memories) may be able to simultaneously write and read data into and from different row addresses.

Memory block 100 includes a row address decoder 160 that receives a row address and that activates one or more wordlines associated with the row address, deactivating all other wordlines. Implementations that can address individual bit locations stored in array of memory cells 110 may also include a column address decoder (not drawn).

For large memory blocks, the size, power dissipation, and often the performance (speed) are highly important, as these can impact the cost (and viability) of manufacturing and operating the integrated circuit (IC) that incorporates the memory blocks. Thus, the design of the memory cell is highly optimized. This means, for example, that the number of transistors inside the memory cell and the number of wires connected to the memory cell are kept as low as possible. However, this makes it difficult (i.e., time consuming and therefore expensive) to test a memory block when a chip has been produced and must be tested before it may be shipped to a customer. A popular method of production testing of digital chips, using (conventional) scan chains to control and observe individual memory elements in a chip, cannot be used in a large memory block because scannable flip-flops would be prohibitively expensive. This document introduces new scan chain architectures, circuits, and methods that enable low-cost scanning of arrays of memory cells.

FIG. 2 illustrates a conventional scan chain 200. Even though it is based on memory elements (scannable flip-flops 220), it is too expensive for a memory array on a commercial system-on-a-chip (SoC) or processor IC. Scannable flip-flops 220 are memory elements in an electronic circuit 210 that typically further includes digital logic, input and output circuits, data interfaces, registers, and other circuits. In scan mode, scannable flip-flops 220 are linked in a chain that starts and ends in a test interface 230. Test data enters scan chain 200 at scan input 240 and observation data exits scan chain 200 at scan output 250. Test interface 230 also provides a scan clock (SCLK 260) to each of the scannable flip-flops 220, and a scan enable signal (wiring not drawn). Test interface 230 can place electronic circuit 210 in two modes: scan mode (by asserting the scan enable signal), and operational mode (by deasserting the scan enable signal). In scan mode, the scan chain is enabled, and test interface 230 can shift a series of bits into and out of the scan chain by successively clocking scannable flip-flops 220 with SCLK 260. Typically, scannable flip-flops 220 are placed in electronic circuit 210 in such a way that they partition combinational logic into sections (operating stages) that execute relatively simple functions. In scan mode, each operating stage's input signals can be controlled by scannable flip-flops 220, and its output signals can be observed by scannable flip-flops 220. Coverage of scan chain controllability and observability is usually close to 100%. In operational mode, scan circuitry is inactive, and scannable flip-flops 220 function to provide layers of clocked synchronization between the operating stages. Alternatively, they may function as registers, or other functional elements.

Although in contemporary high-speed processor ICs electronic circuit 210 can have an operational clock frequency of a few gigahertz, scan chains often operate at lower scan clock frequencies, as they need to interface with external automated test equipment (ATE) and designing the scan chain for faster clocks would be too expensive. The scan clock is often in the range of 100 to 400 megahertz.

FIG. 3 compares two memory elements, a latch and a flip-flop. This example looks at a D-latch 300 and a D-flip-flop 350 and compares their behavior. Both memory elements have a data input (D) and a data output (Q). They often also have a negative data output (denoted as /Q), and in some cases they may have a negative data input (denoted as /D). Latches are often shown as having an enable input (E or /E), which in this document has been renamed flush input (FSH or /FSH) to express its effect much more clearly. In contrast, a flip-flop is shown as having a clock input (CLK or /CLK).

A latch has two modes and is said to be level sensitive 310. That is, when the flush input is deasserted (/FSH is high or FSH is low), the latch is in storage mode: its output shows the most recent value that was available on its input before it went into storage mode. When the flush input is asserted (FSH is high or /FSH is low), the latch is in flush-through (transparent) mode: its output follows its input. The time of deasserting the flush input is important: it determines the latch input value that is captured.

In contrast, a flip-flop always stores data, and it is said to be edge sensitive 360. The timing of the clock edges determines its two possible events. D-flip-flops, as shown with reference to FIGS. 7A-B, typically respond when the clock is asserted. They immediately copy the input data to the output, and hold the output at the new value until the clock is asserted again. Other D-flipflops may respond when the clock is deasserted. In examples in this document, the two latches of a flip-flop are always in opposite states and a flip-flop is never transparent, providing the data separation needed for creating synchronous digital circuits. The same data separation is also a key enabler in the architecture of conventional scan chains, as will be illustrated with reference to FIG. 13.

FIGS. 4A-C illustrate a bare latch in a cross-coupled configuration 400, redrawn in a ring configuration 410, and an example transistor-level implementation 420 in complementary metal-oxide-semiconductor (CMOS) technology. A bare latch may be made of inverting gates, such as inverters, not-and (NAND) gates, or not-or (NOR) gates. A bare latch doesn't have an FSH input, and its inputs are also outputs. It has both an input-output IO terminal, and an inverted input-output /IO terminal. When one of its terminals is high, the other is low. Because the information travels in a loop that sustains itself, the latch remembers its state. To change the value stored in the latch, an external circuit must overdrive it and force it to assume the other value. FIG. 4A shows the latch as cross-coupled devices. FIG. 4B shows it as a ring circuit.

There are several ways that a latch as shown in FIG. 4A or FIG. 4B can be implemented, but probably one of the smallest and most used transistor-level implementations is shown in FIG. 4C. A first inverter gate is formed by transistors N1 and P1, and a second inverter gate is formed by transistors N2 and P2.

Although the bare latch is hugely important as a building block, it is not very convenient for logic designers who rely on electronic design automation software to synthesize their circuits. Synthesis software is typically not capable of handling analog or mixed-signal circuits.

FIGS. 5A-B illustrate an example gate-level implementation of a D-latch 500 using NOR gates (FIG. 5A), and an example timing diagram 550 (FIG. 5B) that illustrates when it is transparent and when it is storing data. The D-latch of FIG. 5A can be implemented with 18 or 16 transistors. The bare latch 510 includes two cross-coupled NOR gates, whose second inputs eliminate the need to overpower the latch to change its state. Bare latch 510 still needs two complementary input signals. If D-latch 500 has only a single data (D) input, an inverter generates the inverted input signal. Two intervening NOR gates, coupled with the inverted flush (/FSH) input, gate the input signal to the bare latch 510. Each NOR gate can be built with 4 transistors, and the inverter requires 2 transistors. Therefore, if only a single data input is available, the circuit requires 18 transistors. If complementary data inputs D and /D are available, D-latch 500 can be built with 16 transistors.

Timing diagram 550 in FIG. 5B illustrates its behavior. The data input signal 560 is made to change state when the flush signal 570 is asserted at time $t_1$ and when the flush signal 570 is deasserted at time $t_3$. Flush signal 570 changes state at times $t_0$, $t_2$, $t_4$, and $t_5$. Before to, the flush signal 570 is deasserted. The state of output signal 580 depends on the prior state of D-latch 500 because it is in storage mode. At time to, flush signal 570 is asserted, and D-latch 500 enters flush mode (it becomes transparent). Its output signal 580 follows its data input signal 560, which is high. At time $t_1$, data input signal 560 changes state and goes low. Output signal 580 follows and goes low too. At time $t_2$, flush signal 570 is deasserted. This locks output signal 580 into its current state (low), which reflects the state of data input signal 560 at $t_2$. Although data input signal 560 goes high at time $t_3$, output signal 580 stays low because D-latch 500 is in storage mode since flush signal 570 is deasserted. Once flush signal 570 is asserted at time $t_4$, D-latch 500 enters flush mode, and output signal 580 copies data input signal 560 to become high. Output signal 580 stays high throughout the flush cycle because data input signal 560 doesn't change, and it is held high when the next storage cycle starts at $t_5$ when flush signal 570 is once again deasserted.

FIGS. 6A-B illustrate an example gate-level implementation of a D-latch 600 using NAND gates (FIG. 6A), and an example timing diagram 650 (FIG. 6B) that illustrates when it is transparent and when it is storing data. This D-latch, too, can be implemented with 18 or 16 transistors. Although D-latch 600 including bare latch 610 is built with NAND gates, its operation is fully analogous to the operation of D-latch 500. Unlike D-latch 500, D-latch 600 has a non-inverted flush input (FSH). Thus D-latch 600 is in storage mode when flush signal 670 is deasserted (FSH is low) and in flush mode when flush signal 670 is asserted (FSH is high). As shown with data input signal 660 and output signal 680, its behavior is like D-latch 500, although with an opposite polarity of the control signal (FSH vs /FSH).

Both FIGS. 5A-B and FIGS. 6A-B are based on gate-level designs. Usually, a logic designer (or EDA tool operated by the logic designer) has a library of standard cells available that includes many logic blocks, including D-latches. Library cells are typically not based on gate-level designs, but on transistor-level designs, which can be more efficient. Thus, a D-latch in a standard cell library may be smaller compared to a NAND or NOR gate in the same library than could be expected based on the ratio of the transistor counts in a gate-level D-latch (16 or 18) and a NAND or NOR gate (4 transistors).

FIGS. 7A-B illustrate an example of a D-flip-flop 700 (FIG. 7A) and a timing diagram 750 (FIG. 7B) that illustrates when it captures input data and copies the input data to its output. A flip-flop includes a "master latch" (latch 710) and a "slave latch" (latch 720). A D-flip-flop is never transparent. Latch 710 may have a single data input D, and an inverted flush input /FSH. Latch 720 has complementary data inputs D and /D and a non-inverted flush input FSH. Thus, latch 710 may be implemented as a NOR-based latch including input inverter (e.g., D-latch 500) and latch 720 may be implemented as a NAND-based latch without input inverter (e.g., D-latch 600) for a total of 34 transistors. If both latches are based on NOR gates, or both are based on NAND gates, an inverter needs to be added for the /FSH signal, so that in total 36 transistors are needed. As mentioned before, a transistor-level design such as those found in a standard cell library may use fewer transistors.

Timing diagram 750 in FIG. 7B illustrates its behavior. Although both latch 710 and latch 720 are sensitive to the level of the clock signal 770, at all times one of the two is in storage mode, and does not respond to changes in its input signal. The data input signal 760 is shown to change state at time $t_1$ and time $t_4$. The clock signal 770 is asserted at time $t_0$ and time $t_3$, and deasserted at time $t_2$ and time $t_5$. The initial state of output signal 780 depends on the situation prior to $t_0$. At time to, when clock signal 770 is asserted, D-flip-flop 700 samples data input signal 760, which is high. When clock signal 770 is asserted, the /FSH input of latch 710 is deasserted, and the output(s) of latch 710 hold the value of its input signal (data D) immediately prior to $t_0$. Latch 720 becomes transparent and passes its input's data to its output. Thus, output signal 780 becomes high, immediately following the value of data input signal 760. Although data input signal 760 changes state at time $t_1$, this has no effect on output signal 780 since D-flip-flop 700 is never transparent. At $t_1$, latch 710 does not respond to changes at its input, since it is in storage mode. At time $t_2$, when clock signal 770 is deasserted, latch 720 freezes in its existing state, which was determined by the value stored in latch 710 at time to. Also, latch 710 becomes transparent, so that its output follows data input signal 760. However, changes have no effect on output signal 780 since latch 720 is in storage mode and doesn't respond to changes of its input signal. At time $t_3$, clock signal 770 is again asserted, and D-flip-flop 700 clocks in the state of data input signal 760 prior to time $t_3$, which is low. Thus, latch 710 captures and holds the (low) value of data input signal 760 and latch 720 copies it to output signal 780. At time $t_4$, data input signal 760 changes state, but this has no effect because no further assertions of clock signal 770 occur. At time $t_5$, when clock signal 770 is deasserted, the modes of latch 710 and latch 720 reverse, without effect on output signal 780.

FIGS. 8A-C illustrate example implementations of a scan input multiplexer 800. A scan input multiplexer may be added in front of a non-scannable memory element (such as a D-flip-flop) to make it scannable. The multiplexer, if built from standard gates, may use 14 transistors. However, in a mixed-signal implementation it may be realized with as few as 2 transistors. FIG. 8A shows the logic symbol for the multiplexer. It has a first input which is coupled with the scannable memory element's data input (DI), a second input which is coupled with the scannable memory element's scan input (SI) and a select input which is coupled with the scannable memory element's scan enable (SE) input. The scan input multiplexer couples its output with the data input (DI) when the scan enable input (SE) is deasserted and with the scan input (SI) when the scan enable input (SE) is asserted. Thus, dependent on the signal of the scan enable input (SE), the multiplexer connects the data input or the scan input with the memory element.

FIG. 8B shows an example implementation of combinational logic 810 that performs this functionality. Many other configurations of combinational logic performing the functionality are known in the art, and implementations of the disclosed technology may use any of those. However, FIG. 8C shows an example implementation 820 as a transistor-level circuit that is much simpler and smaller. Again, many more transistor-level circuits are known in the art, and implementations of the disclosed technology may use any of those.

FIG. 9 adds the scan input multiplexer of FIGS. 8A-C to the D-flip-flop of FIGS. 7A-B to create a conventional scannable D-flip-flop 900, such as may be used in a conventional scan chain. In a gate-level implementation it can be realized with 48 or 50 transistors. In a mixed-signal implementation it can be realized with significantly fewer transistors. However, such savings are insufficient to enable use in an array of memory cells. FIG. 9 also shows symbol 910 for a scannable flip-flop. It shows the DI and DO terminals used for operational mode, and the SI, SE, and SO terminals used for scan mode. The CLK terminal is used in both operational mode and scan mode. Although in the diagram shown for scannable D-flip-flop 900 the DO and SO outputs are coupled with each other, in a more general case they may be separate outputs, and output signals may only be available depending on the state of the SE terminal.

This patent document uses the double slanted lines in symbol 910 to indicate that the memory element is scannable. It can be recognized as a D-flip-flop because it has a clock (CLK) input, in contrast to the scannable latch described with reference to FIG. 11.

FIG. 10 illustrates a conventional scan chain 1000 built from a series of D-flip-flops. FIG. 10 shows only connections and components that are active while the circuitry is in scan mode. Adjacent memory elements are clocked simultaneously, and their clock inputs are connected to a common clock source (providing the scan clock signal SCLK). This example chain has a length of three memory elements (scannable flip-flop 1010A through scannable flip-flop 1010C). Scan-in data enters the scan chain at scan IN 1020 (the SI input of scannable flip-flop 1010A) and scan-out data exits the scan chain at scan OUT 1030 (the SO output of scannable flip-flop 1010C). The scan enable input (SE) is asserted during scan mode, so that all three memory elements use their SI inputs and ignore their DI inputs. Scannable flip-flop 1010A outputs its SO to the SI input of scannable flip-flop 1010B, and scannable flip-flop 1010B outputs its SO to the SI input of scannable flip-flop 1010C. When SCLK is asserted, each of the memory elements updates its output value, so that data shifts one position in the chain.

FIG. 11 illustrates an example scannable latch 1100 that can be used in the disclosed technology. A scan input multiplexer is combined with a latch, for example the D-latch shown here. Also shown is scannable latch symbol 1110, where the double slanted lines indicate that the latch is scannable. The DI and DO terminals are only used in operational mode. The SI and SO terminals are only used in scan mode. The SE terminal selects the mode, and the FSH terminal is used both in operational mode and in scan mode. Although in the diagram shown for scannable latch 1100 the DO and SO outputs are coupled with each other, in a more general case they may be separate outputs, and output signals may only be available depending on the state of the SE terminal. Compared with the scannable D-flip-flop 900 of FIG. 9, scannable latch 1100 includes one fewer latch, which is a saving of at least four transistors.

Figure 12B:
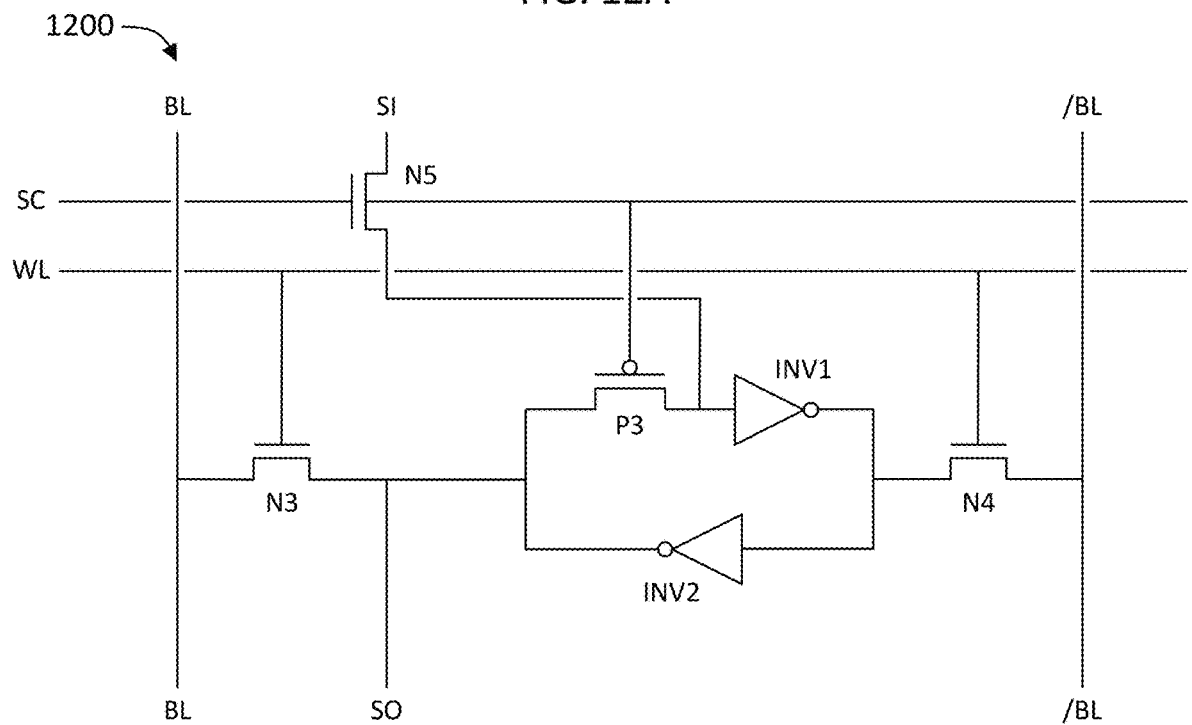

FIGS. 12A-B illustrate an example of a scannable latch 1200 configured as an SRAM cell. SRAM cells are optimized for use in large arrays, typically using only 6 transistors in a CMOS implementation. To make it scannable adds only two transistors, for a total of 8 transistors. Compared with scannable latch 1100 of FIG. 11, scannable latch 1200 combines the scan enable SE and flush FSH inputs in a single scan control SC input. When the SC input is asserted, the scan input SI is connected to the latch, and the latch's positive feedback loop is interrupted so that it doesn't need to be overpowered to be written. The latch relies on the word line WL to be deasserted, so that the bit lines BL don't impact the cell's update process. Note that FIG. 12A and FIG. 12B show the same SRAM cell with inverting gate symbol INV1 in FIG. 12B replacing transistors P2 and N2 in FIG. 12A and inverting gate symbol INV2 in FIG. 12B replacing transistors P1 and N1 in FIG. 12A. In other implementations, the inverting gates INV1 and INV2 can be any inverting gates, including inverters, NAND gates, and NOR gates, and do not need to be built from complementary MOS transistors as in FIG. 12A, but can be built from any transistors and other devices.

Figure 13:
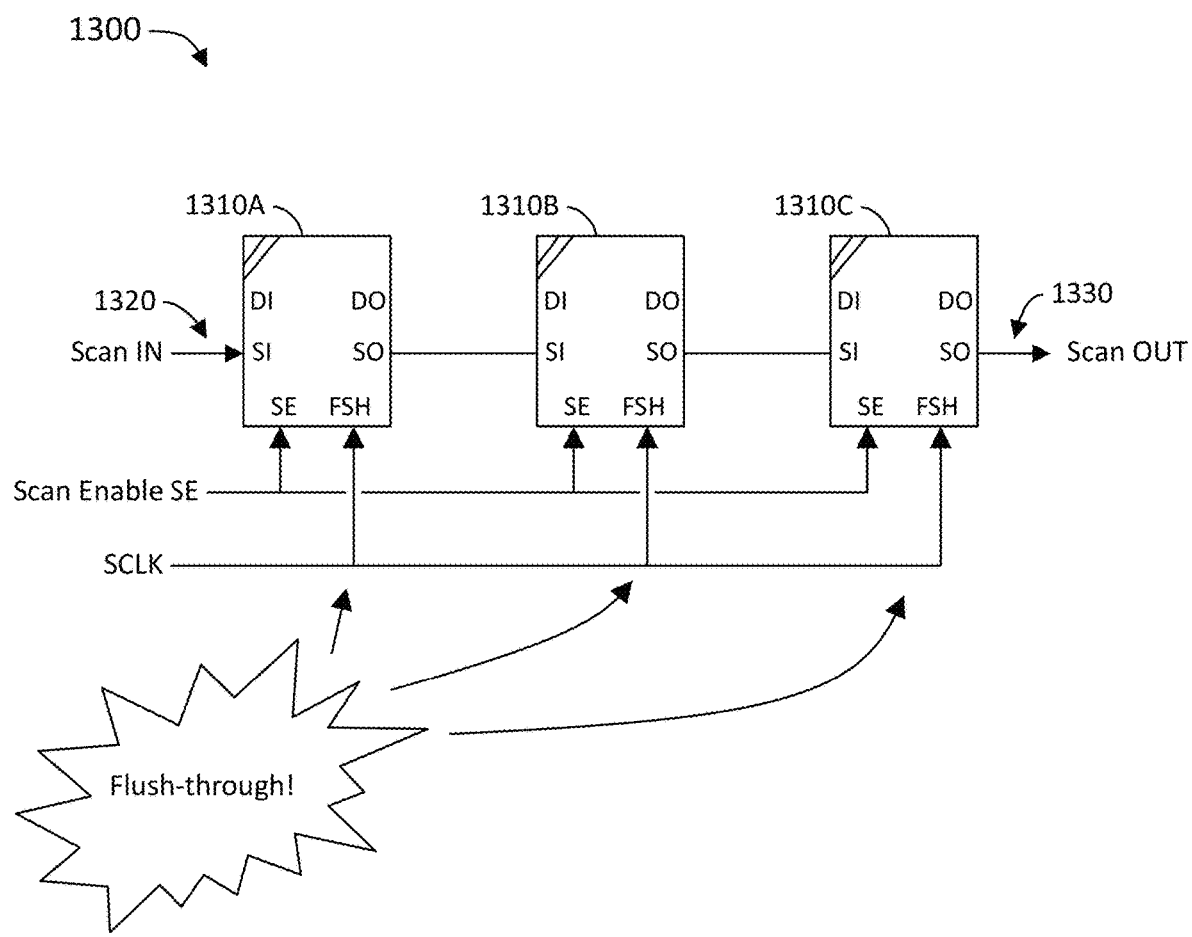
FIG. 13 illustrates a hazard condition that can occur when building a scan chain with the conventional architecture using scannable latches instead of scannable flip-flops. Since the scan clock (SCLK) asserts all flush (FSH) commands at the same time, all latches become transparent at the same time, flushing the scan input data through the whole chain and erasing all stored values.

FIG. 13 illustrates a hazard condition that can occur when building a scan chain 1300 with the conventional architecture using scannable latch 1310A to scannable latch 1310C instead of scannable flip-flops. Since the scan clock (SCLK) asserts all flush (FSH) commands at the same time, all latches become transparent at the same time, flushing the scan input 1320 data through the whole chain to the scan output 1330 and erasing all stored values.

Figure 14:
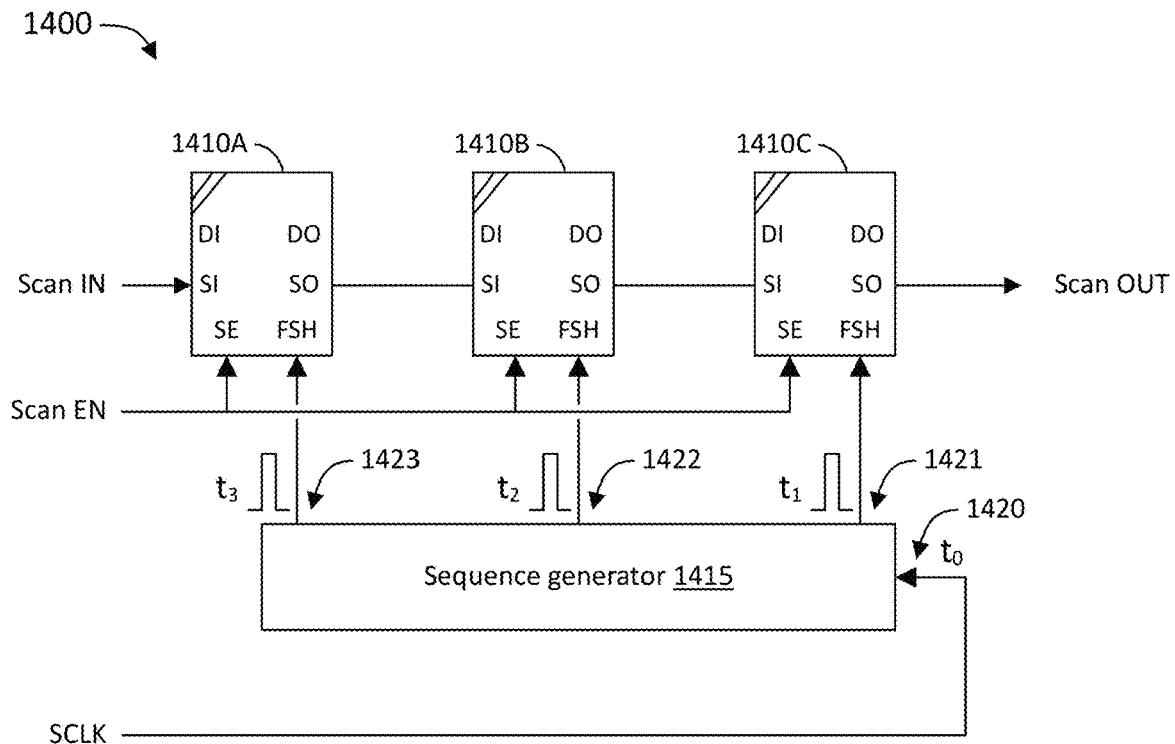
FIG. 14 illustrates an example implementation of a latch-based scan chain in the disclosed technology. The scan clock (SCLK) is used to generate a fast sequence of non-overlapping scan sub-clock pulses (also called a "sub-clock sequence" in this document). The sequence may go backwards, sequentially deasserting and re-asserting the scannable latches from the last one in the chain towards the first one in the chain. Each latch is in flush-through mode only briefly during its scan sub-clock pulse, so that subsequent latches are never simultaneously in flush-through mode. During the sub-clock sequence, data stored in the scan chain ripples one position forward, one latch at a time.

FIG. 14 illustrates an example implementation of a latch-based scan chain 1400 in the disclosed technology. The scan clock (SCLK) is used to generate a fast sequence of non-overlapping scan sub-clock pulses (also called a "sub-clock sequence" in this document). The sequence may go backwards, sequentially asserting and deasserting flush in the scannable latches from the last latch in the chain towards the first latch in the chain. Each latch is in flush-through mode only briefly during its scan sub-clock pulse, so that subsequent latches are never simultaneously in flush-through mode. During the sub-clock sequence, data stored in the scan chain ripples one position forward, one latch at a time. This process is described below with reference to FIGS. 18A-D.

Scan chain 1400 includes a chain of scannable latches, including latch 1410A, latch 1410B, and latch 1410C. Scan chain 1400 has a scan input (Scan IN) coupled with the SI input of latch 1410A, and a scan output (Scan OUT) coupled with the SO output of latch 1410C. Although scan chain 1400 is drawn with three memory cells, it may generally have any length of N memory cells, where N is an integer number greater than 1. Any intermediate latch has its SI input coupled with the SO output of the preceding latch and its SO output coupled with the SI input of the following latch, for example, latch 1410B has its SI input coupled with the SO output of latch 1410A, and its SO output coupled with the SI input of latch 1410C. All scannable latches have their SE inputs coupled with the scan enable input (Scan EN).

A sequence generator 1415 is configured to receive a scan clock (SCLK) signal at sequence generator input 1420, and to generate a sequence of at least N non-overlapping scan sub-clock pulses (called the sub-clock sequence in this document). The scan sub-clock pulses may also be called ripple pulses in this document. The total duration of the sub-clock sequence is equal to or less than the total duration of a cycle of the SCLK input (i.e., the period of the SCLK input signal). A cycle of the SCLK input includes both the active time of the scan clock pulse and the inactive time before another pulse is received on the SCLK input. Thus, a ripple pulse is relatively short in comparison to the scan clock pulse. Sequence generator 1415 has a separate output for each ripple pulse in the sub-clock sequence. In this case, sequence generator 1415 has three outputs. A ripple pulse output 1421 produces the first ripple pulse, at time $t_1$. The ripple pulse output 1422 produces the second ripple pulse, at time $t_2$, and ripple pulse output 1423 produces the third ripple pulse, at time $t_3$. Ripple pulse output 1421 is coupled with the FSH input of latch 1410C, ripple pulse output 1422 is coupled with the FSH input of latch 1410B, and ripple pulse output 1423 is coupled with the FSH input of latch 1410A.

In some implementations, sequence generator 1415 is located on the same semiconductor die as the array of memory cells. In other implementations, sequence generator 1415 may be on a different die, such as a chiplet coupled with the die on which the array of memory cells is located, or in a different assembly. Sequence generator 1415 may derive the sub-clock sequence directly from the SCLK input signal, for example using a multi-tap delay line such as described with reference to FIGS. 15 and 16, or using a PLL or FLL as described with reference to FIG. 17, or using a DLL. In yet other implementations, the sequence generator derives the sub-clock sequence from an existing high-frequency clock signal whereby the SCLK signal merely starts or restarts the sequence generator.

Figure 15:
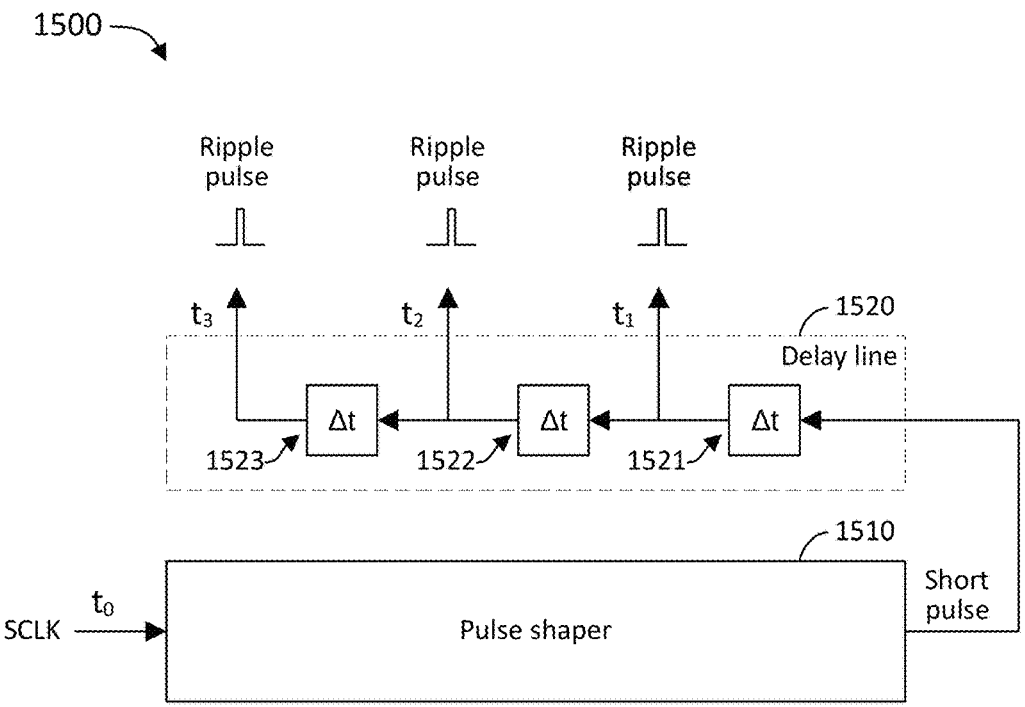
FIG. 15 illustrates an example sequence generator that includes a pulse shaper and a delay line.

FIG. 15 illustrates an example sequence generator 1500 that includes a pulse shaper 1510 and a multi-tap delay line 1520. Pulse shaper 1510 derives a short pulse from the scan clock (SCLK) pulse. The short pulse has the duration of a ripple pulse, and some implementations may use the output signal of pulse shaper 1510 as a first ripple pulse. Multi-tap delay line 1520 receives the short pulse from pulse shaper 1510, and lets it travel through a chain of delay elements, for example through N delay elements. In this example, multi-tap delay line 1520 includes delay element 1521, delay element 1522, and delay element 1523. Delay elements are well-known in the art, and may be built, for example, using a chain of inverter gates. To build a non-inverting delay element may include an even number of inverters. The number of inverters must be large enough to ensure that successive output pulses don't overlap. However, it may not be so large that the total duration of the sub-clock sequence exceeds the period of the SCLK input signal. Each delay element may output one of the ripple pulses.

Figure 16:
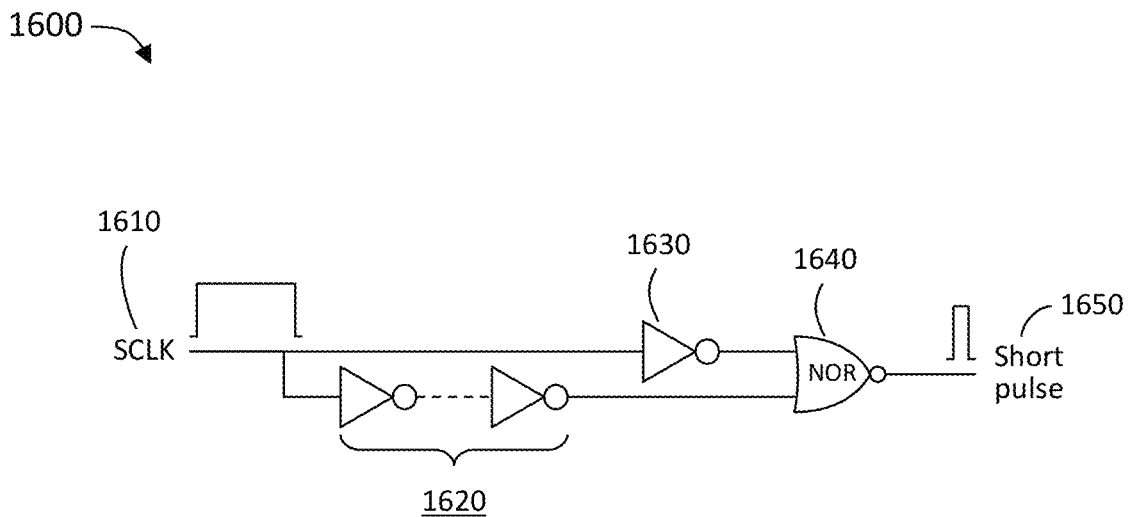
FIG. 16 illustrates an example circuit for the pulse shaper in the sequence generator.

FIG. 16 illustrates an example circuit 1600 for the pulse shaper 1510 in sequence generator 1415. The scan clock pulse (SCLK) is received by pulse shaper input 1610, which is coupled with a non-inverting series of inverters 1620 (i.e., an even number of inverters) and an inverter 1630, and the outputs of both are coupled with a NOR gate 1640, which delivers the short pulse at pulse shaper output 1650. Because the delay is unequal in the paths through non-inverting series of inverters 1620 and inverter 1630, the inverted SCLK pulse arrives earlier than the non-inverted SCLK pulse. During the difference in delay time, NOR gate 1640 produces the output pulse. Many different combinational logic circuits can be made that produce the same result, and each of those is within the scope and ambit of the disclosed technology.

A sequence generator can also be built without a delay line, for example with a phase-locked loop (PLL), a frequency-locked loop (FLL), or a delay-locked loop (DLL). Each of those systems includes a feedback loop that locks the frequency of its output signal(s) to the frequency of its input signal.

Figure 17:
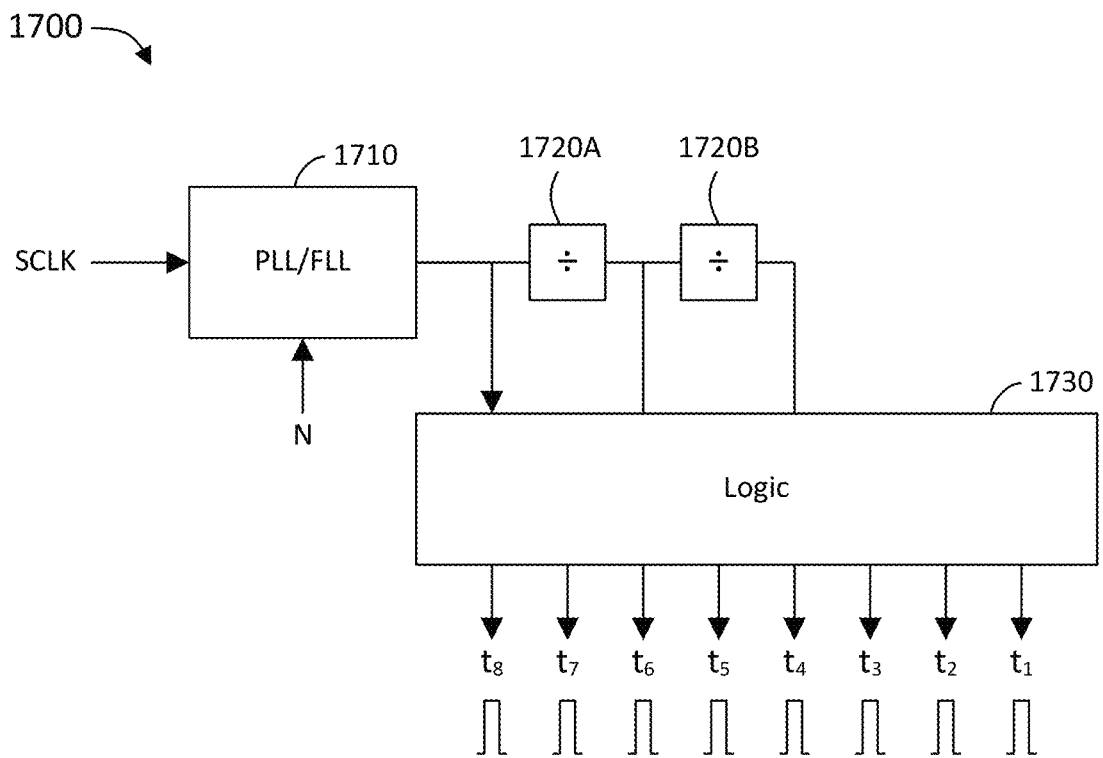
FIG. 17 illustrates an example sequence generator that includes a phase-locked loop (PLL) or frequency-locked loop (FLL) and output dividers.
Figure 18A:
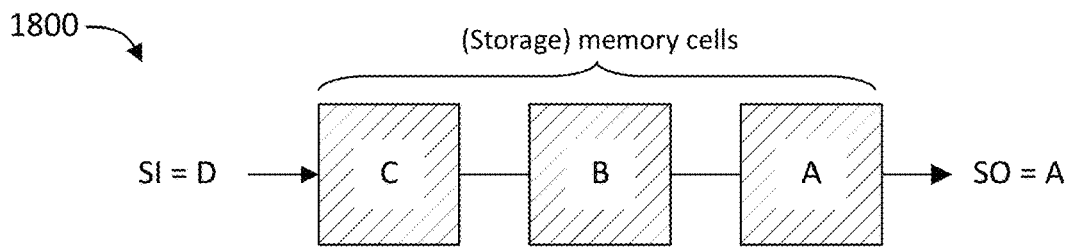
FIGS. 18A-D illustrate the process of rippling bits in an implementation of a latch-based scan chain to shift a block of data by one position.
Figure 18B:
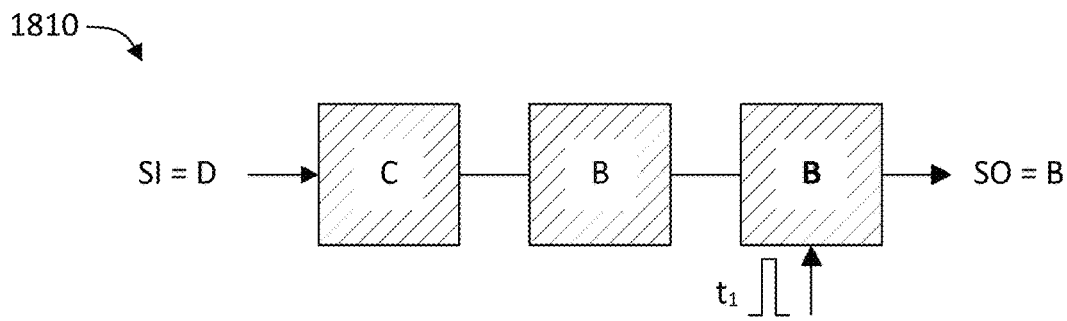
Figure 18C:
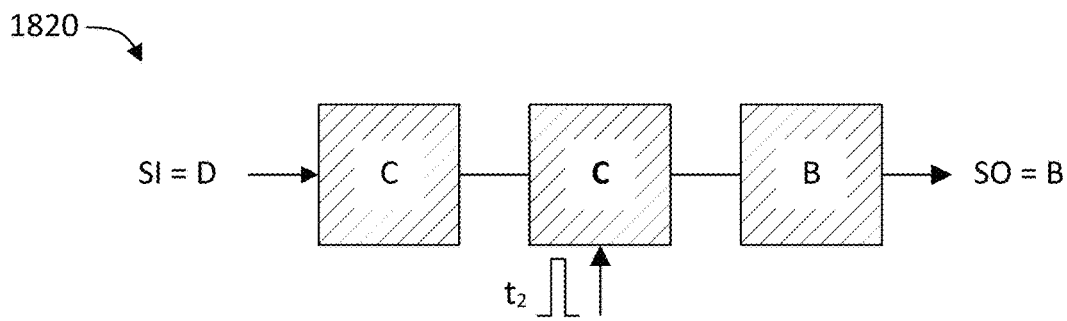
Figure 18D:
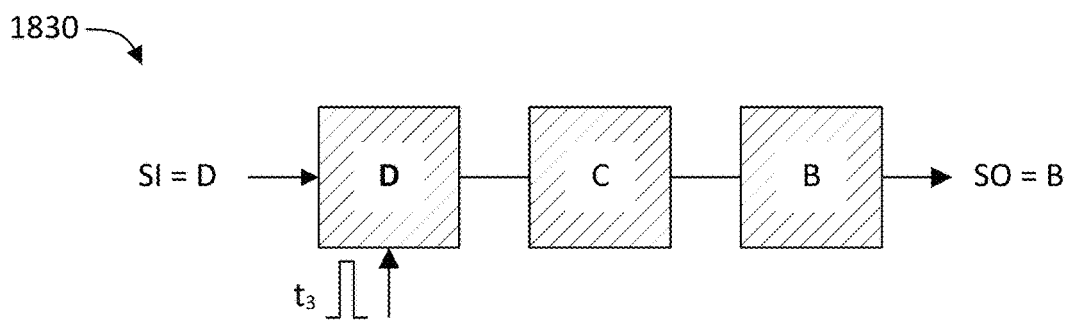

FIG. 17 illustrates an example sequence generator 1700 that includes a phase-locked loop (PLL 1710) or frequency-locked loop (FLL) and output dividers 1720A-B. In this example, 8 ripple pulses are produced (N=8), occurring in sub-clock sequence $t_1 \ldots t_8$. PLL 1710 receives the scan clock pulse (SCLK) and generates an output signal whose frequency equals N times the frequency of SCLK. For example, if the SCLK frequency is 100 MHz, then PLL 1710 generates an output frequency of 800 MHz. Each of the output dividers 1720A-B divides this frequency by two, so combinational logic circuit 1730 receives input signals at 800, 400, and 200 MHz. Combinational logic circuit 1730 uses its input signals as the address bits of the sequence generator output and passes the PLL output pulse on to the output encoded in the address bits.

FIGS. 18A-D illustrate the process of rippling bits in an implementation of a latch-based scan chain to shift a block of data by one position. In this example, the scan chain has three memory cells, a scan input (SI) and a scan output (SO). In its initial state 1800 (FIG. 18A), the scan input has value D, the first memory cell stores value C, the second memory cell stores value B, and the third memory cell stores value A. The scan output value SO equals the value of the third memory cell (A).

At step 1810 (FIG. 18B), or at $t_1$, the implementation applies a first ripple pulse to the third memory cell. This updates the value in the third memory cell to the value at its input (B), which changes SO to value B.

At step 1820 (FIG. 18C), or at $t_2$, the implementation applies a second ripple pulse to the second memory cell. This updates the value in the second memory cell to the value at its input (C).

At step 1830 (FIG. 18D), or at $t_3$, the implementation applies a third ripple pulse to the first memory cell. This updates the value in the first memory cell to the value at its input (D), which is the value at the scan input SI.

Thus, while the scan chain stored values C, B, A initially, applying the sub-clock sequence at $t_1$, $t_2$, and $t_3$ has updates all its values so that it has come to store D, C, B.

FIG. 19 illustrates an example array of memory cells 1910 with a scan chain that spans one row (row 1920). Array of memory cells 1910 is included in a memory block 1900 that further includes write circuits 1940, read circuits 1950, and address decoder 1960. The scan chain has an input (SI) and an output (SO) and is controlled by sequence generator 1915. Although FIG. 19 shows the scan chain stitched along the first row of array of memory cells 1910, the scan chain could be stitched along any or all of its rows or occupy just a part of a row. Although the symbols for memory cells (diagonally hatched boxes for storage memory cells) do not distinguish, storage memory cells may or may not be scannable.

Figure 20:
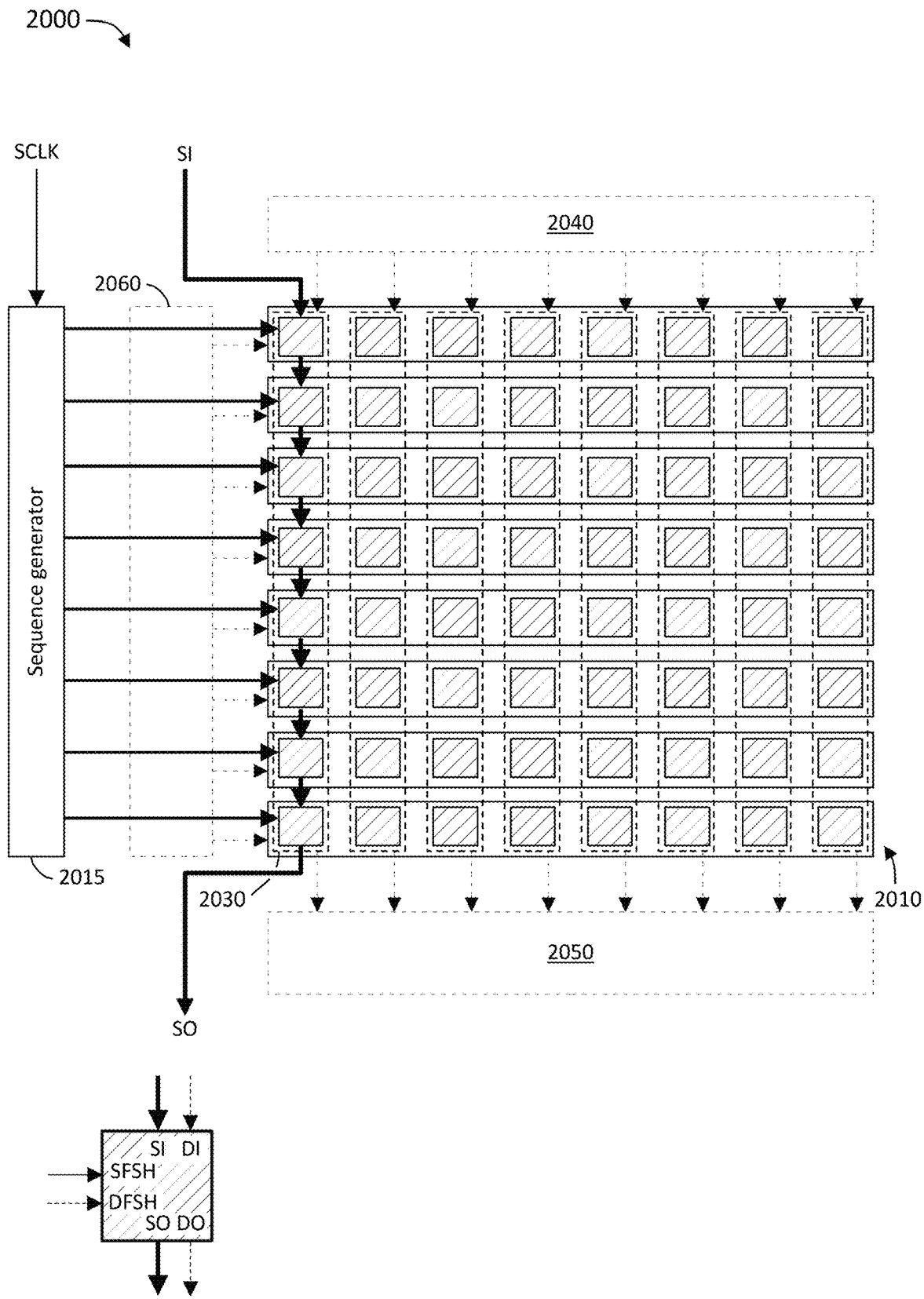
FIG. 20 illustrates an example array of memory cells with a scan chain that spans one column.

FIG. 20 illustrates an example array of memory cells 2010 with a scan chain that spans one column (column 2030). Array of memory cells 2010 is included in memory block 2000, which further includes write circuits 2040, read circuits 2050, and address decoder 2060. The scan chain has an input (SI) and an output (SO) and is controlled by sequence generator 2015. Although FIG. 20 shows the scan chain stitched along the first column of array of memory cells 2010, the scan chain could be stitched along any or all of its columns or occupy just a part of a column.

Figure 21:
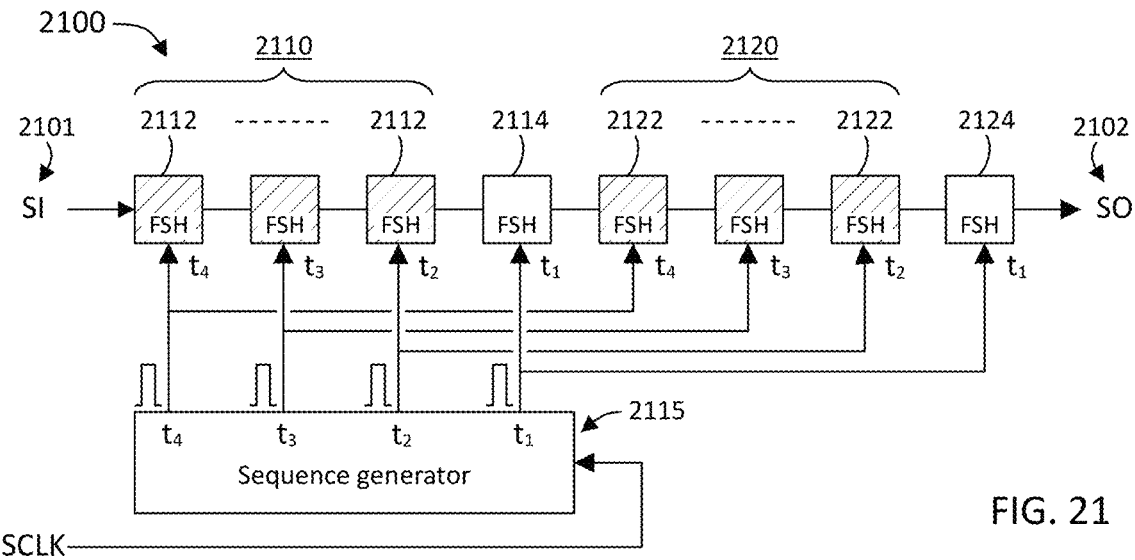
FIG. 21 illustrates an example scan chain that includes two chain segments. Each segment includes three storage memory cells and is followed by a segment buffer memory cell. Segmenting allows making arbitrarily long scan chains and reusing the sub-clock sequence for each chain segment.

FIG. 21 illustrates an example scan chain 2100 that includes two chain segments (chain segment 2110 and chain segment 2120). Each chain segment includes storage memory cells (drawn with 45-degree hatching) and is bounded at its input and its output by either the scan chain's scan input 2101, or a segment buffer cell, or the scan chain's scan output 2102. In this drawing, a segment buffer memory cell is drawn as a solid white block. Segmenting facilitates constructing arbitrarily long scan chains and reusing the sub-clock sequence for each chain segment. It also facilitates using a sub-clock sequence with fewer ripple pulses, which may lower the cost of building and ease timing requirements. In this example, the segment buffer memory cell is located after the end of each chain segment. A segment buffer memory cell can have the same circuit implementation as a storage memory cell. Storage memory cells are used both in scan mode and in operational modes, whereas in most cases a segment buffer memory cell is only used in scan mode. If a segment buffer memory cell is used only in scan mode, it can be implemented without a scan input multiplexer. In some implementations, the functions of storage memory cells and segment buffer memory cells are interchangeable.

Chain segment 2110 includes storage memory cells 2112 and is followed by segment buffer memory cell 2114. Chain segment 2120 includes storage memory cells 2122 and is followed by segment buffer memory cell 2124. In this example, each of the two chain segments includes 3 memory cells, but in general chain segments can be arbitrarily long. However, different chain segments in the same scan chain may generally have the same number of memory elements, and each chain segment may be preceded and/or followed by a segment buffer memory cell. Since there are M−1=3 memory cells per chain segment, sequence generator 2115 needs to deliver M=4 ripple pulses. It delivers the ripple pulses to both (or all) chain segments in parallel. Rippling starts at the segment buffer memory cell, followed by each chain segment's storage memory cells, from the last storage memory cell in the chain segment to the first.

Figure 22:
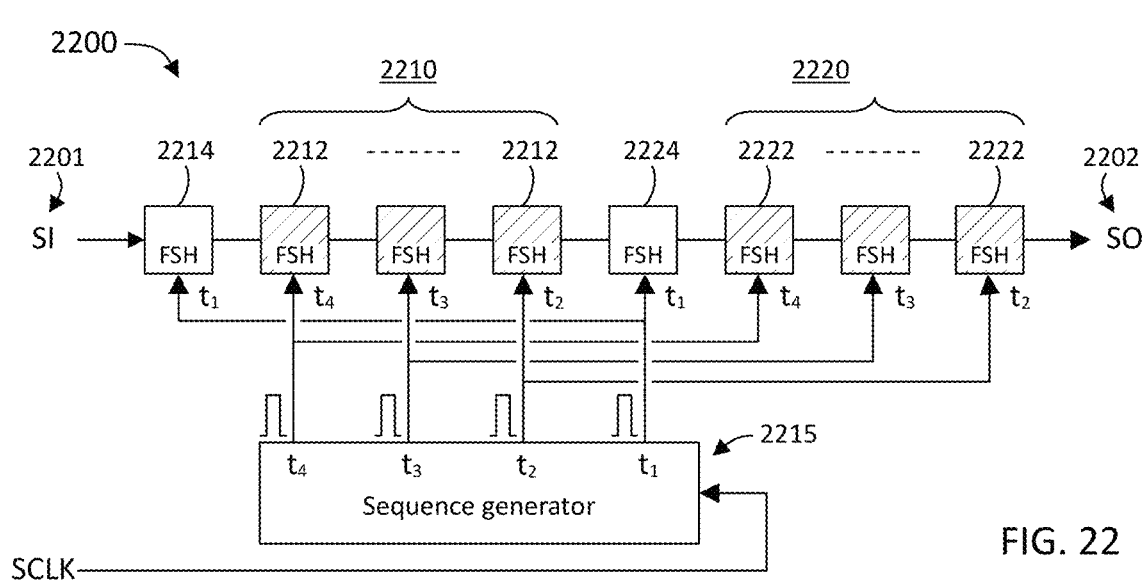
FIG. 22 illustrates another example of a scan chain that includes two chain segments. In this example, the segment buffer memory cell is located before the start of each chain segment.

FIG. 22 illustrates another example of a scan chain 2200 that includes two chain segments (chain segment 2210 and chain segment 2220) with storage memory cells 2212 and storage memory cells 2222. Scan chain 2200 has scan input 2201 (SI) and scan output 2202 (SO). In this example, the segment buffer memory cells (segment buffer cell 2214 and segment buffer memory cell 2224) are located before the start of the chain segments. The sequence generator 2215 delivers the $t_1$ ripple pulse to segment buffer cell 2214 and segment buffer memory cell 2224, followed by the $t_2$ ripple pulse to the last one of storage memory cells 2212 and storage memory cells 2222, then the $t_3$ ripple pulse to the middle one of storage memory cells 2212 and storage memory cells 2222, and finally the $t_4$ ripple pulse to the first one of storage memory cells 2212 and storage memory cells 2222.

Figure 23:
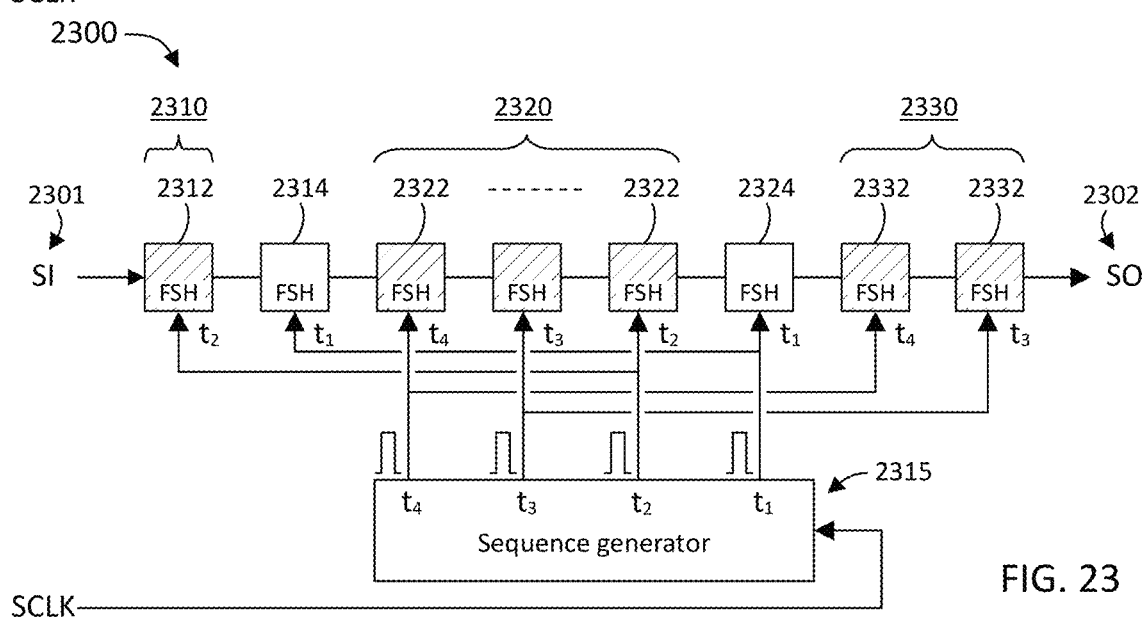
FIG. 23 illustrates an example of a scan chain that includes three chain segments of different lengths. In this example, the segment buffer memory cells are located between the chain segments.

FIG. 23 illustrates an example of a scan chain 2300 that includes three chain segments of different lengths. The first (chain segment 2310) includes only a single storage memory cell 2312. The second (chain segment 2320) includes three storage memory cells 2322, and the third (chain segment 2330) includes two storage memory cells 2332. Chain segment 2310 is preceded by the scan input 2301 and followed by segment buffer memory cell 2314. (chain segment 2320 is preceded by segment buffer memory cell 2314 and followed by segment buffer memory cell 2324. (chain segment 2330 is preceded by segment buffer memory cell 2324 and followed by the scan output 2302 (SO). The sequence generator 2315 again provides the first ripple pulse to the segment buffer memory cells, then continues from the end towards the beginning of the chain segments.

FIGS. 25-26 show detailed timing of the three above scan chain implementations, including exactly at what time a valid input signal must be available, and at what time an updated output signal becomes available. From the figures it will become clear that, assuming the first ripple pulse always follows the active edge of the SCLK signal and the last ripple pulse always precedes the active edge of the next SCLK signal, an interface will function properly for every implementation (FIGS. 21-23) if it delivers the scan input signal at the active edge of the SCLK signal, and receives the scan output signal at the active edge of the next SCLK signal.

Figure 24:
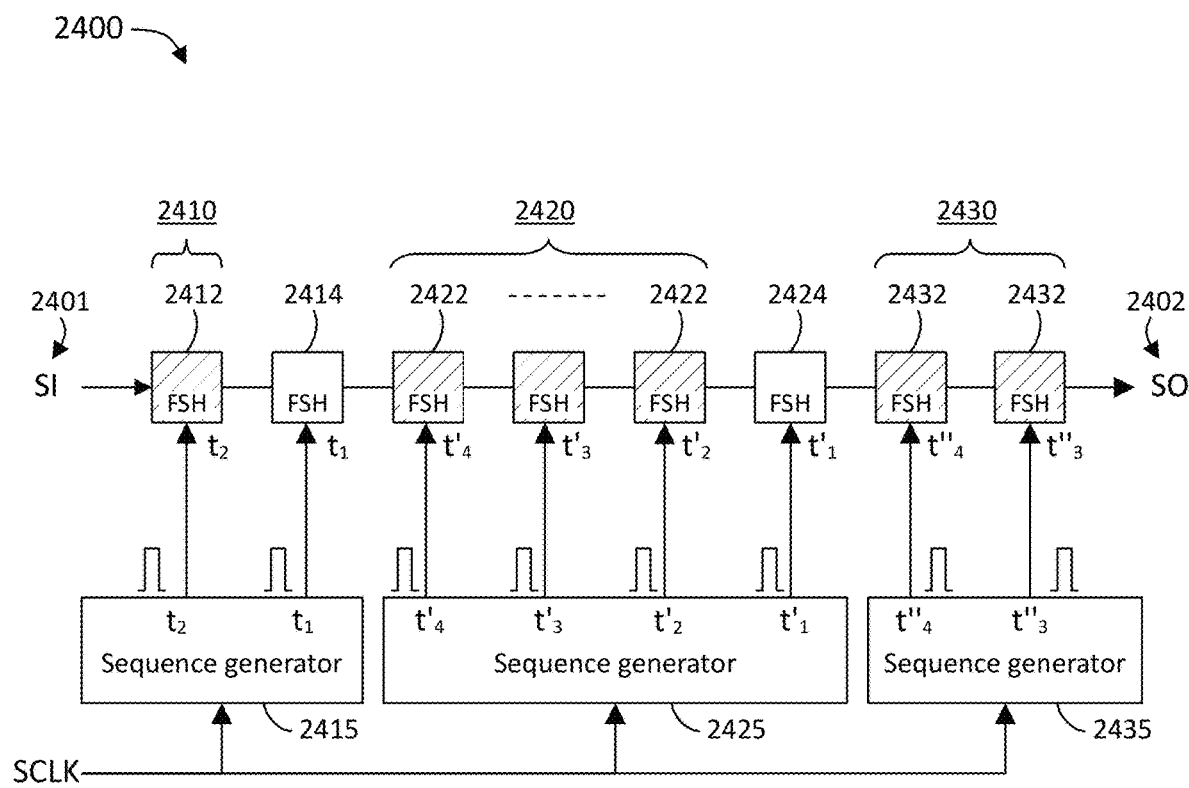
FIG. 24 illustrates an example of a scan chain with the same three segments of different lengths as in FIG. 23, but controlled from separate sequence generators.

FIG. 24 illustrates an example of a scan chain 2400 with the same three segments of different lengths as in FIG. 23, but controlled from separate sequence generators. This example shows that although in some implementations it is convenient to use a single sequence generator for multiple chain segments, it is not required, and other implementations may use multiple sequence generators. Scan chain 2400 includes scan input 2401 (SI), first chain segment 2410 followed by segment buffer memory cell 2414, followed by second chain segment 2420, followed by segment buffer memory cell 2424, followed by third chain segment 2430, which delivers the signal for scan output 2402 (SO). A first sequence generator 2415 delivers ripple pulses at $t_1$ and $t_2$ to segment buffer memory cell 2414 and storage memory cell 2412 of chain segment 2410, respectively. A second sequence generator 2425 delivers ripple pulses at $t'_1$ to segment buffer memory cell 2424, and at $t'_2$, $t'_3$, and $t'_4$ to storage memory cells 2422 of chain segment 2420. A third sequence generator 2435 delivers ripple pulses at $t'_3$ and $t'_4$ to storage memory cells 2432 of chain segment 2430. There is no need for $t_1$ and $t_2$ to be simultaneous with $t'_1$ and $t'_2$, and there is no need for $t'_3$ and $t'_4$ to be simultaneous with $t'_3$ and $t'_4$. Successive ripple pulses to a chain segment must not overlap and must be delivered in the correct order (in this figure, from the right to the left). As in the previous examples, each sequence of ripple pulses can start no sooner than the beginning of an SCLK cycle, and must be finished before the end of the SCLK cycle. Implementations facilitate that by triggering all three sequency generators by the SCLK signal. For correct interfacing between the chain segments, it is required that sequence generators be aligned with each other and that, in this case, $t_1$ deassert before $t'_4$ assert and $t'_1$ deassert before $t'_4$ assert.

Figure 25A:
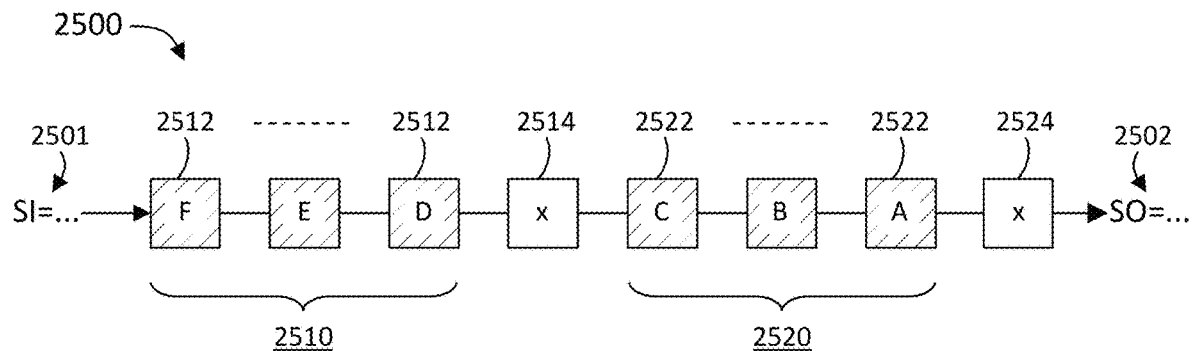
FIGS. 25A-E illustrate how a block of data is moved by one location in the two-segment scan chain of FIG. 21.

FIGS. 25A-E illustrate how a block of data is moved by one location in the two-segment scan chain of FIG. 21 (here scan chain 2500). Scan chain 2500 includes chain segment 2510 and chain segment 2520. The segment buffer memory cell 2514 and segment buffer memory cell 2524 are located after the chain segments. In FIG. 25A, the storage memory cells 2512 and storage memory cells 2522 store a block of data F, E, D, C, B, A. The segment buffer memory cells in this example do not participate in an operational mode, so any values they store are irrelevant. Also, their initial data is overwritten and lost in the process of shifting. These values may be left over from before the operational mode and be stale. The scan input 2501 (SI) data may not be ready before the first ripple pulse at $t_1$. The scan output 2502 (SO) data is not valid because it depends on the stale value of segment buffer memory cell 2524.

Figure 25B:
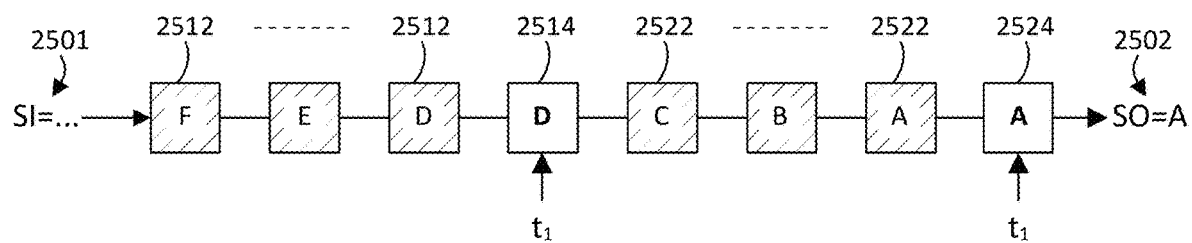

In FIG. 25B, the sequence generator applies a $t_1$ ripple pulse to segment buffer memory cell 2514 and segment buffer memory cell 2524. This updates the values of the segment buffer memory cells to the values (D and A, respectively) of their predecessor at the ends of the chain segments. The scan output SO now gets a valid value (A).

Figure 25C:
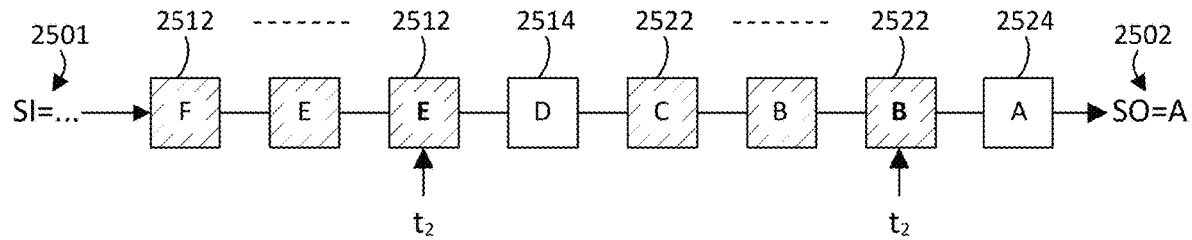

In FIG. 25C, the sequence generator applies a $t_2$ ripple pulse to the last (rightmost in the drawing) of storage memory cells 2512 and storage memory cells 2522. This updates the values of the last (rightmost) of storage memory cells 2512 and storage memory cells 2522 to the values (E and B, respectively) of their predecessor in the chain segments.

Figure 25D:
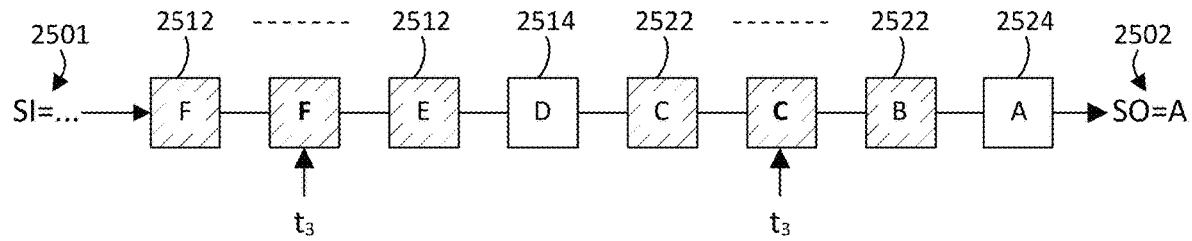

In FIG. 25D, the sequence generator applies a $t_3$ ripple pulse to the middle storage memory cells of storage memory cells 2512 and storage memory cells 2522. This updates the values of the middle storage memory cells of storage memory cells 2512 and storage memory cells 2522 to the values (F and C, respectively) of their predecessor in the chain segments.

Figure 25E:
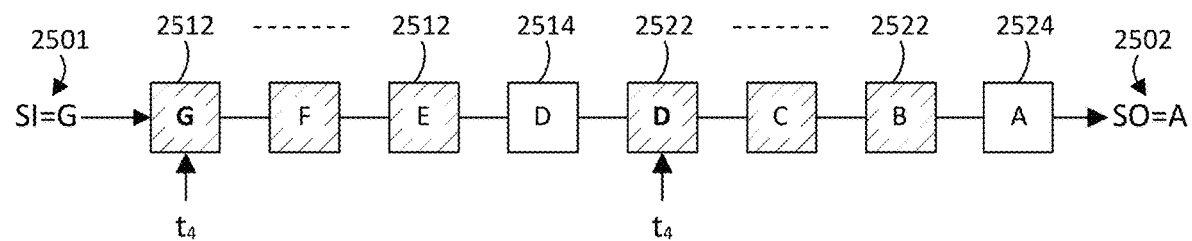

In FIG. 25E, the sequence generator applies a $t_4$ ripple pulse to the next prior (leftmost) of storage memory cells 2512 and storage memory cells 2522. These are also the first memory cells in their chain segments, and they include the memory cell that is coupled with the scan input SI. Thus, the scan input needs to be valid at $t_4$, and it has the value G in this example. The ripple pulse updates the values of the leftmost of storage memory cells 2512 to the value (G) of scan input SI and of the leftmost of storage memory cells 2522 to the value (D) of its predecessor in the chain. At this point, scan chain 2500 holds a block of data G, F, E, D, C, B. It has already captured the value of the scan input and its scan output value is still valid. Compared to the initial situation in FIG. 25A, the full block of data in the scan chain has shifted one position, thus the actions of the combined ripple pulses are equivalent to the action of a single scan clock cycle in a conventional scan chain.

FIG. 25B shows that for the scan chain in FIG. 21, the output value SO is valid after the $t_1$ ripple pulse, and FIG. 25E shows that the input value G from the scan input SI needs to be valid before the $t_4$ ripple pulse. As noted before and evident from FIGS. 25B-E, an input interface that provides a valid SI value at the time ripple pulse $t_4$ deasserts, and an output interface that consumes the output value SO at the time ripple pulse $t_1$ deasserts will also operate as intended.

Figure 26A:
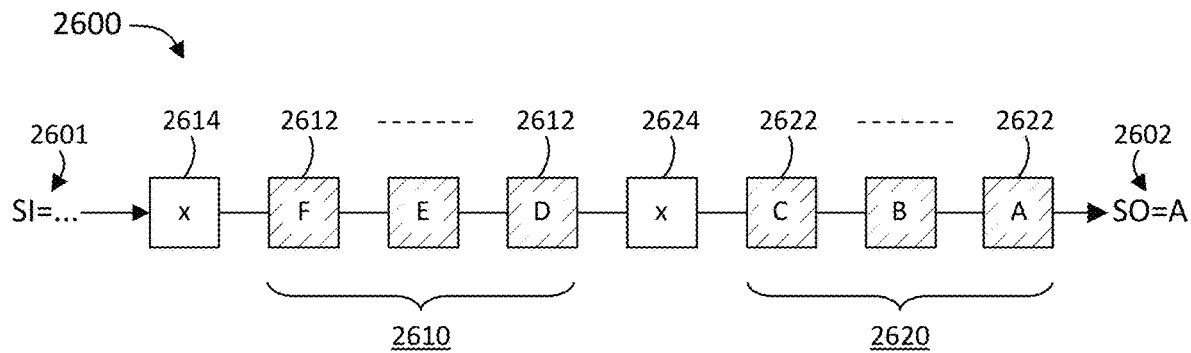
FIGS. 26A-E illustrate how the block of data is moved by one location in the two-segment scan chain of FIG. 22.

FIGS. 26A-E illustrate how the block of data is moved by one location in the two-segment scan chain of FIG. 22 (here scan chain 2600). FIGS. 26A-E contain the same elements as FIGS. 25A-E, with chain segment 2610 following a segment buffer memory cell 2614 and including storage memory cells 2612, and chain segment 2620 following a segment buffer memory cell 2624 and including storage memory cells 2622. The only difference is the relative location of the segment buffer memory cells (segment buffer memory cell 2614 and segment buffer memory cell 2624), which in this scan chain are before the beginnings of the chain segment 2610 and chain segment 2620. As can be seen from the figures, the full initial block of data in the storage memory cells (F, E, D, C, B, A) in FIG. 26A is shifted by one position after all ripple pulses have been applied in FIG. 26E, and the scan chain holds the data block (G, F, E, D, C, B).

Figure 26B:
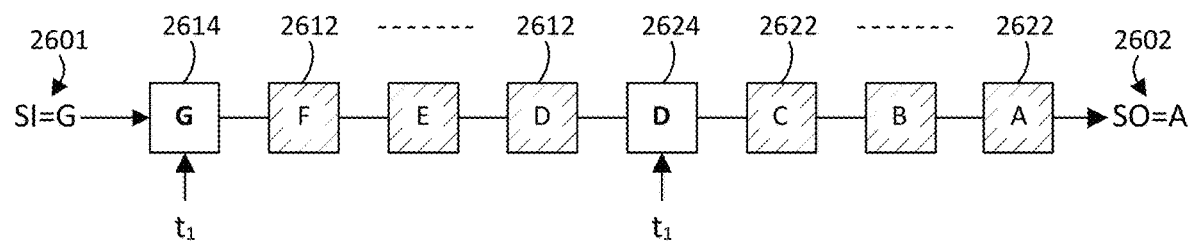
Figure 26C:
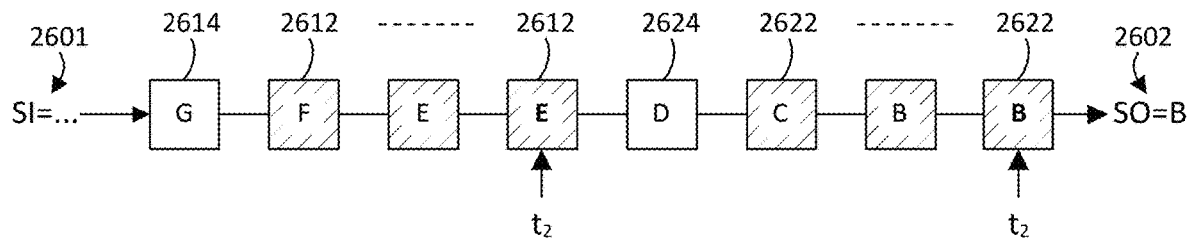
Figure 26D:
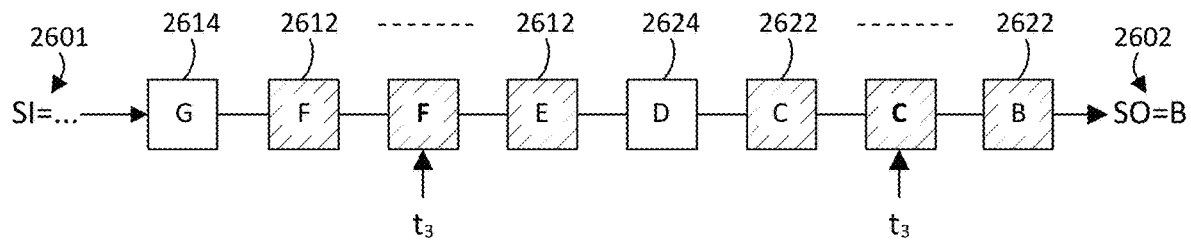
Figure 26E:
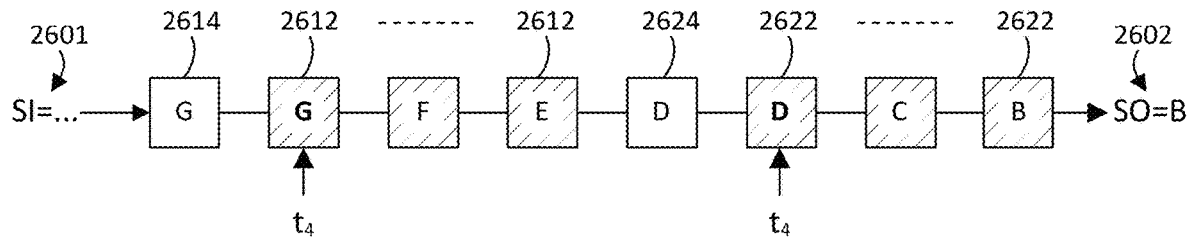

FIG. 26C shows that for the scan chain in FIG. 22, the scan output 2602 value SO is valid at the time the $t_2$ ripple pulse deasserts, and FIG. 26B shows that the scan input 2601 value on SI needs to be valid at the time the $t_1$ ripple pulse deasserts. As noted before and evident from FIGS. 26B-E, an input interface that provides a valid SI value at the time the $t_1$ ripple pulse deasserts, and an output interface that consumes the output value SO at the time the $t_2$ ripple pulse deasserts will operate correctly.

Figure 27A:
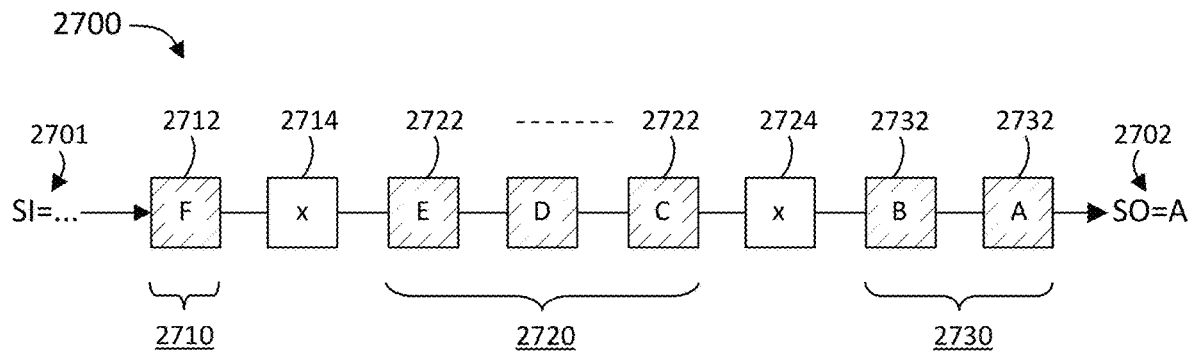
FIGS. 27A-E illustrate how the block of data is moved by one location in the three-segment scan chain of FIG. 23.
Figure 27B:
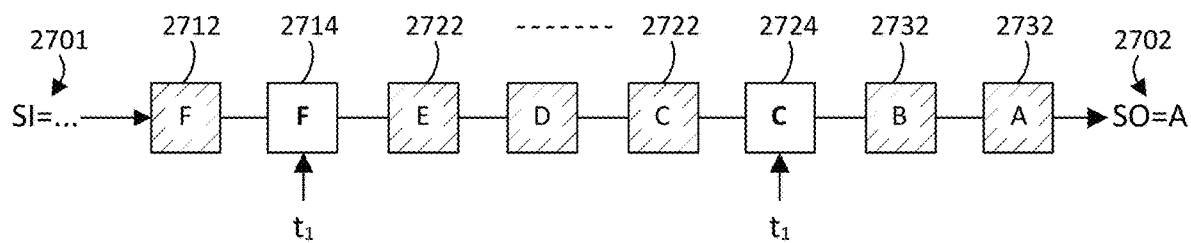

FIGS. 27A-E illustrate how the block of data is moved by one location in the three-segment scan chain of FIG. 23. Again, scan chain 2700 contain the same elements as FIGS. 25A-E, with chain segment 2710 including storage memory cell 2712, chain segment 2720 including storage memory cells 2722, chain segment 2730 including storage memory cells 2732, and segment buffer memory cell 2714 and segment buffer memory cell 2724 separating the chain segments. As can be seen from the figures, the full initial block of data in the storage memory cells (F, E, D, C, B, A) in FIG. 27A is shifted by one position after all ripple pulses have been applied in FIG. 27E, and the scan chain holds the data block (G, F, E, D, C, B).

Figure 27C:
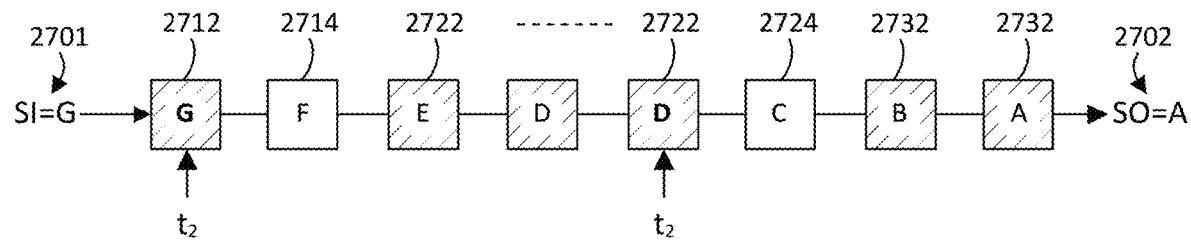
Figure 27D:
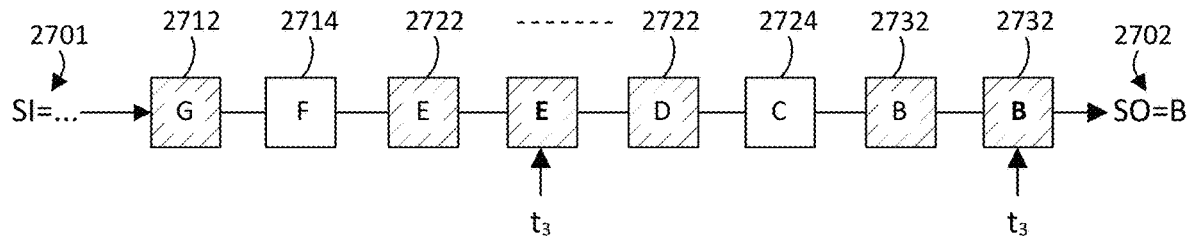
Figure 27E:
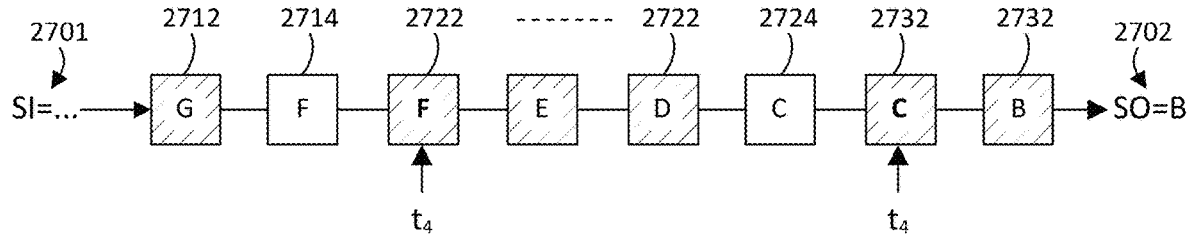

FIG. 27D shows that for the scan chain in FIG. 23, the output value SO is valid after the ripple pulse that updates rightmost storage memory cell in last chain segment, and FIG. 27C shows that the scan input 2701 value on SI needs to be valid at the time of deassertion of the ripple pulse that updates leftmost storage memory cell in the first chain segment. As noted before and evident from FIGS. 27B-E, an input interface that provides a valid SI value at the time ripple pulse $t_2$ deasserts, and an output interface that consumes the scan output 2702 value SO at the time ripple pulse $t_3$ deasserts will also operate as intended.

Thus, FIGS. 25A-E, FIGS. 26A-E, and FIGS. 27A-E show that the segment buffer memory cells can be situated between chain segments of equal or different lengths, as long as the order of the scan sub-clock pulses is applied correctly, beginning in the segment buffer memory cells. Each of the implementations can function completely compatible with conventional scan chains.

Figure 28:
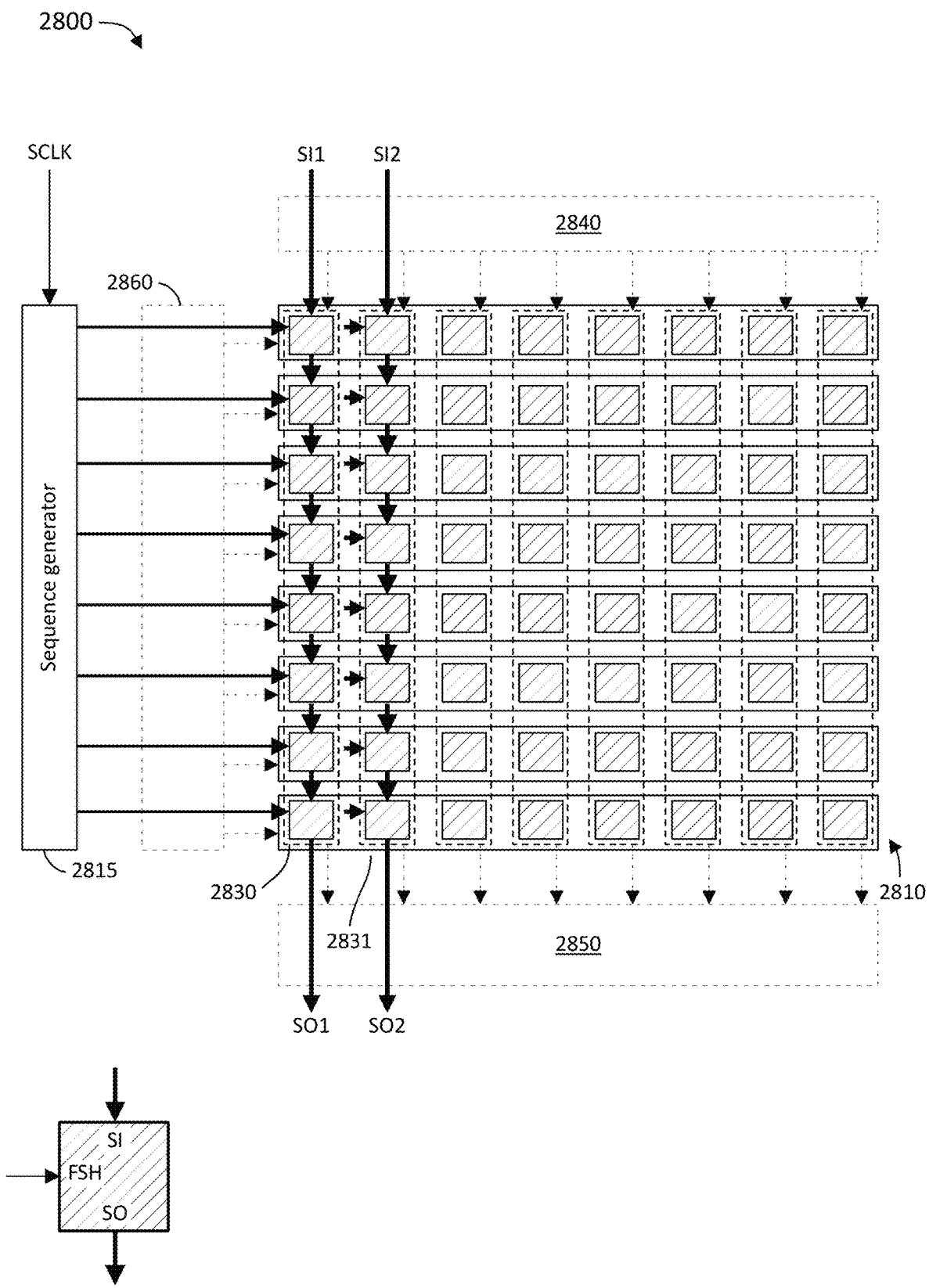
FIG. 28 illustrates an example array of memory cells that includes two scan chains that share one sequence generator.

FIG. 28 illustrates an example array of memory cells 2810 that includes two scan chains that share one sequence generator. Array of memory cells 2810 is included in memory block 2800, which further includes write circuits 2840, read circuits 2850, and address generator 2860. Memory cells in array of memory cells 2810 may or may not be scannable, although the symbols (boxes with hatched diagonal lines) do not distinguish in this drawing. The two scan chains (drawn with bold lines) share a sequence generator 2815. They are each arranged along a column, e.g., column 2830 and column 2831. Although they are shown as arranged along the first two columns of array of memory cells 2810, in other implementations they may be arranged along any columns, or along parts of any columns. While the two scan chains have separate inputs (SI1 and SI2) and outputs (SO1 and SO2), since they share sequence generator 2815, their clocking will be in lockstep, including their bit movements at the timing resolution of the scan sub-clock pulses from sequence generator 2815. Although the example in FIG. 28 shows two scan chains arranged along columns, other implementations have multiple scan chains arranged along columns, along parts of columns, along rows, or along parts of rows.

Figure 29:
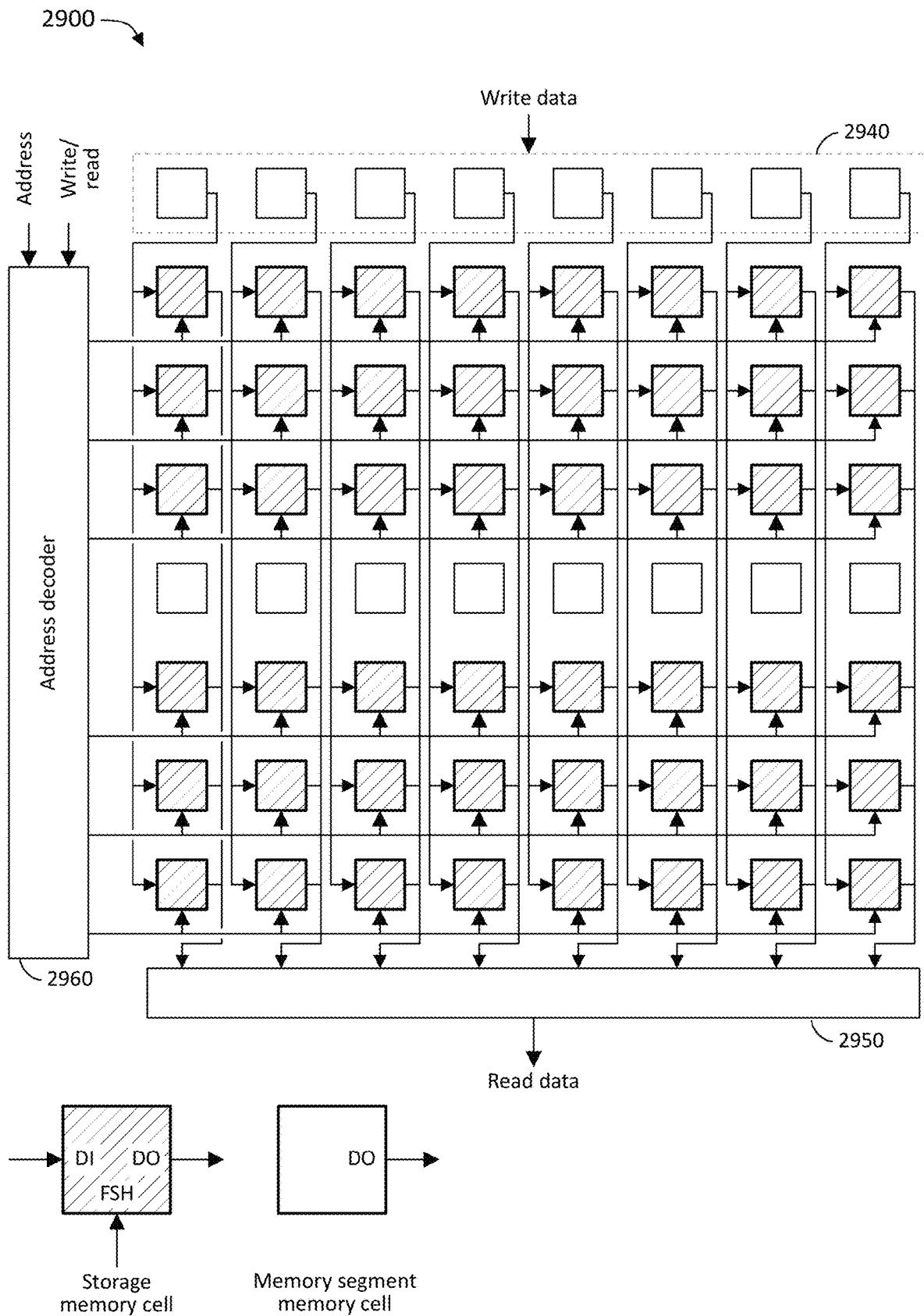
FIG. 29 illustrates an example array of memory cells that supports one or more multi-segment scan chains arranged along columns. The array has 8 columns and 6 rows of storage memory cells and 8 columns and 2 rows of segment buffer memory cells. This figure shows wiring for read/write operation, i.e., when no scan is performed. In this mode, the first row of segment buffer memory cells can be used as input buffers, but other rows of segment buffer memory cells may be unused.

FIG. 29 illustrates an example array of memory cells that supports one or more multi-segment scan chains arranged along columns. Example scan chain wiring is described with reference to FIGS. 30 and 31. The array has 8 columns and 6 rows of storage memory cells (drawn as boxes with 45 degrees hatching) and 8 columns and 2 rows of segment buffer memory cells (drawn as solid white boxes). Storage memory cells and segment buffer memory cells may be scannable. The array of memory cells is included in memory block 2900, which further includes write circuits 2940, read circuits 2950, and address decoder 2960. This figure shows wiring for operational mode, and excludes wiring for scan mode. In this example, the first row of segment buffer memory cells is included in write circuits 2940 and also functions as write buffer. In other words, unlike other segment buffer memory cells, this row is used during both operational mode and scan mode, while other rows of segment buffer memory cells may be unused in operational mode. In total, the arrangement in FIG. 29 supports up to 16 chain segments of each three storage memory cells and separated by segment buffer memory cells, all arranged along columns. Other implementations may support any number of chain segments that include any number of storage memory cells.

Figure 30:
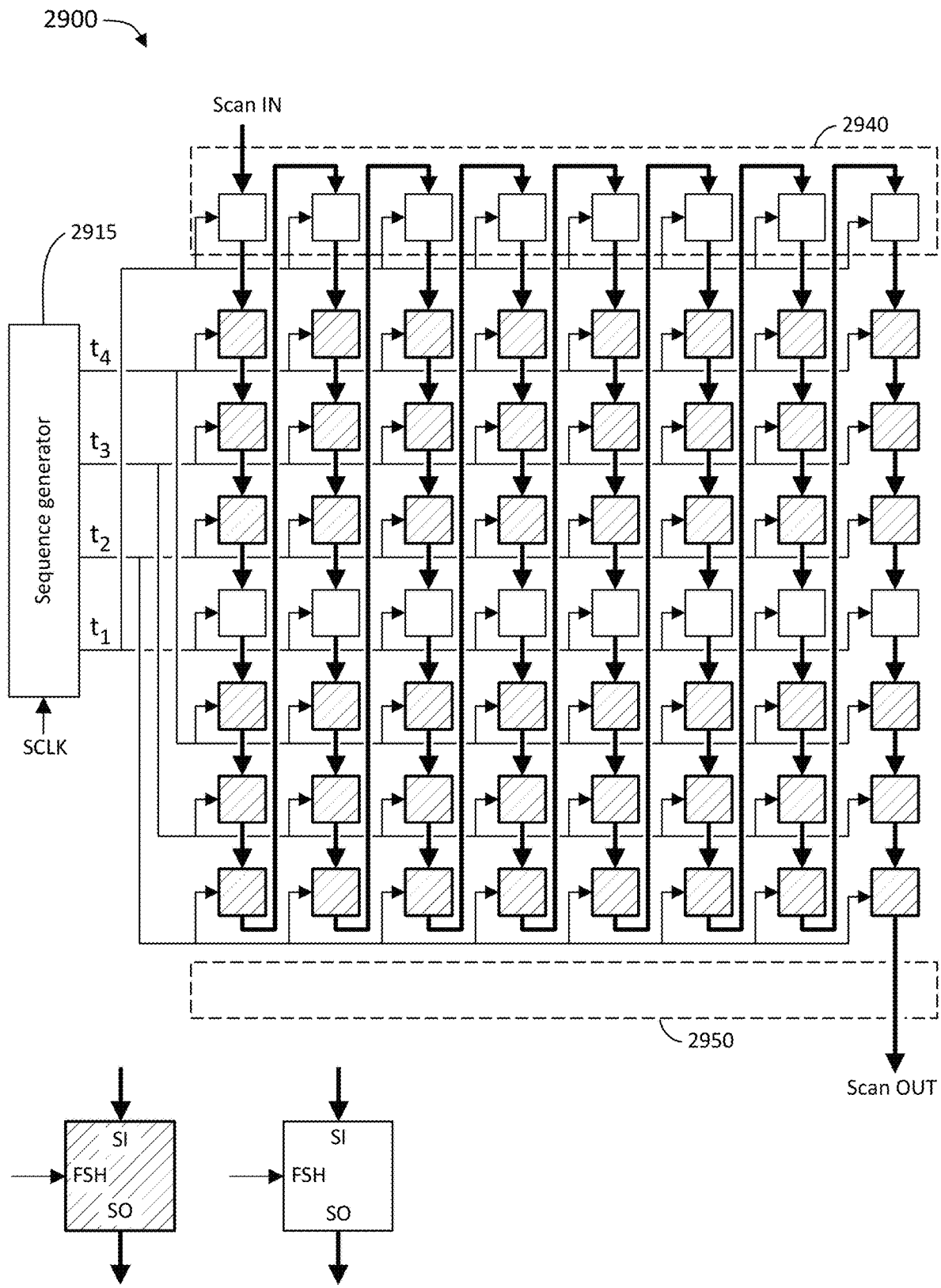
FIG. 30 illustrates example scan chain wiring for the array of memory cells of FIG. 29. In this case, a single scan chain follows columns of memory cells in the array. In scan mode, all segment buffer memory cells may be used. The scan chain includes 16 chain segments, each including one segment buffer memory cell and three storage memory cells.

FIG. 30 illustrates example scan chain wiring for the array of memory cells of FIG. 29. FIG. 30 shows that memory block 2900 includes sequence generator 2915. In this case, a single scan chain follows the columns of memory cells in the array and includes every memory cell. In scan mode, all segment buffer memory cells are used. As shown in this example, the bottom memory cell of each column is coupled with the top memory cell in the next column, in this case in a section buffer memory cell in write circuits 2940. The memory cell in the first column, in write circuits 2940, is coupled with the scan input (Scan IN). The memory cell in the last column at the bottom row is coupled with the scan output (Scan OUT).

Figure 31:
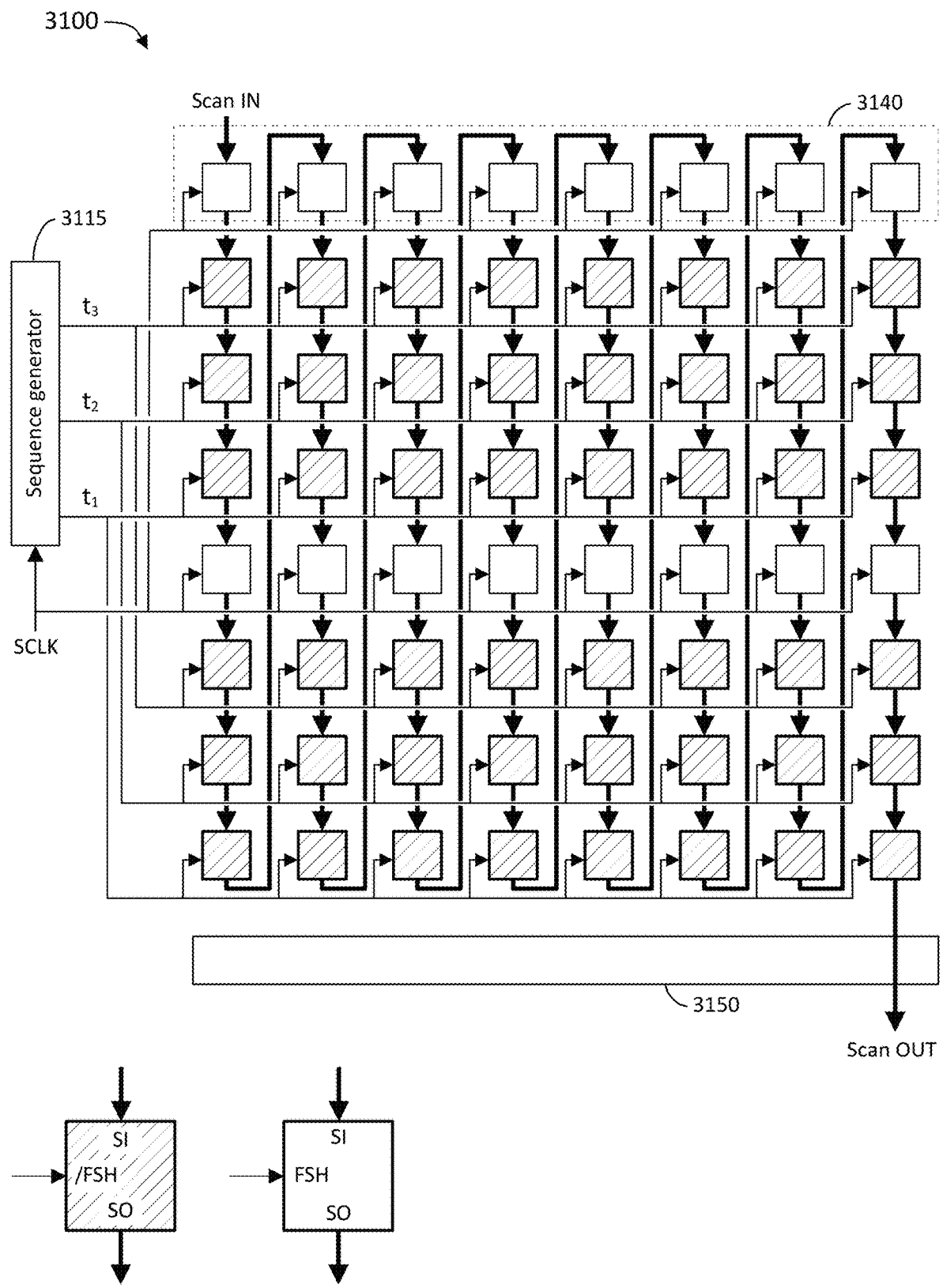
FIG. 31 illustrates a variation of the array of memory cells of FIGS. 29 and 27, in which the scan clock (SCLK) is used for the segment buffer memory cells. This saves one output on the sequence generator. However, the remaining outputs can only be asserted when the scan clock is not asserted. This may shorten the potential length of chain segments.

FIG. 31 illustrates a variation of the array of memory cells of FIGS. 29 and 27, in which the scan clock pulse (SCLK) is used for the segment buffer memory cells. This saves one output on the sequence generator. However, the remaining outputs can only be asserted when the scan clock is not asserted. This may limit the potential length of chain segments. The scan clock pulse may be inverted compared to the scan sub-clock sequence, and in this case the storage memory cells have flush inputs (FSH) that are active high, whereas the segment buffer memory cells have flush inputs (/FSH) that are active low. However, in other implementations segment buffer memory cells and storage memory cells may have the same assertion polarity of flush inputs, which may be either high (FSH) or low (/FSH).

In this example, memory block 3100 includes the array of memory cells, and a first row of segment buffer memory cells included in write circuits 3140. It includes read circuits 3150, an address decoder (not shown), and sequence generator 3115. Since the scan clock pulse is used to update the segment buffer memory cells, sequence generator 3115 only needs to generate three ripple pulses to match the number of storage memory cells in a chain segment. Thus, this example shows that the minimum number of outputs of a sequence generator equals the number of storage memory cells per chain segment.

Figure 32:
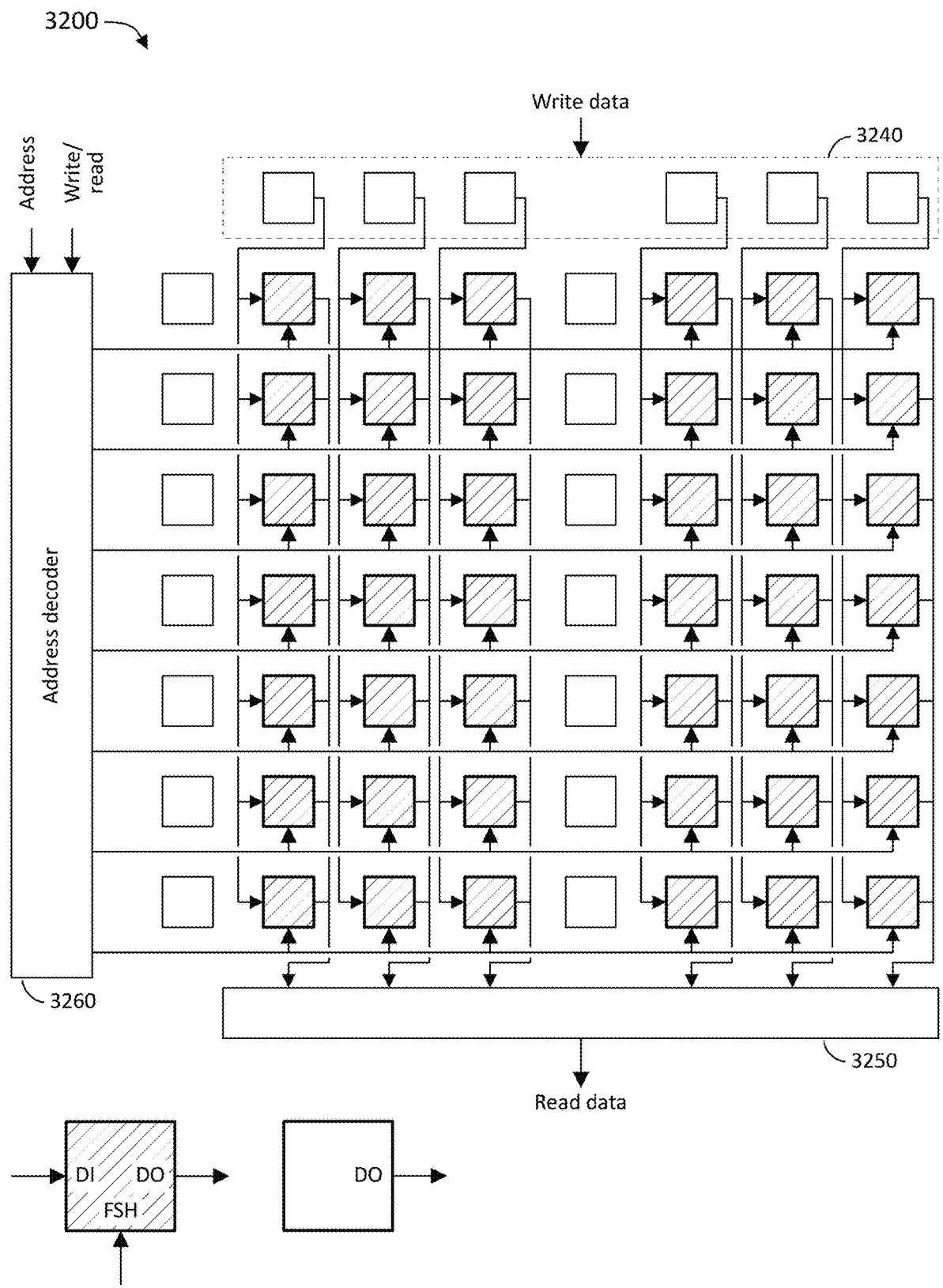
FIG. 32 illustrates an example array of memory cells that supports one or more multi-segment scan chains arranged along rows. The array has 6 columns and 7 rows of storage memory cells. This figure shows wiring for read/write operation, i.e., when no scan is performed. In this mode, the columns of segment buffer memory cells may be unused.

FIG. 32 illustrates an example array of memory cells that supports one or more multi-segment scan chains arranged along rows. Example scan chain wiring is described with reference to FIG. 33. The array is included in memory block 3200 and has 6 columns and 7 rows of storage memory cells. Although the symbols for memory cells (solid white boxes for segment buffer memory cells and diagonally hatched boxes for storage memory cells) do not distinguish, storage memory cells and segment buffer cells may or may not be scannable. This figure shows wiring for operational mode, and excludes wiring for scan mode. In operational mode, the columns of segment buffer memory cells may be unused. The write circuits 3240 may include a row of input buffer cells, which in this example implementation will not be included in the scan chain, but which in other implementations may be included. The read circuits 3250 and address decoder 3260 perform functions as in any conventional memory block.

Figure 33:
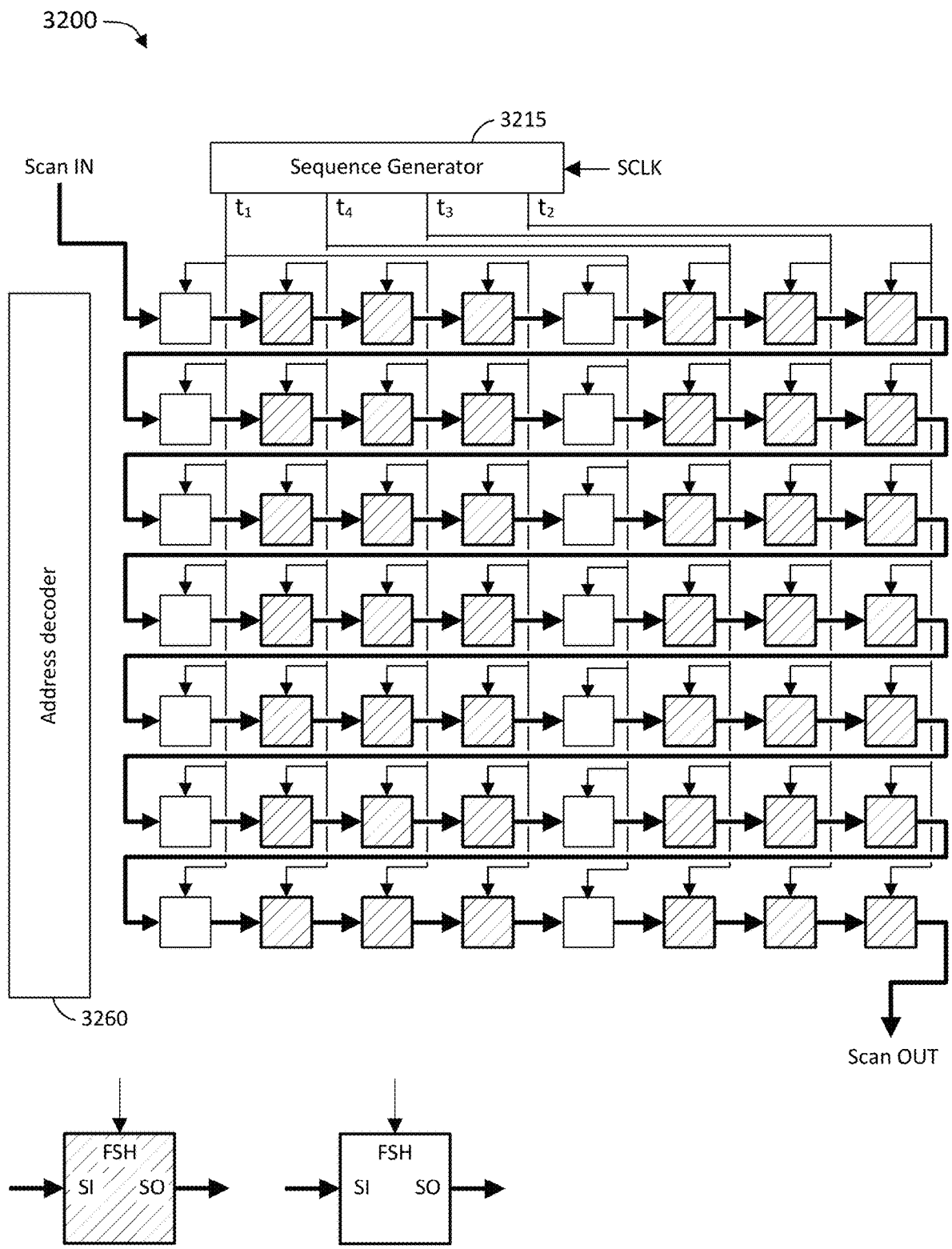
FIG. 33 illustrates example scan chain wiring for the array of memory cells of FIG. 32. In this case, a single scan chain follows rows of memory cells in the array. In scan mode, all columns of segment buffer memory cells may be used. The scan chain includes 14 chain segments, each including one segment buffer memory cell and three storage memory cells.

FIG. 33 illustrates example scan chain wiring for the array of memory cells of FIG. 32. In this case, a single scan chain follows rows of memory cells in the array. In scan mode, all columns of segment buffer memory cells may be used. The scan chain includes 14 chain segments, each preceded by one segment buffer memory cell and including three storage memory cells. The sequence generator 3215 generates the ripple pulses in the same order as those in FIG. 22, on whose architecture this example horizontal scan chain is based. Other implementations of a horizontal scan chain may use the architecture of FIG. 21 or FIG. 23.

FIG. 34 illustrates details of an example scannable array of memory cells 3400 that supports built-in self-repair (BISR) along rows. A defective memory array can be repaired by locating a row, or combination of successive rows, that includes a fault condition such as a stuck-at fault or a short-circuit between adjacent memory cells, skipping the row or combination of rows, and using redundant rows to make up for the skipped rows. Defective memory cells may impact both operational mode and scan mode, so the scan chain rows need to be rerouted along with the operational rows to overcome that the scan chain is unusable. Repair requires rerouting of the scan chain and the operational rows starting from the address of the first skipped row and impacting all higher row addresses. Rerouting operational rows may be performed similar to conventional BISR solutions. However, no conventional solution exists for rerouting the scan chain, since this has not been performed before. A benefit of the topology and method described in the following is that an implementation can be tested with the same scan patterns before and after repair. Thus, when an original test detects a faulty row, the implementation can repair the array, and use the original test again to determine if the array is now fault free.

Array of memory cells 3400 includes a scan chain with a scan input Scan IN 3401 and a scan output Scan OUT 3402, spanning rows starting from row 3410 and ending in row 3414. Although the symbols for memory cells (solid white boxes for segment buffer memory cells and diagonally hatched boxes for storage memory cells) do not distinguish, storage memory cells and segment buffer cells may or may not be scannable. Each row includes one or more chain segments. However, not all rows (or chain segments) are in use in an operational mode. Those rows or chain segments are unused either because they are spare (redundant) or because they have been determined defective and were subsequently repaired (bypassed). Since the scan chain is stitched along rows of memory cells like in FIG. 33, each ripple pulse is applied along one or more columns of the memory cells. Thus, skipping rows does not impact the ripple pulses, and the ripple pulse circuits and signals have been omitted in FIG. 34 to prevent clutter. The first chain segment in row 3410 has a scan input coupled with Scan IN 3401 via a segment buffer memory cell. The first chain segment in each row from row 3411 to row 3414 has a scan input coupled with an output of a multiplexer via a segment buffer memory cell, for example the first chain segment in row 3411 has a scan input coupled with the output of multiplexer 3421, etc. The multiplexers each have two inputs, coupled with scan outputs of the last chain segments in two preceding rows (FIG. 34 shows multiplexers with two inputs coupled with two preceding rows, but in other implementations multiplexers have multiple inputs coupled with multiple preceding rows). Each multiplexer is controlled by a select input (not drawn) that specifies which of the two or more inputs is selected. When a row, or combination of rows, includes a fault condition, that row or combination of rows is skipped both for operational mode and for scan mode. For example, the multiplexer of the first faultless row after the skipped row, or skipped combination of rows, selects a scan output of a final memory segment of the last faultless row before the skipped row or skipped combination of rows. If, for example, it has been determined that row 3 in a memory array contains a fault condition, then in operational mode all row addresses starting with row 3 may be incremented with 1, so that row 2 remains row 2, row 3 becomes row 4, row 4 becomes row 5, etc. In scan mode, the multiplexer of row 4 which selected the output of row 3 before repair selects the output of row 2 after repair.

A number of redundant rows may be placed at or near the end of array of memory cells 3400. When there is no fault condition in array of memory cells 3400, redundant rows remain unaddressed during operational mode, and are skipped or bypassed from the scan chain. In this case, multiplexer 3425 for Scan OUT 3402 selects the output of the last operational row.

When there is a fault condition in array of memory cells 3400, for example row 3 as described above, then the implementation uses a row from the redundant rows. In that case, multiplexer 3425 no longer selects the output of the original last operational row, but instead selects the output of the new last operational row.

Although the example described an array that has one or more redundant rows placed at the bottom of the array, more generally the redundant rows can be placed anywhere within the array. In such a case, operational-mode row addressing needs to be modified accordingly, and scan chain routing as determined by the multiplexers needs to be modified accordingly also.

It generally follows that, in a repairable or repaired array of memory cells, there are always a number of chain segments that are skipped. When there is no chain segment with fault conditions, the unused redundant chain segments may be skipped. When there are one or more chain segments with fault conditions, those and adjacent chain segments may be skipped, whereas at least a part of the redundant chain segments are used and thus not skipped.

FIG. 35 illustrates an example method 3500 of scanning memory cells in a scan chain. This method does not assume that the scan chain is segmented or has segment buffer memory cells, and it is applicable to the single-segment architectures illustrated in FIGS. 14-15, and 18-20. The scan chain includes a chain of N memory cells (N is an integer greater than 1) with indexes 1 through N counting from the scan input SI to the scan output SO. During a cycle of the scan clock (SCLK) input (i.e., the period of the SCLK input signal), the method shifts scan bit values in the two or more memory cells using a sequence of non-overlapping pulses. The number of non-overlapping pulses is equal to or greater than N. In some implementations, one of the non-overlapping pulses, for example the first, may be the SCLK pulse, and the other N−1 pulses may be delivered by a sequence generator that receives the SCLK pulse as an input signal. In other implementations, the sequence generator receives the SCLK signal and generates all N non-overlapping pulses. The duration of the sequence is equal to or shorter than the duration of the cycle of the SCLK signal. Method 3500 comprises:

3510—applying the first pulse in the sequence to the last memory cell in the scan chain (memory cell N) to capture a scan bit value from an immediately prior memory cell (memory cell N−1) to the last memory cell in the scan chain (memory cell N).

3520—applying the second scan pulse in the sequence to the immediately prior memory cell (memory cell N−1) to capture a scan bit value from a second prior memory cell (memory cell N−2) to the immediately prior memory cell (memory cell N−1).

Method 3500 may continue applying further pulses to successively earlier memory cells in the scan chain.

Figure 36:
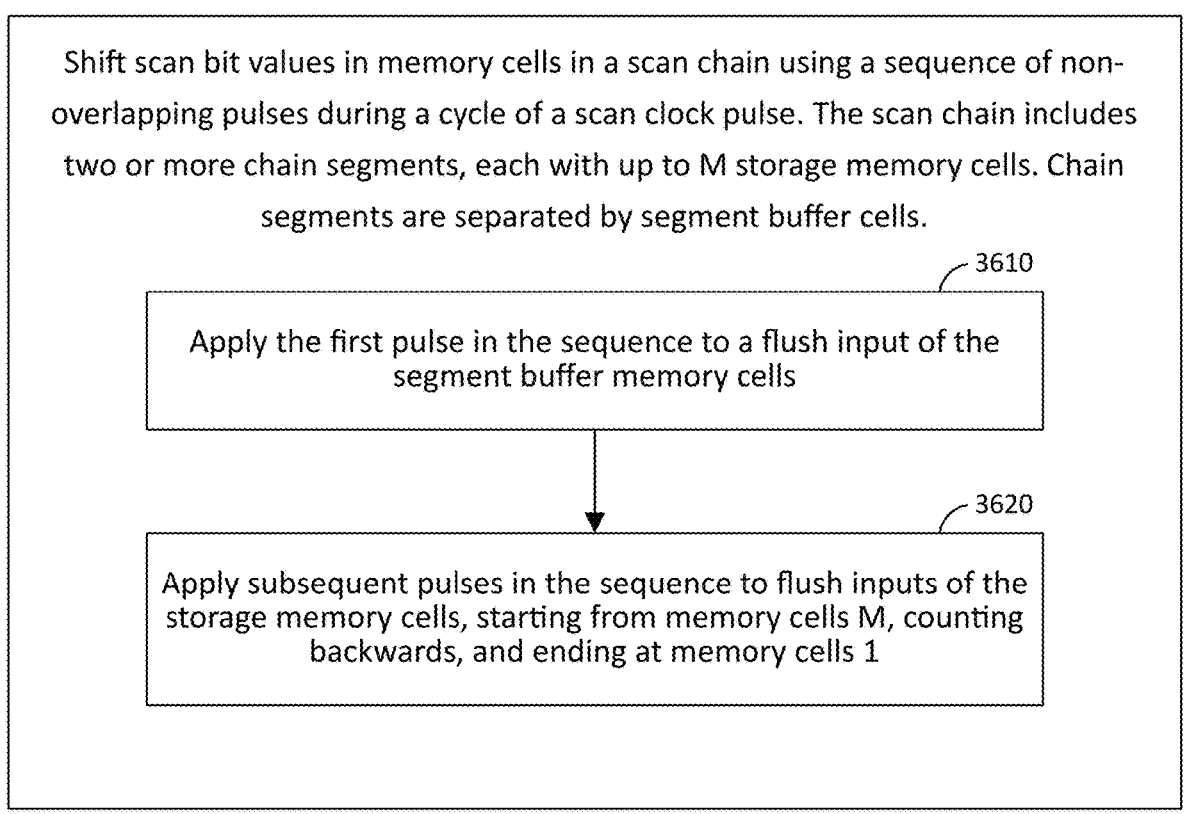
FIG. 36 illustrates another example method of scanning memory cells in a scan chain. This method is suitable for segmented chains that include segment buffer memory cells.

FIG. 36 illustrates another example method (method 3600) of scanning memory cells in a scan chain. This method is suitable for segmented scan chains that include two or more chain segments each of up to M storage memory cells (M is an integer greater than 1) with indexes 1 through M counting from the chain segment scan input to the chain segment scan output. Chain segments are separated by segment buffer memory cells. During a cycle of the scan clock (SCLK) signal (i.e., the period of the SCLK input signal), the method shifts scan bit values in the M memory cells in each chain segment using a sequence of non-overlapping pulses. The number of non-overlapping pulses is equal to or greater than M+1, and may include a pulse received on the SCLK input. The duration of the sequence is equal to or shorter than the duration of the cycle of the SCLK signal. The pulses may be scan sub-clock pulses derived from and in some cases including the received SCLK pulse. If the SCLK pulse is part of the sequence, it must deassert its segment buffer row(s) after the last pulse in the prior sequence and before the second pulse in the current sequence, or it must deassert its storage rows at the correct place in the sequence and not overlap with an adjacent pulse in the sequence. Method 3600 comprises:

3610—applying a first pulse in the sequence to the flush input of the segment buffer memory cell in each chain segment. The first pulse may be the SCLK pulse or a first scan sub-clock pulse.

3620—applying subsequent pulses in the sequence to flush inputs of the storage memory cells, starting with memory cells with index M, counting backwards, and ending at memory cells with index 1.

Figure 37:
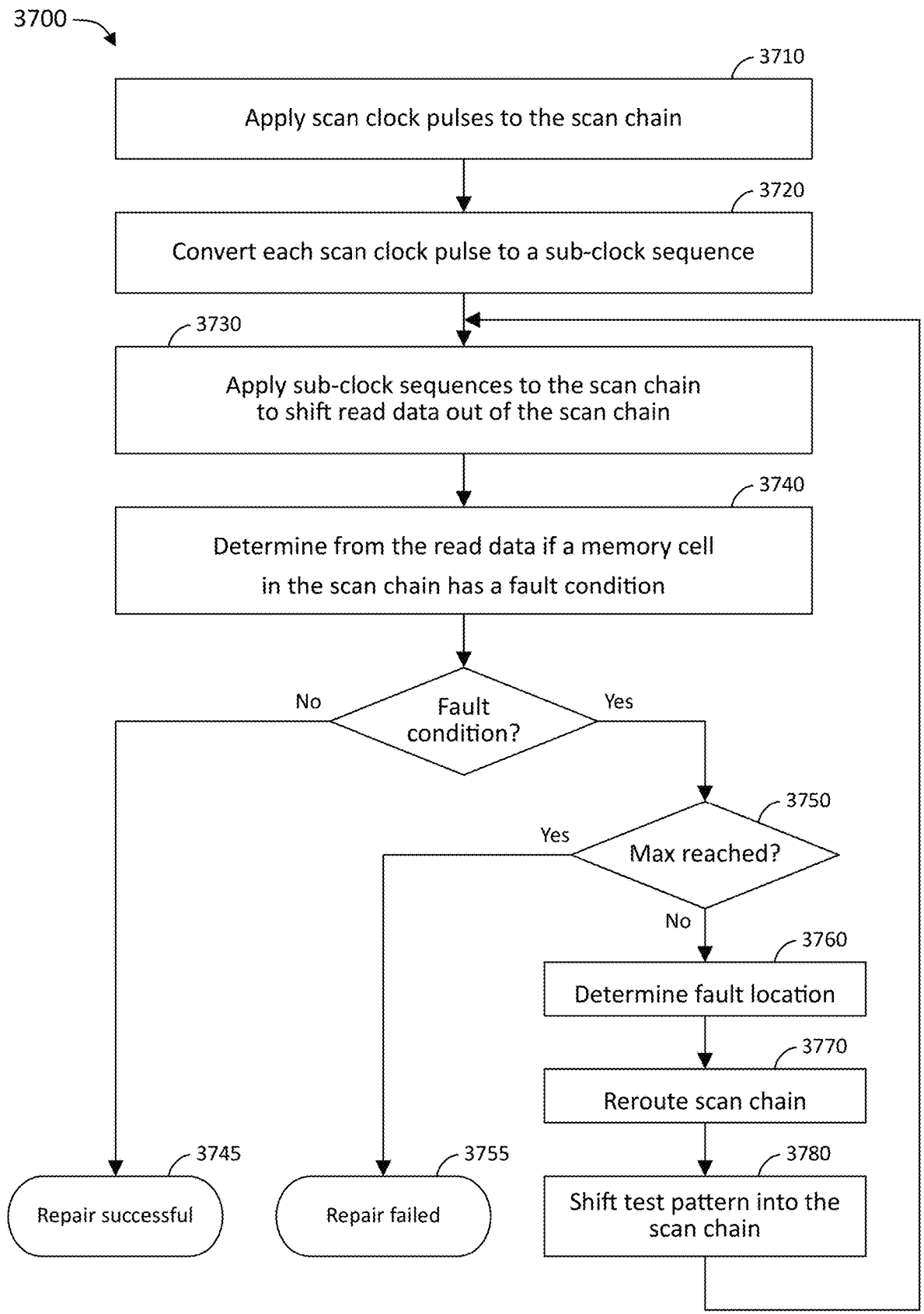
FIG. 37 illustrates an example method of testing and repairing a memory.

FIG. 37 illustrates an example method 3700 of testing and repairing a memory array. The memory array includes memory cells in a scan chain. Method 3700 comprises:

3710—applying a series of scan clock pulses (SCLK pulses) to the scan chain.

3720—converting each of the scan clock pulses to a sequence of non-overlapping scan sub-clock pulses (a sub-clock sequence). In some implementations, the SCLK pulse functions as the first scan sub-clock pulse. The duration of the sub-clock sequence is equal to or shorter than a cycle of the SCLK signal.

3730—applying the sub-clock sequences to flush inputs of the memory cells in the scan chain to shift read data out of the scan chain. An implementation may use the method illustrated with reference to FIG. 35 or FIG. 36 to shift read data out of the scan chain.

3740—determining from the read data whether a memory cell in the scan chain has a fault condition.

3745—upon determining that the scan chain doesn't have a fault condition (or that the maximum number of repairs has been reached), repair is successful, and the method ends. If the maximum number of repairs has been reached but the scan chain still has a fault condition, the memory array may not be repairable.

3750—upon determining that the scan chain has a fault condition, determining if the maximum number of repairs has been reached.

3755—upon determining that the maximum number of repairs has been reached, repair is unsuccessful, and the method ends.

3760—upon determining that the maximum number of repairs has not been reached, determining the location of the memory cell with the fault condition.

3770—upon determining the location, rerouting the scan chain to skip the location and to include redundant memory cells in the scan chain.

3780—shifting a test pattern into the scan chain to prepare for determining if there is still any fault condition left. After this step, the method returns to 3730.

Scan Chains with Flip-Flops and Latches

A scan chain through a memory array can be part of a larger scan chain, i.e., there can be parts of the scan chain that come before and after the memory array. Interfacing between the non-memory parts (i.e., flip-flop-based parts) and the memory parts (i.e., latch-based parts) of the scan chain must be without loss of data. There are two critical interfaces: from a flip-flop-based part to a latch-based part, and from a latch-based part to a flip-flop-based part. These interfaces, if incorrectly designed or implemented can give data loss as shown with reference to figures below. This section further discloses interfaces that solve the problem.

Figure 38A:
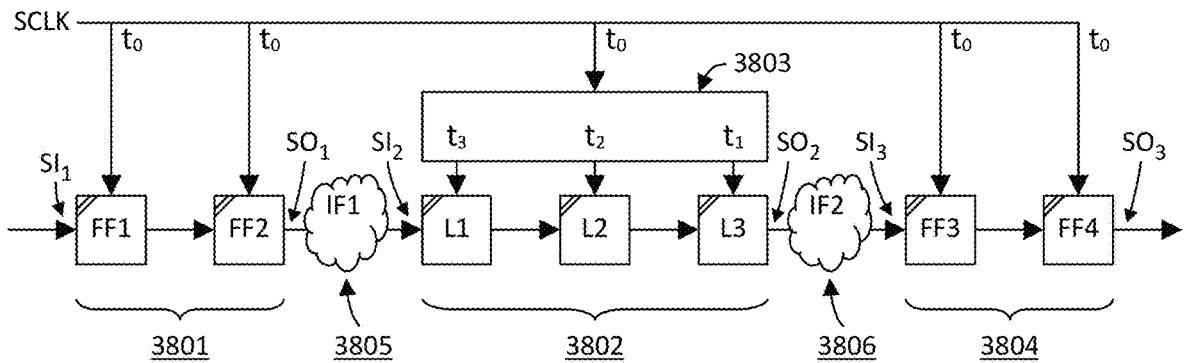
FIGS. 38A-B illustrate example scan chains that include both flip-flop-based parts and latch-based parts.
Figure 38B:
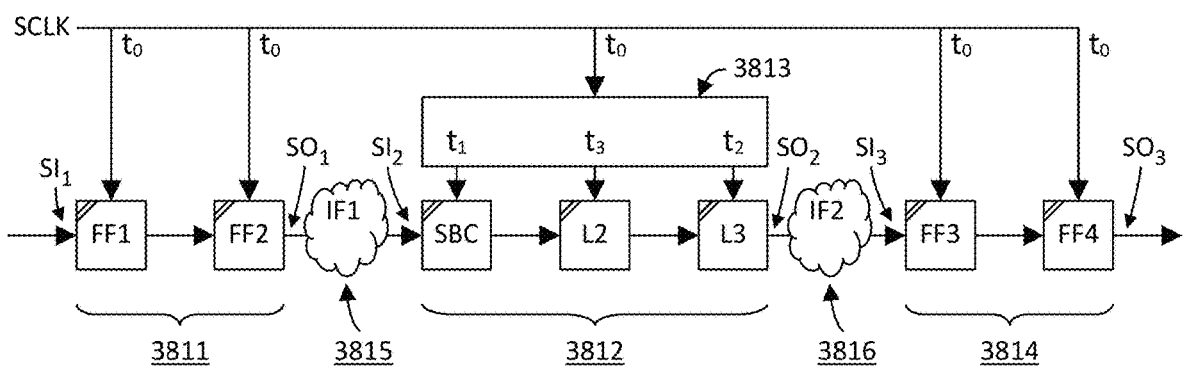

FIGS. 38A-B illustrate example scan chains that include both flip-flop-based parts and latch-based parts. Flip-flops and latches may be scannable, as indicated by the diagonal lines in the left upper corners, referring to FIGS. 9 and 11. FIG. 38A shows an example scan chain 3800 that includes a chain of flip-flops 3801, a chain of latches 3802, a sequence generator 3803, a chain of flip-flops 3804, a first interface 3805, and a second interface 3806. The sequence generator 3803 and the flip-flops in chain of flip-flops 3801 and chain of flip-flops 3804 are coupled with a scan clock (SCLK) input and are configured to receive an SCLK signal that may include a series of SCLK pulses. Latches in chain of latches 3802 are coupled with pulse outputs of sequence generator 3803 and configured to receive sequences of non-overlapping pulses. Chain of flip-flops 3801 has a scan input $SI_1$ and a scan output $SO_1$. Chain of latches 3802 has a scan input $SI_2$ and a scan output $SO_2$. Chain of flip-flops 3804 has a scan input $SI_3$ and a scan output $SO_3$. $SI_2$ is coupled (directly or indirectly via first interface 3805) with $SO_1$. $SI_3$ is coupled (directly or indirectly via second interface 3806) with $SO_2$. $SI_1$ is configured to receive scan input data for the whole scan chain 3800, and $SO_3$ provides scan output data for the whole scan chain 3800. Latches in chain of latches 3802 are operational latches, i.e., when scan chain 3800 is not in scan mode, they serve a data carrying function. Latches L1, L2, and L3 in chain of latches 3802 receive non-overlapping pulses from sequence generator 3803 in a predetermined order, for example, L3 receives a pulse at time $t_1$ before L2 receives a pulse at time $t_2$ and L1 receives a pulse at time $t_3$. The scan chain, or parts of it, and sequence generator 3803 may be enabled by a scan enable (SE) signal and/or a scan control (SC) signal that has not been drawn here.

FIG. 38B shows an example scan chain 3810 that includes a chain of flip-flops 3811, a chain of latches 3812 that includes at least one segment buffer cell (SBC), for example the first latch, a sequence generator 3813, a chain of flip-flops 3814, a first interface 3815, and a second interface 3816. The sequence generator 3813 and the flip-flops of chain of flip-flops 3811 and chain of flip-flops 3814 are coupled with the scan clock SCLK input and are configured to receive the SCLK signal that may include a series of SCLK pulses. Latches in chain of latches 3812 are coupled with pulse outputs of sequence generator 3813 and configured to receive sequences of non-overlapping pulses. Chain of flip-flops 3811 has a scan input $SI_1$ and a scan output $SO_1$. Chain of latches 3812 has a scan input $SI_2$ and a scan output $SO_2$. Chain of flip-flops 3814 has a scan input $SI_3$ and a scan output $SO_3$. $SI_2$ is coupled (directly or indirectly via first interface 3815) with $SO_1$. $SI_3$ is coupled (directly or indirectly via second interface 3816) with $SO_2$. $SI_1$ is configured to receive scan input data for the whole scan chain 3810, and $SO_3$ provides scan output data for the whole scan chain 3810. Latches other than SBC in chain of latches 3812 are operational latches, i.e., when scan chain 3810 is not in scan mode, they serve a data carrying function. Latches SBC, L2, and L3 in chain of latches 3812 receive non-overlapping pulses from sequence generator 3813 in a predetermined order, for example, SBC receives a pulse at time $t_1$ before L3 receives a pulse at time $t_2$ and L2 receives a pulse at time $t_3$. Whereas chain of latches 3802 of FIG. 38A includes an unsegmented chain of operational latches, chain of latches 3812 of FIG. 38B may be segmented, including multiple chain segments with operational latches and segment buffer cells, as described earlier in this document. The flip-flops and latches in FIGS. 38A-B may be scannable, and may be configured to receive a scan enable (SE) signal (not drawn) and/or a scan control (SC) signal (not drawn), that determines whether a flip-flop or a latch is in an operational mode or in scan mode. The function of SE and SC signals is described elsewhere in this document. Whereas chain of flip-flops 3801, chain of flip-flops 3804, chain of flip-flops 3811, and chain of flip-flops 3814 are all drawn including two flip-flops, in other implementations they may have any number of flip-flops. Whereas chain of latches 3802 and chain of latches 3812 are each shown including three latches, in other implementations they may have any number of latches. Additionally, the latches in chain of latches 3802 and chain of latches 3812 may be included in arrays of latches, or memory arrays, as described elsewhere in this document.

Figure 39:
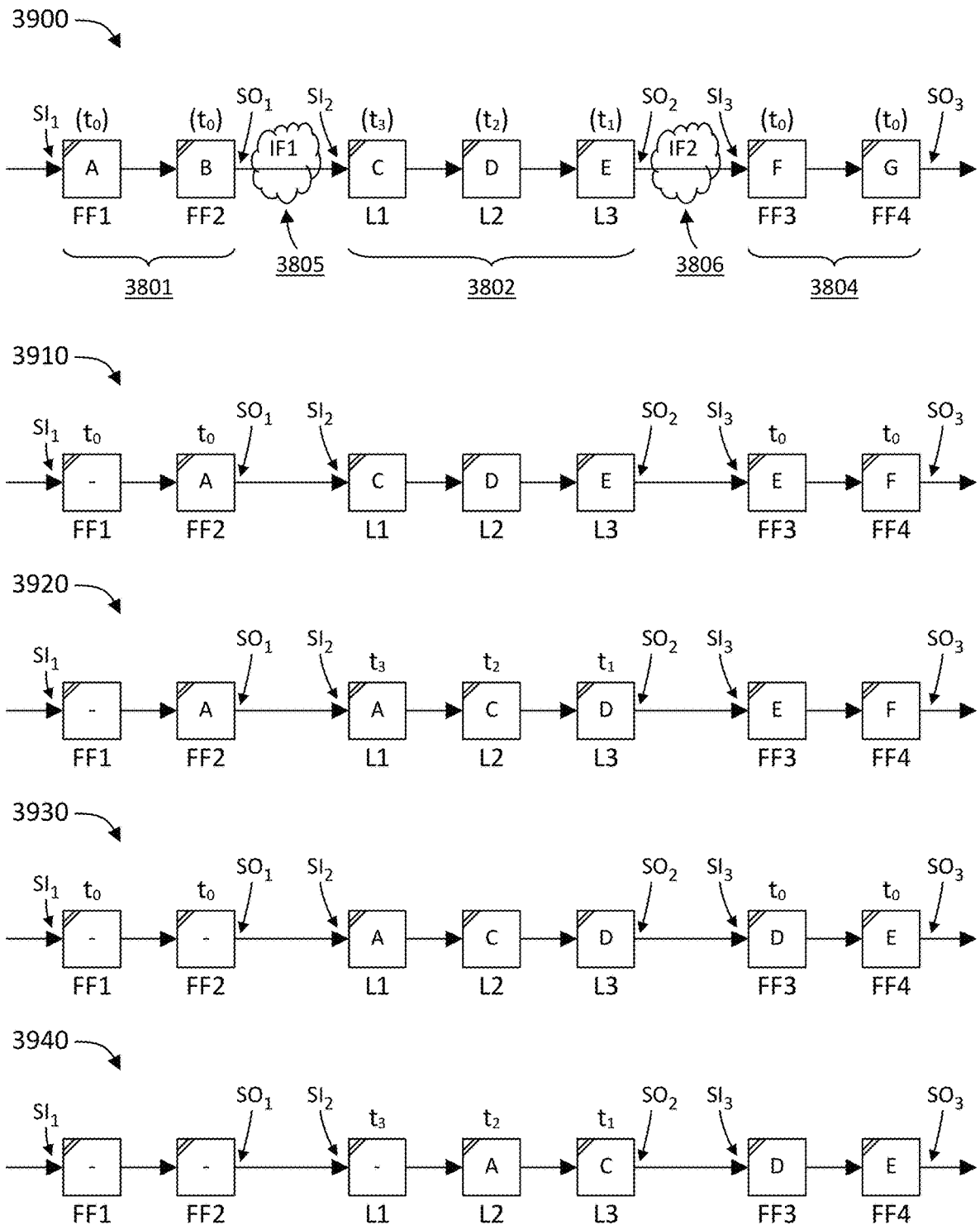
FIG. 39 illustrates a problem interfacing a flip-flop-based part with a latch-based part in the example scan chain of FIG. 38A.

FIG. 39 illustrates a problem when directly interfacing a flip-flop-based part with the latch-based part in the example scan chain 3800 of FIG. 38A. In an initial situation 3900, i.e., before a first SCLK pulse, flip-flops FF1 and FF2 of chain of flip-flops 3801 store data bit values A and B. Latches L1, L2, and L3 of chain of latches 3802 store data bit values C, D, and E, respectively. Flip-flops FF3 and FF4 of chain of flip-flops 3804 store data bit values F and G, respectively. In this implementation, first interface 3805 is a straight connection without interfering elements, and so is second interface 3806.

In situation 3910, an SCLK pulse has been applied at time $t_0$ of a first SCLK cycle. As a result, each flip-flop is now storing a data bit value that was presented to its input at to, so flip-flops FF2, FF3, and FF4 hold data bit values A, E, and F, respectively. Flip-flop FF1 stores the data bit value that was at scan input $SI_1$, which here is undefined. In situation 3920, non-overlapping pulses at times $t_1$, $t_2$, and $t_3$ have been applied to latches L3, L2, and L1, respectively. Latch L3 now holds the data bit value D that was previously stored in L2. Latch L2 holds the data bit value C that was previously stored in L1, and latch L1 holds the data bit value A that is also stored in FF2. None of the flip-flops or latches hold the data bit value B, which was initially stored in FF2.

In situation 3930, another SCLK pulse has been applied at time $t_0$ of a successive SCLK cycle. Again, each flip-flop is now storing a data bit value that was presented to its input at time $t_0$ of the successive SCLK cycle, so flip-flops FF3, and FF4 hold data bit values D and E, respectively. Flip-flops FF1 and FF2 store the data bit values that were previously at scan input $SI_1$, and that are undefined in this example. In situation 3940, non-overlapping pulses at times $t_1$, $t_2$, and $t_3$ during the successive SCLK cycle have been applied to latches L3, L2, and L1, respectively. Latch L3 now holds data bit value C that was previously stored in L2. Latch L2 holds data bit value A that was previously stored in L1, and latch L1 holds the undefined data bit value that is also stored in FF2.

The sequence of events depicted in initial situation 3900 through situation 3940 shows that first interface 3805 suffers from loss of data (the data bit value B is lost in situation 3910), whereas second interface 3806 does not lose data.

Figure 40:
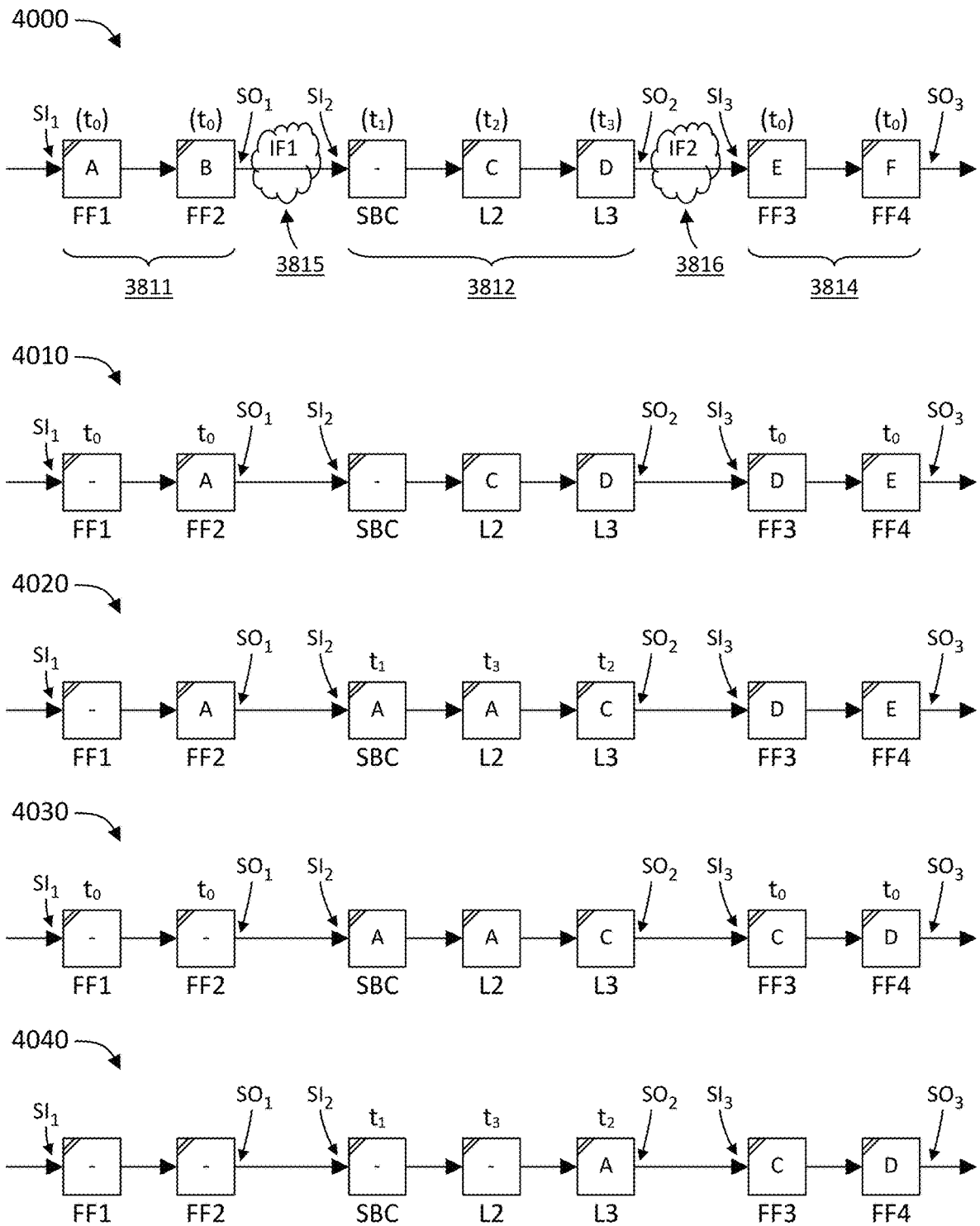
FIG. 40 illustrates a problem interfacing a flip-flop-based part with a latch-based part in the example scan chain of FIG. 38B.

FIG. 40 illustrates a problem interfacing a flip-flop-based part with the latch-based part in the example scan chain of FIG. 38B. In an initial situation 4000, before any pulses are applied, flip-flops FF1 and FF2 of chain of flip-flops 3811 store data bit values A and B. Latches L2 and L3 of chain of latches 3812 store data bit values C and D, respectively. Flip-flops FF3 and FF4 of chain of flip-flops 3814 store data bit values E and F, respectively. In this implementation, first interface 3815 is a straight connection without interfering elements, and so is second interface 3816.

In situation 4010, an SCLK pulse has been applied at time $t_0$ of a first SCLK cycle. As a result, each flip-flop is now storing a data bit value that was presented to its input at time $t_0$ of the first SCLK cycle, so flip-flops FF2, FF3, and FF4 hold data bit values A, D, and E, respectively. Flip-flop FF1 stores the data bit value that was at scan input $SI_1$, which here is undefined. In situation 4020, non-overlapping pulses at times $t_1$, $t_2$, and $t_3$ have been applied to latches SBC, L3, and L2, respectively. SBC now holds data bit value A that is also stored in FF2. Latch L3 now holds data bit value C that was previously stored in L2. Latch L2 holds data bit value A that is also stored in SBC and FF1. None of the flip-flops or latches holds data bit value B, which was initially stored in FF2.

In situation 4030, another SCLK pulse has been applied at time $t_0$ of a successive SCLK cycle. Again, each flip-flop is now storing a data bit value that was presented to its input at time $t_0$ of the successive SCLK cycle, so flip-flops FF3, and FF4 hold data bit values C and D, respectively. Flip-flops FF1 and FF2 store the data bit value that were at scan input $SI_1$, and that are undefined in this example. In situation 4040, non-overlapping pulses at times $t_1$, $t_2$, and $t_3$ during the successive SCLK cycle have been applied to latches SBC, L3, and L2, respectively. SBC holds the undefined data bit value that is also stored in FF2. Latch L3 now holds data bit value A that was previously stored in L2. Latch L2 holds the undefined data bit value that is also stored in SBC and FF1.

The sequence of events depicted in initial situation 4000 through situation 4040 shows that here also, first interface 3815 suffers from loss of data (the data bit value B is lost in situation 4020), whereas second interface 3816 does not lose data.

Figure 41:
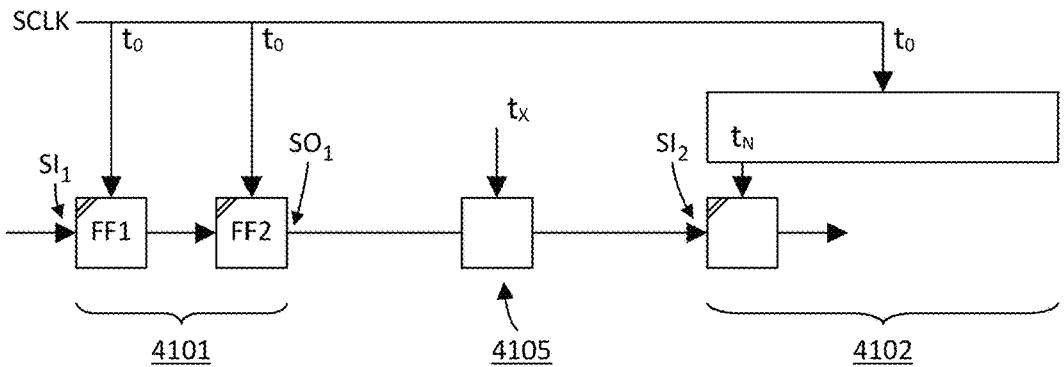
FIG. 41 illustrates an example of an electronic circuit that provides a first general solution to the problems in FIGS. 39-40.

FIG. 41 illustrates an example of an electronic circuit 4100 that provides a first general solution to the problems in FIGS. 39-40. As FIGS. 39-40 showed, the data that was stored in FF2 in chain of flip-flops 4101 at the beginning of scanning is lost because FF2 is updated by the first SCLK pulse at to before any of the latches (L1 or SBC) in chain of latches 4102 stores its value. Electronic circuit 4100 includes chain of flip-flops 4101 whose scan output $SO_1$ is coupled with the scan input $SI_2$ of chain of latches 4102 via an interface memory element 4105. Interface memory element 4105 is configured to capture the data bit value of the last flip-flop (e.g., FF2) in chain of flip-flops 4101 and store the data bit value for access by the first latch (e.g., L1 or SBC) in chain of latches 4102. Whereas the flip-flops of chain of flip-flops 4101 are triggered at a first time $t_0$ during a cycle of an initial scan clock (SCLK), and the first latch in chain of latches 4102 is triggered at a later time $t_N$ during the initial cycle of SCLK, interface memory element 4105 is triggered at a time $t_X$ which is no later than first time $t_0$ of the initial cycle of SCLK. In some implementations, the scan chain must be enabled (i.e., in scan mode) for SO1 to provide a valid input signal for interface memory element 4105. In other implementations, SO1 is always valid regardless of whether electronic circuit 4100 is in scan mode, and $t_X$ may occur even before scan mode is enabled.

In some implementations, chain of latches 4102 includes only data storage latches. That is, all latches in chain of latches 4102 may be used in an operational mode, and each of the latches can be set or reset by scan data that enters the scan chain at $SI_1$. Also, the content of each of the latches can be observed from the scan output SO of the scan chain. In other implementations, chain of latches 4102 includes both data storage latches and segment buffer cells, and chain of latches 4102 may include one or more chain segments.

Figure 42:
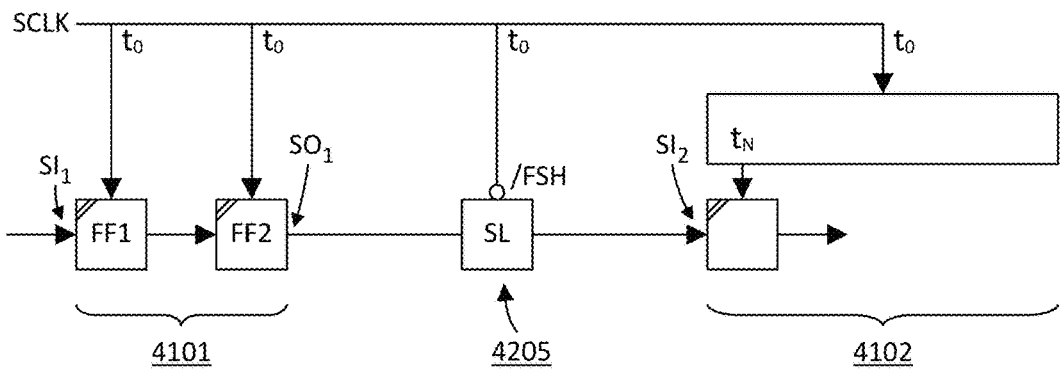
FIG. 42 illustrates a first implementation of the interface from the flip-flop-based part to the latch-based part of the scan chain of FIG. 41.

FIG. 42 illustrates a first implementation of interface memory element 4105 from the flip-flop-based part to the latch-based part of the scan chain of FIG. 41. In electronic circuit 4200, interface memory element 4105 is implemented as interface latch 4205. Interface latch 4205 has a flush input (FSH input) that is asserted when a clock input (CLK input) of a flip-flop in chain of flip-flops 4101 is de-asserted, and that is de-asserted when the CLK input of the flip-flop in chain of flip-flops 4101 is asserted. The operation of electronic circuit 4200 is explained later with reference to FIG. 46.

Figure 43:
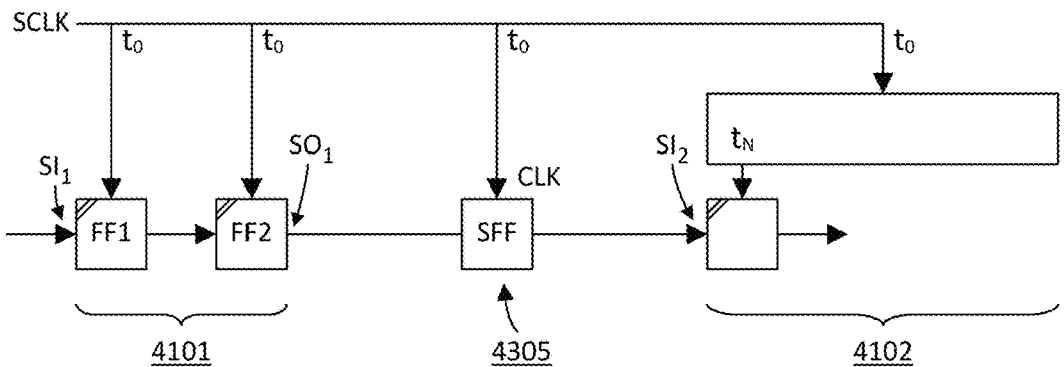
FIG. 43 illustrates a second implementation of the interface from the flip-flop-based part to the latch-based part of the scan chain of FIG. 41.

FIG. 43 illustrates a second implementation of the interface from the flip-flop-based part to the latch-based part of the scan chain of FIG. 41. In electronic circuit 4300, interface memory element 4105 is implemented as an interface flip-flop 4305 with a clock input (CLK input) that is asserted when a clock input of a flip-flop in chain of flip-flops 4101 is asserted, and that is de-asserted when the CLK input of the flip-flop in chain of flip-flops 4101 is de-asserted. The operation of electronic circuit 4300 is explained later with reference to FIG. 47.

Figure 44:
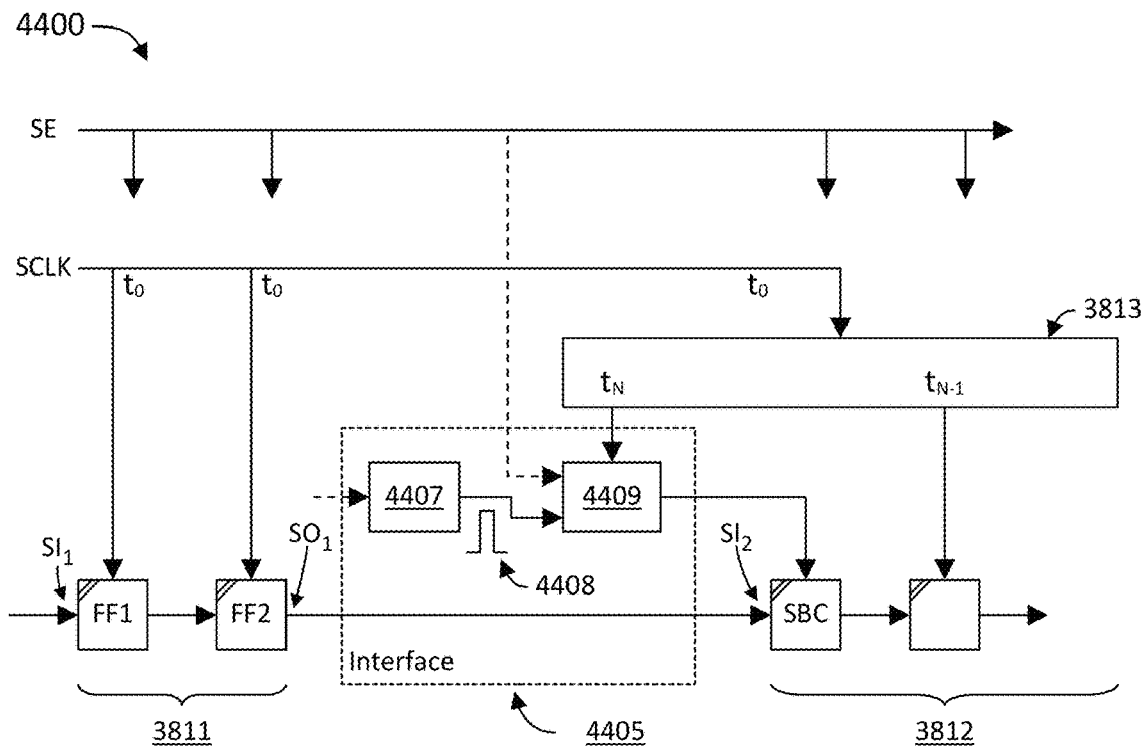
FIG. 44 illustrates an example of an electronic circuit that provides a second general solution to the problem in FIG. 40.

FIG. 44 illustrates an example of an electronic circuit 4400 that provides a second general solution to the problem in FIG. 40. (The first general solution was described with reference to FIG. 41.) Electronic circuit 4400 may directly couple the scan output $SO_1$ of chain of flip-flops 3811 with the scan input $SI_2$ of chain of latches 3812 using interface 4405. Interface 4405 may include a first circuit, e.g., pulse shaper 4407, that creates a scan start pulse 4408, and combines the signal from scan start pulse 4408 with the signal from one of the non-overlapping pulses generated by sequence generator 3813 in a combinational logic circuit 4409 to trigger the first latch (e.g., SBC as shown) of chain of latches 3812. Scan start pulse 4408 comes before $t_0$ of the initial SCLK pulse, and thus also before any of the non-overlapping pulses generated by sequence generator 3813. In some cases, combinational logic circuit 4409 further receives a scan enable pulse SE to facilitate an implementation only generating scan start pulse 4408 when electronic circuit 4400 is in scan mode.

Note that FIG. 38B shows that the sequence of non-overlapping pulses starts with SBC (at $t_1$) and continues from L3 (at $t_2$) to L2 (at $t_3$), consistent with the sequence shown in FIG. 22 for a standalone latch-based scan chain with one or more chain segments. However, in FIG. 44, the sequence of non-overlapping pulses starts with the last (here rightmost) latch at $t_1$, continues towards the left, and ends with the SBC at time $t_N$ (e.g., at time $t_3$). By issuing scan start pulse 4408 just before $t_0$ of the initial SCLK pulse, interface 4405 enables SBC to capture the data bit value stored in FF2 of chain of flip-flops 3811, thereby preventing the data loss that was illustrated in situation 4010 in FIG. 40.

Figure 45:
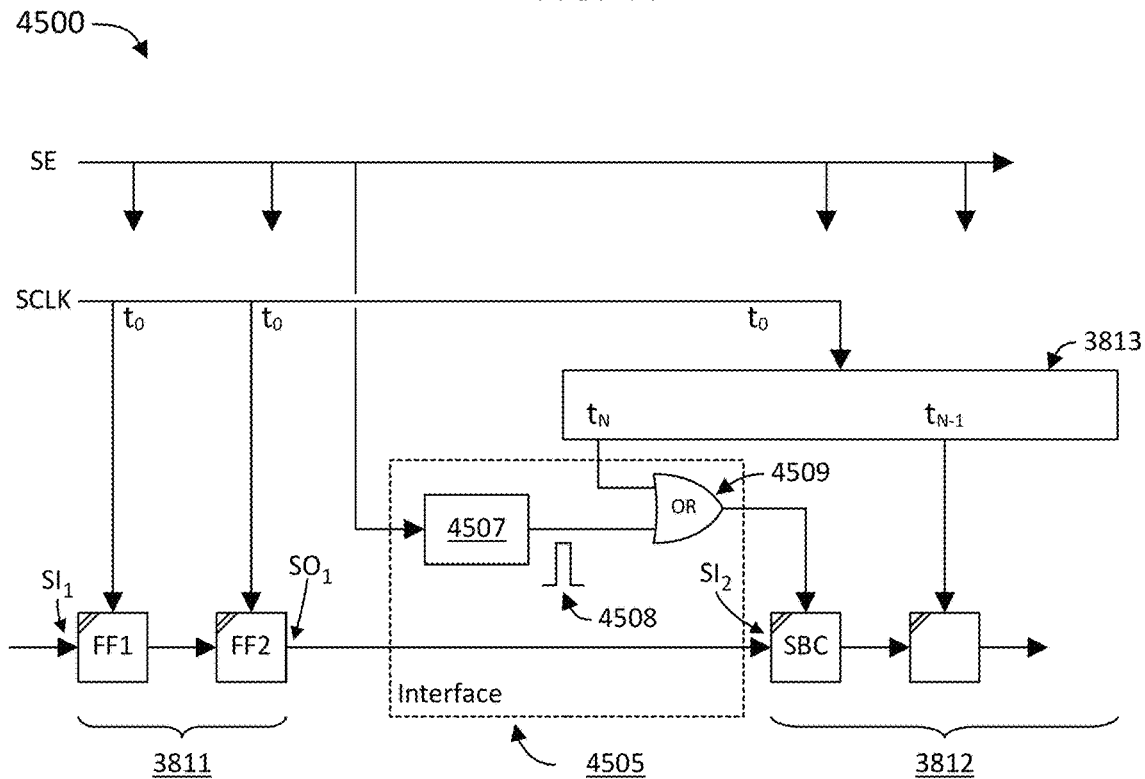
FIG. 45 illustrates another implementation of this second general solution.

FIG. 45 illustrates another implementation of this second general solution. The interface 4505 in electronic circuit 4500 includes pulse shaper 4507, which may be triggered by the scan enable signal SE (or by the scan control signal SC in case of an SRAM array) to generate scan start pulse 4508. Pulse shaper 4507 may be implemented in many ways, for example as circuit 1600 shown in FIG. 16. The combinational logic circuit 4509 may be as simple as an OR gate, or another basic logic gate, dependent on signal polarities. In the case drawn, SCLK may be provided to CLK inputs of the flip-flops in the chain(s) of flip-flops and to the input of sequence generator 3813. The non-overlapping pulse outputs of sequence generator 3813 are coupled with the flush inputs (FSH inputs and/or /FSH inputs) of latches in chain of latches 3812. The scan enable signal SE is coupled with SE inputs of the scannable flip-flops, with SE inputs or SC inputs of all scannable latches, and with the input of pulse shaper 4507.

Chain of latches 3812 may include one or more chain segments. However, the scan start pulse 4508 needs to be provided to the first segment buffer cell SBC, because that is where a latch receives data from a flip-flop in chain of flip-flops 3811—and where data loss would occur.

Figure 46:
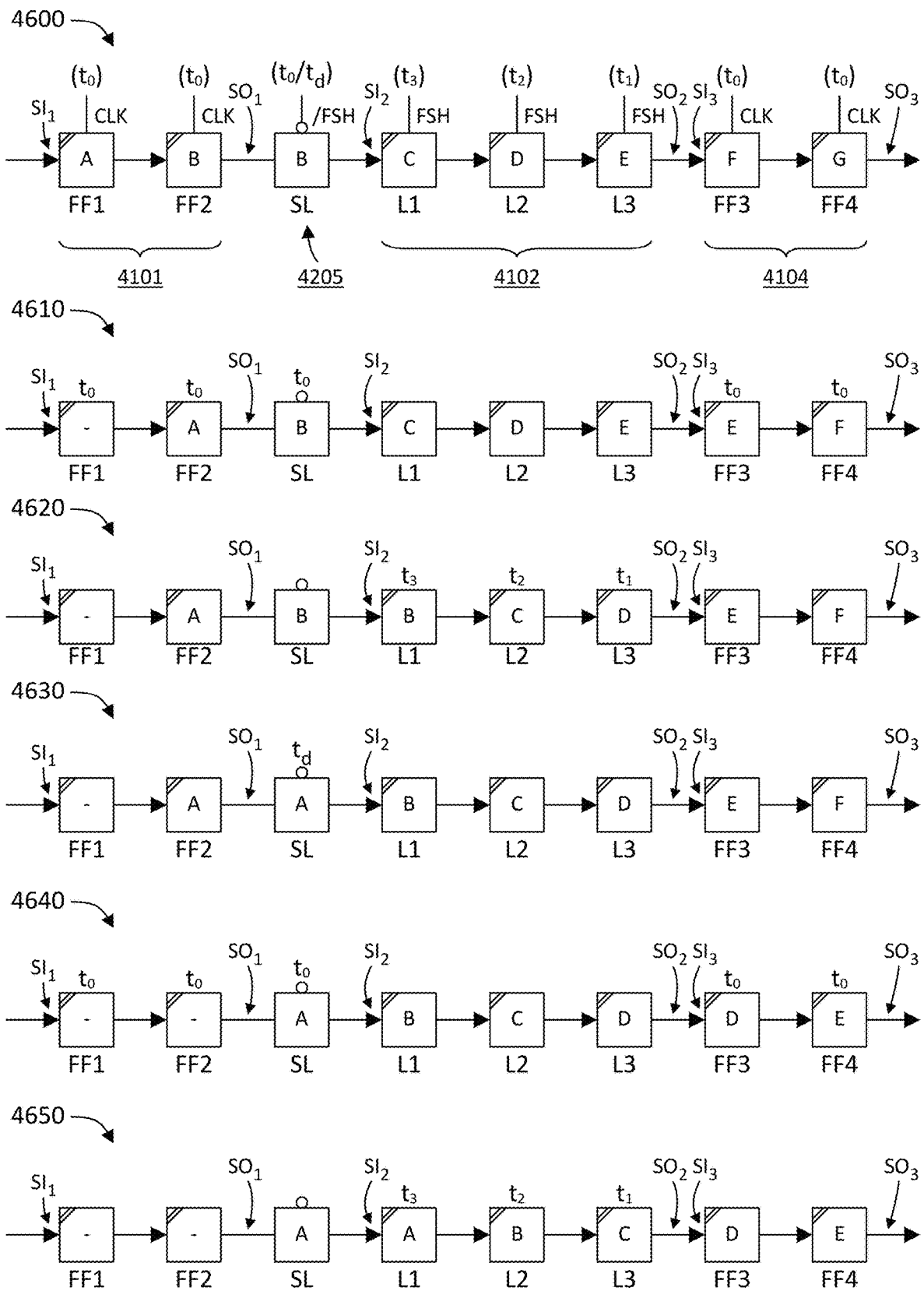
FIG. 46 shows an example of the operation of the interface from FIG. 42.

FIG. 46 shows an example of the operation of the interface from FIG. 42. The interface uses interface latch 4205 to prevent data loss between chain of flip-flops 4101 and chain of latches 4102 at the start of scanning. In initial situation 4600, i.e., before $t_0$ of the first SCLK cycle, flip-flops FF1 and FF2 of chain of flip-flops 4101 store data bit values A and B. Latches L1, L2, and L3 of chain of latches 4102 store data bit values C, D, and E, respectively. Flip-flops FF3 and FF4 of chain of flip-flops 4104 store data bit values F and G, respectively. The SCLK signal is not asserted. Hence, interface latch 4205 is in flush mode, copying data bit value B from FF2 at its output.

In situation 4610, an SCLK pulse has been asserted at time $t_0$ of a first SCLK cycle. As a result, each flip-flop is now storing a data bit value that was presented to its input at time $t_0$ of the first SCLK cycle, so flip-flops FF2, FF3, and FF4 hold data bit values A, E, and F, respectively. Flip-flop FF1 stores the data bit value that was previously at scan input $SI_1$, which here is undefined. Interface latch 4205 was transparent up to $t_0$ (data bit value B), at which point it latched its value (because /FSH was de-asserted). Thus, interface latch 4205 stores data bit value B. In situation 4620, before the SCLK pulse of the first SCLK cycle has been de-asserted, non-overlapping pulses at times $t_1$, $t_2$, and $t_3$ have been applied to latches L3, L2, and L1, respectively. Latch L3 now holds data bit value D that was previously stored in L2. Latch L2 holds data bit value C that was previously stored in L1, and latch L1 holds data bit value B that is also stored in interface latch 4205.

In situation 4630, the SCLK pulse of the first SCLK cycle has been de-asserted. Note that this only affects interface latch 4205, whose flush mode is asserted so that it becomes transparent for its input value (data bit value A). Note also that the SCLK pulse may be de-asserted at any time during the first SCLK cycle. However, during the SCLK cycle, the sequence generator generates non-overlapping pulses at $t_1$, $t_2$, and $t_3$, which changes the values stored in latches L3, L2, and L1, respectively, as described for situation 4620. As drawn in situation 4630, the SCLK pulse has been de-asserted after the pulse at $t_3$, and L1-L3 hold the values described for situation 4620. If SCLK would have been de-asserted before $t_3$, interface latch 4205 would have changed its data bit value from B to A before L1 could copy it, and the B value would still have been lost. For an SCLK pulse with 50% duty cycle this effectively halves the time during which the sequence generator can provide its non-overlapping pulses.

In situation 4640, another SCLK pulse has been applied at time $t_0$ of a successive SCLK cycle. Again, each flip-flop is now storing a data bit value that was presented to its input at time $t_0$ of the successive SCLK cycle, so flip-flops FF3, and FF4 hold data bit values D and E, respectively. Flip-flops FF1 and FF2 store the data bit values that were previously at scan input $SI_1$, and that are undefined in this example. Interface latch 4205 freezes its value (data bit value A) at time $t_0$ and stores it as long as SCLK is asserted. In situation 4650, SCLK is still asserted, but non-overlapping pulses at times $t_1$, $t_2$, and $t_3$ during the successive SCLK cycle have already been applied to latches L3, L2, and L1, respectively. Latch L3 now holds data bit value C that was previously stored in L2. Latch L2 holds data bit value B that was previously stored in L1, and latch L1 holds data bit value A that is still stored in interface latch 4205.

The sequence of events depicted in initial situation 4600 to situation 4650 shows that interface latch 4205 prevents data loss, provided that the sequence of non-overlapping pulses is completed before the SCLK signal is de-asserted.

Figure 47:
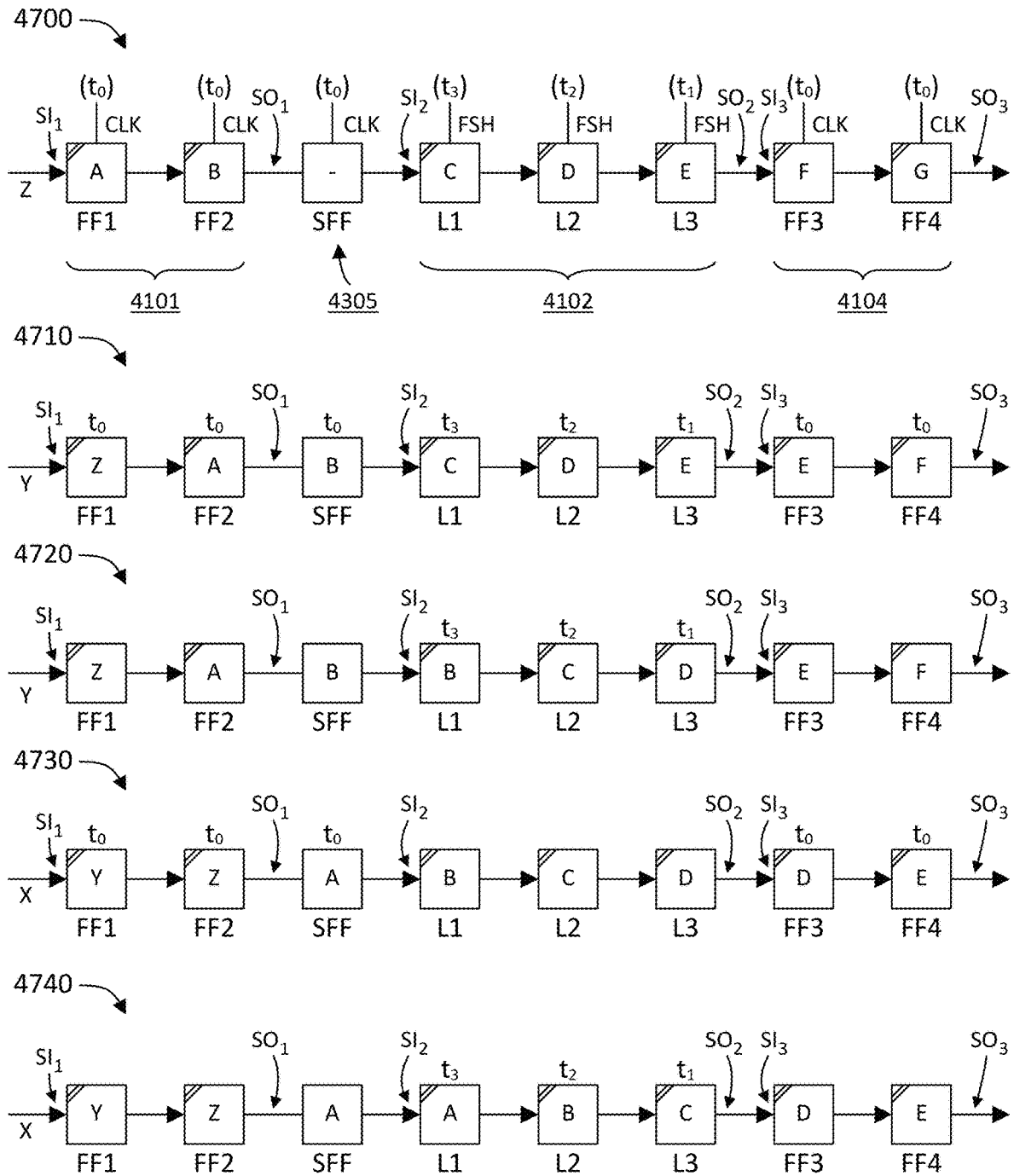
FIG. 47 shows an example of the operation of the interface from FIG. 43.

FIG. 47 shows an example of the operation of the interface from FIG. 43. The interface uses interface flip-flop 4305 to prevent data loss between chain of flip-flops 4101 and chain of latches 4102 at the start of scanning. In initial situation 4700, i.e., before $t_0$ of the first SCLK cycle, flip-flops FF1 and FF2 of chain of flip-flops 4101 store data bit values A and B. Latches L1, L2, and L3 of chain of latches 4102 store data bit values C, D, and E, respectively. Flip-flops FF3 and FF4 of chain of flip-flops 4104 store data bit values F and G, respectively. The SCLK signal has not yet been asserted. The value of interface flip-flop 4305 is undefined. The scan input SI$_1$ of chain of flip-flops 4101 is presented with a data bit value Z.

In situation 4710, an SCLK pulse has been applied at time t$_0$ of a first SCLK cycle. As a result, each flip-flop is now storing a data bit value that was presented to its input at time t$_0$ of the first SCLK cycle, so flip-flops FF1, FF2, FF3, and FF4 hold data bit values Z, A, E, and F, respectively. The scan input SI$_1$ of chain of flip-flops 4101 may now be presented with a new data bit value Y. Interface flip-flop 4305 holds data bit value B that was previously in FF2. In situation 4720, non-overlapping pulses at times t$_1$, t$_2$, and t$_3$ have been applied to latches L3, L2, and L1, respectively. Latch L3 now holds data bit value D that was previously stored in L2. Latch L2 holds data bit value C that was previously stored in L1, and latch L1 holds data bit value B that is also stored in interface flip-flop 4305.

In this case, de-assertion of the SCLK signal during the sequence of non-overlapping pulses has no effect on the content of chain of latches 4102, since interface flip-flop 4305 holds it data through the full SCLK cycle. Thus, compared with an interface latch, interface flip-flop 4305 allows using almost the full SCLK cycle to complete the sequence of non-overlapping pulses.

In situation 4730, another SCLK pulse has been applied at time t$_0$ of a successive SCLK cycle. Again, each flip-flop is now storing a data bit value that was presented to its input at time t$_0$ of the successive SCLK cycle, so flip-flops FF1, FF2, FF3, and FF4 hold data bit values Y, Z, D and E, respectively. Interface flip-flop 4305 stores data bit value A that was previously in FF2. The scan input SI$_1$ of chain of flip-flops 4101 may now be presented with a new data bit value X. In situation 4740, non-overlapping pulses at times t$_1$, t$_2$, and t$_3$ during the successive SCLK cycle have been applied to latches L3, L2, and L1, respectively. Latch L3 now holds the data bit value C that was previously stored in L2. Latch L2 holds the data bit value B that was previously stored in L1, and latch L1 holds the data bit value A that is still stored in interface flip-flop 4305.

The sequence of events depicted in initial situation 4700 to situation 4740 shows that interface flip-flop 4305 prevents data loss. Unlike interface latch 4205, it allows almost the full SCLK cycle to be used for the sequence of non-overlapping pulses. The last of the non-overlapping pulses must have been de-asserted just prior to t$_0$ of the next SCLK cycle, i.e., just prior to SCLK being asserted.

Figure 48:
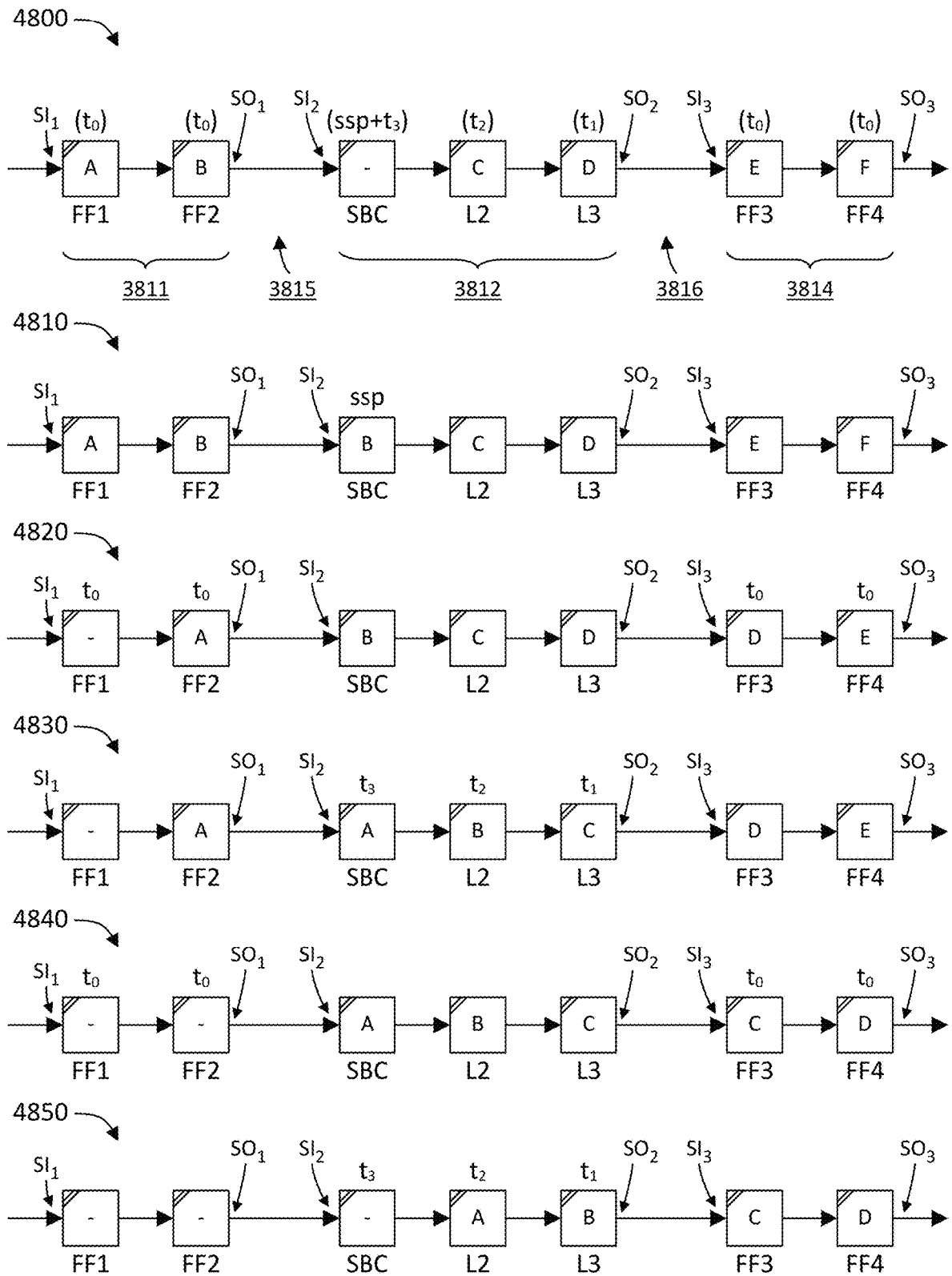
FIG. 48 shows an example of the operation of the interface from FIGS. 44 and 45.

FIG. 48 shows an example of the operation of the interface from FIGS. 44 and 45. In those implementations, the scan output SO1 of chain of flip-flops 3811 may be directly coupled with the scan input SI$_2$ of chain of latches 3812. Chain of latches 3812 starts with a segment buffer cell SBC, which may not have a data carrying function in operational mode. Chain of flip-flops 3811 may have one or more chain segments, and thus one or more segment buffer cells. Data loss is prevented by a one-time pulse at the start of scanning, the scan start pulse (ssp). For example, electronic circuit 4400 has scan start pulse 4408 and electronic circuit 4500 has scan start pulse 4508. The ssp is issued before t$_0$ of the first SCLK cycle when scanning starts. A combinational logic circuit combines the signal of the ssp with the signal of the last of the non-overlapping pulses from sequence generator 3813 as flush signals for SBC. While FIG. 44 leaves it open what triggers pulse shaper 4407 to create scan start pulse 4408 (many options exist), electronic circuit 4500 derives the trigger for pulse shaper 4507 from the scan enable signal SE or the scan control signal SC.

In initial situation 4800, before the ssp and before t$_0$ of the first SCLK cycle, flip-flops FF1 and FF2 of chain of flip-flops 3811 store data bit values A and B. Latches L2, and L3 of chain of latches 3812 store data bit values C and D, respectively. Flip-flops FF3 and FF4 of chain of flip-flops 3814 store data bit values E and F, respectively. The value of SBC is undefined. In situation 4810, the ssp has been applied. As a result, the SBC latch has copied data bit value B from FF2 of chain of flip-flops 3811. All other latch values and the flip-flop values remain the same.

In situation 4820, an SCLK pulse has been applied at time t$_0$ of the first SCLK cycle. As a result, each flip-flop is now storing a data bit value that was presented to its input at time t$_0$ of the first SCLK cycle, so flip-flops FF2, FF3, and FF4 hold data bit values A, D, and E, respectively. Flip-flop FF1 stores the data bit value that was previously at scan input SI$_1$, which here is undefined. None of the latches has changed. In situation 4830, non-overlapping pulses at times t$_1$ and t$_2$, and t$_3$ have been applied to latches L3, L2, and L1, respectively. Latch L3 now holds data bit value C that was previously stored in L2. Latch L2 holds data bit value B that was previously stored in L1, and latch L1 holds data bit value A that is also stored in FF1 of chain of flip-flops 3811.

In situation 4840, the next SCLK pulse has been applied at time t$_0$ of the successive SCLK cycle. Again, each flip-flop is now storing a data bit value that was presented to its input at time t$_0$ of the successive SCLK cycle, so flip-flops FF3, and FF4 hold data bit values C and D, respectively. Flip-flops FF1 and FF2 store the data bit value that were previously at scan input SI$_1$, and that are undefined in this example. In situation 4850, non-overlapping pulses at times t$_1$, t$_2$, and t$_3$ have been applied to latches L3, L2, and L1, respectively. Latch L3 now holds data bit value B that was previously stored in L2. Latch L2 holds data bit value A that was previously stored in L1, and latch L1 holds the undefined data bit value that is also stored in FF2 of chain of flip-flops 3811.

The sequence of events depicted in initial situation 4800 to situation 4850 shows that the scan start pulse prevents data loss.

Figure 49:
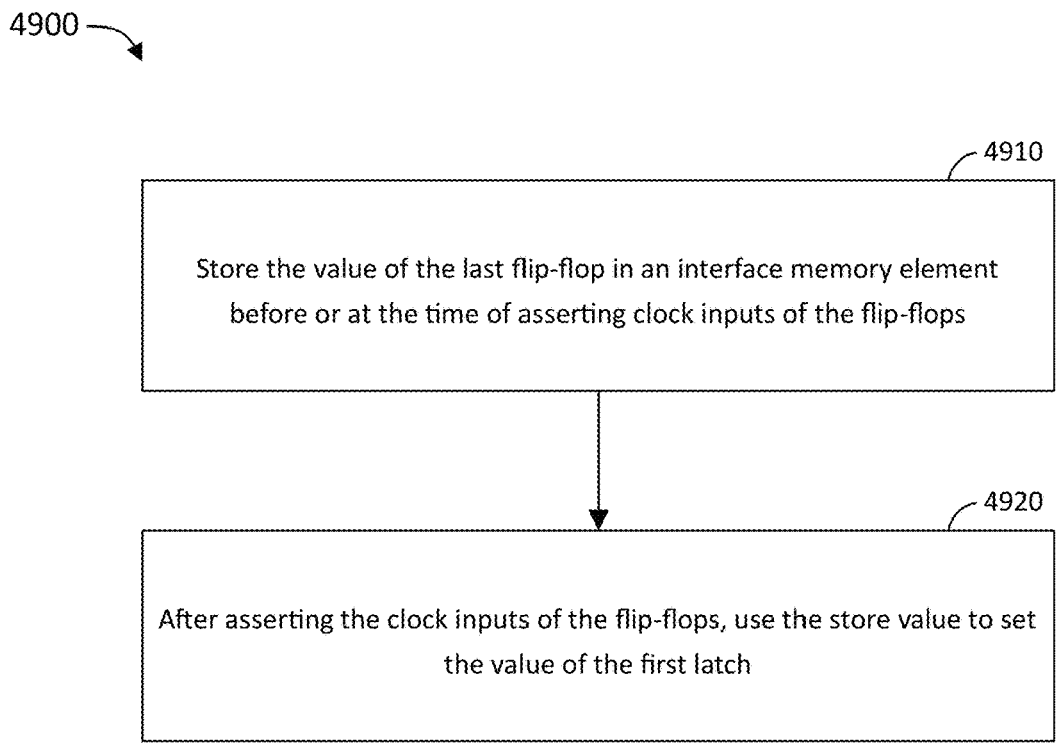
FIG. 49 illustrates an example method of interfacing the last flip-flop in the flip-flop-based part of the scan chain with the first latch in the latch-based part of the scan chain.

FIG. 49 illustrates an example method 4900 of interfacing the last flip-flop in the flip-flop-based part of the scan chain with the first latch in the latch-based part of the scan chain. The method is based on the scan chains depicted in FIGS. 41-43, and comprises:

4910—in an interface memory element, store the value of the last flip-flop before or at the time of asserting clock inputs of flip-flops in the flip-flop-based part of the scan chain. The memory element may be a flip-flop, or a latch whose flush input (or scan control input) is asserted when the clock inputs of the flip-flops are de-asserted, and de-asserted when the clock inputs of the flip-flops are asserted.

4920—after the time of asserting the clock inputs of the flip-flops, use the stored value to set the value of the first latch.

Figure 50:
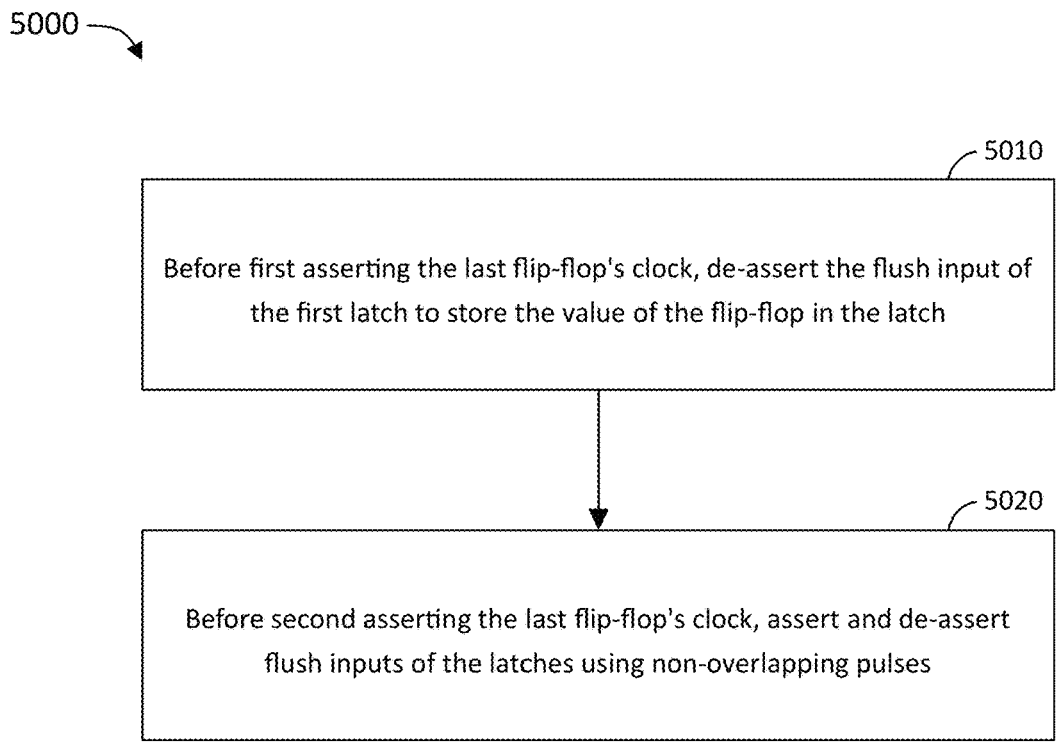
FIG. 50 illustrates an example method of interfacing the last flip-flop in the flip-flop-based part of the scan chain with the first latch in the latch-based part of the scan chain.

FIG. 50 illustrates an example method 5000 of interfacing the last flip-flop in the flip-flop-based part of the scan chain with the first latch in the latch-based part of the scan chain. The method is based on the scan chains depicted in FIGS. 44-45, and comprises:

5010—before the time of first asserting the clock input of the last flip-flop in the flip-flop-based part of the scan chain, deassert the flush input (or scan control input) of the first latch to store the value of the last flip-flop.

5020—before the time of second asserting the clock input of the last flip-flop in the flip-flop-based part of the scan chain, asserting and de-asserting flush inputs or scan control inputs of latches in the latch-based part of the scan chain using non-overlapping pulses to assert and de-assert the flush inputs (or scan control inputs).

PARTICULAR IMPLEMENTATIONS

Described implementations of the subject matter can include one or more features, alone or in combination, as described in the following clauses.

Clause 1. An array of memory cells, comprising:
a scan chain including a first chain segment that includes N of the memory cells of the array of memory cells; wherein;
N is an integer number greater than 1;
the first chain segment is configured to receive a sequence of non-overlapping sub-clock pulses from a sequence generator, wherein the sequence generator has a scan clock input (an SCLK input) and at least N−1 scan sub-clock outputs;
each of the at least N−1 scan sub-clock outputs is coupled with one of the N memory cells;
upon receiving a pulse in a signal on the SCLK input, the sequence generator generates the sequence of non-overlapping sub-clock pulses and outputs the non-overlapping sub-clock pulses on respective individual scan sub-clock outputs of the at least N−1 scan sub-clock outputs; and
a total duration of the sequence of non-overlapping sub-clock pulses is equal to or less than a total duration of a cycle of the signal on the SCLK input.

Clause 2. The array of memory cells of clause 1, wherein one of the N memory cells is configured to receive the signal on the SCLK input of the sequence generator on a flush input (FSH or/FSH), wherein N−1 of the N memory cells have flush inputs (FSH or/FSH) respectively coupled with N−1 of the at least N−1 scan sub-clock outputs, and wherein the pulse in the signal on the SCLK input is included in the sequence of non-overlapping sub-clock pulses.

Clause 3. The array of memory cells of any of the preceding clauses, wherein:
each memory cell includes at most one latch;
the memory cells are arranged in rows and columns; and
a row of the memory cells stores a data line including one or more data bytes.

Clause 4. The array of memory cells of any of the preceding clauses, wherein:
the first chain segment is included in a row of the memory cells.

Clause 5. The array of memory cells of clause 1, clause 2, or clause 3, wherein:
the first chain segment is included in a column of the memory cells.

Clause 6. The array of memory cells of any of the preceding clauses, wherein:
the scan chain further includes a second chain segment, including M of the memory cells; and
at least a part of the sequence of non-overlapping sub-clock pulses is applied to the memory cells in the first chain segment and at least a part of the sequence of non-overlapping sub-clock pulses is applied to the memory cells in the second chain segment.

Clause 7. The array of memory cells of clause 6, wherein the first chain segment and the second chain segment are separated by a segment buffer memory cell.

Clause 8. The array of memory cells of clause 6 or clause 7, wherein an input buffer of the array of memory cells includes a segment buffer memory cell.

Clause 9. The array of memory cells of any of the preceding clauses, wherein:
during the cycle of the signal on the SCLK input, bits stored in all memory cells in the scan chain are shifted one position in a direction from a scan chain input to a scan chain output;
the first chain segment includes a first memory cell and a second memory cell;
an output of the first memory cell is directly connected to an input of the second memory cell;
the first memory cell has a first flush input configured to receive a first non-overlapping sub-clock pulse and the second memory cell has a second flush input configured to receive a second non-overlapping sub-clock pulse; and
the second non-overlapping sub-clock pulse is earlier during the cycle of the signal on the SCLK input than the first non-overlapping sub-clock pulse.

Clause 10. The array of memory cells of any of the preceding clauses, wherein:
a memory cell has a data input (DI), a data output (DO), a scan input (SI), a scan output (SO), a scan enable input (SE), and a flush input (FSH); and
a memory cell includes exactly one latch.

Clause 11. The array of memory cells of clause 10, wherein:
the memory cell further includes a scan input multiplexer with a first input coupled with the data input (DI), a second input coupled with the scan input (SI), a mux output coupled with a data input of the exactly one latch, and a select input coupled with the scan enable input (SE); and
the scan input multiplexer is configured to couple the mux output with the data input (DI) when the scan enable input (SE) is deasserted and to couple the mux output with the scan input (SI) when the scan enable input (SE) is asserted.

Clause 12. The array of memory cells of any of the preceding clauses, wherein:
a memory cell includes exactly one latch, configured as a static random-access memory cell (an SRAM cell).

Clause 13. The array of memory cells of any of the preceding clauses, wherein the sequence generator comprises:
a pulse shaper to derive a short pulse from the signal on the SCLK input; and
a multi-tap delay line coupled with the at least N−1 scan sub-clock outputs, and with an input coupled with an output of the pulse shaper.

Clause 14. The array of memory cells of any of the preceding clauses, wherein the sequence generator comprises:
one of a frequency-locked loop (FLL), a phase-locked loop (PLL), and a delay-locked loop (DLL), with an input configured to receive the signal on the SCLK input; and
a clock divider with multiple outputs coupled with the at least N−1 scan sub-clock outputs, and with an input coupled with the FLL, PLL, or DLL.

Clause 15. The array of memory cells of any of the preceding clauses, further comprising:
a multiplexer having a first input coupled with an output of a third chain segment, a second input coupled with an output of a fourth chain segment, and an output coupled with a scan input of a fifth chain segment, wherein the multiplexer is configured to select either an output signal of the third chain segment or an output signal of the fourth chain segment.

Clause 16. A method of scanning memory cells in a scan chain, the scan chain including N memory cells indexed 1 through N counting from a scan input (SI) of the scan chain towards a scan output (SO) of the scan chain, wherein N is an integer greater than one (1), the method comprising shifting scan bit values in the N memory cells by one index during a cycle of a scan clock signal (an SCLK signal), using a sequence of non-overlapping sub-clock pulses, wherein a duration of the sequence of non-overlapping sub-clock pulses is equal to or shorter than a duration of the cycle of the SCLK signal.

Clause 17. The method of clause 16, further comprising:
applying a first pulse in the sequence of non-overlapping sub-clock pulses to memory cell N to copy a scan bit value from memory cell N−1 to memory cell N; and
applying a second pulse in the sequence of non-overlapping sub-clock pulses to memory cell N−1 to copy a scan bit value from memory cell N−2 to memory cell N−1.

Clause 18. The method of clause 17, wherein:
a number of pulses in the sequence of non-overlapping sub-clock pulses is greater than or equal to N; and
the sub-clock pulses in the sequence of non-overlapping sub-clock pulses are derived from a pulse in the SCLK signal.

Clause 19. The method of clause 16 or clause 17, wherein the scan chain comprises two or more chain segments each including a chain of up to M storage memory cells indexed 1 through M from a segment scan input to a segment scan output, wherein two chain segments are separated by a segment buffer memory cell, wherein M is an integer greater than one (1), the method further comprising:
applying a first pulse in the sequence of non-overlapping sub-clock pulses to a flush input of the segment buffer memory cell; and
applying subsequent pulses in the sequence of non-overlapping sub-clock pulses to the up to M storage memory cells in each chain segment.

1. Clause 20. The method of clause 19, wherein applying subsequent pulses in the sequence of non-overlapping sub-clock pulses to the up to M storage memory cells in each chain segment comprises: applying the subsequent pulses in the sequence of non-overlapping sub-clock pulses, starting at index M, counting backwards, and ending at index 1.

Clause 21. A method of testing and repairing a memory array that includes memory cells in a scan chain, comprising:
applying a series of scan clock pulses to the scan chain;
converting each of the scan clock pulses to a sequence of non-overlapping scan sub-clock pulses; applying the sequence of non-overlapping scan sub-clock pulses to flush inputs of the memory cells in the scan chain to shift read data out of the scan chain;
determining from the read data whether a memory cell in the scan chain has a fault condition;
upon determining that a memory cell in the scan chain has a fault condition, determining a location of the memory cell with the fault condition; and
upon determining the location, rerouting the scan chain to skip the location and to include redundant memory cells into the scan chain.

Clause 22. A semiconductor memory subsystem, comprising:
an array of memory cells including a scan chain having a first chain segment that includes N memory cells of the array of memory cells, wherein N is an integer number greater than 1; and
a sequence generator having a scan clock input (a SCLK input) and at least N−1 scan sub-clock outputs, wherein the at least N−1 scan sub-clock outputs are respectively coupled to one of the N memory cells in the first chain segment, and wherein the sequence generator, in response to receiving a pulse in a signal on the SCLK input (an SCLK signal), generates a sequence of non-overlapping sub-clock pulses that are sent to the at least N−1 scan sub-clock outputs with a single pulse of the sequence of non-overlapping sub-clock pulses on each of the at least N−1 scan sub-clock outputs; and
wherein a total duration of the sequence of non-overlapping sub-clock pulses is equal to or less than a total duration of a cycle of the SCLK signal.

Clause 23. The semiconductor memory subsystem of clause 22, wherein one of the N memory cells is configured to receive the signal on the SCLK input of the sequence generator on a flush input (FSH or/FSH), wherein N−1 of the N memory cells have flush inputs (FSH or/FSH) respectively coupled with N−1 of the at least N−1 scan sub-clock outputs, and wherein the pulse in the signal on the SCLK input is included in the sequence of non-overlapping sub-clock pulses.

Clause 24. The semiconductor memory subsystem of clauses 22 or 23, wherein:
each memory cell includes at most one latch;
the memory cells are arranged in rows and columns; and
a row of the memory cells stores a data line including one or more data bytes.

Clause 25. The semiconductor memory subsystem of any of the clauses 22 to 24, wherein:
the first chain segment is included in a row of the memory cells.

Clause 26. The semiconductor memory subsystem of clause 21, clause 22, or clause 24, wherein:
the first chain segment is included in a column of the memory cells.

Clause 27. The semiconductor memory subsystem of any of the clauses 22 to 26, wherein:
the scan chain further includes a second chain segment, including M of the memory cells; and
at least a part of the sequence of non-overlapping sub-clock pulses is applied to the memory cells in the first chain segment and at least a part of the sequence of non-overlapping sub-clock pulses is applied to the memory cells in the second chain segment.

Clause 28. The semiconductor memory subsystem of clause 27, wherein the first chain segment and the second chain segment are separated by a segment buffer memory cell.

Clause 29. The semiconductor memory subsystem of clause 27 or clause 28, wherein an input buffer of the array of memory cells includes a segment buffer memory cell.

Clause 30. The semiconductor memory subsystem of any of the clauses 21 to 29, wherein:
during the cycle of the signal on the SCLK input, bits stored in all memory cells in the scan chain are shifted one position in a direction from a scan chain input to a scan chain output;
the first chain segment includes a first memory cell and a second memory cell;
an output of the first memory cell is directly connected to an input of the second memory cell;

the first memory cell has a first flush input configured to receive a first non-overlapping sub-clock pulse and the second memory cell has a flush input configured to receive a second non-overlapping sub-clock pulse; and the second non-overlapping sub-clock pulse is earlier during the cycle of the signal on the SCLK input than the first non-overlapping sub-clock pulse.

Clause 31. The semiconductor memory subsystem of any of the clauses 21 to 30, wherein:

a memory cell has a data input (DI), a data output (DO), a scan input (SI), a scan output (SO), a scan enable input (SE), and a flush input (FSH); and a memory cell includes exactly one latch.

Clause 32. The semiconductor memory subsystem of clause 31, wherein:

the memory cell further includes a scan input multiplexer with a first input coupled with the data input (DI), a second input coupled with the scan input (SI), a mux output coupled with a data input of the latch, and a select input coupled with the scan enable input (SE); and the scan input multiplexer is configured to couple the mux output with the data input (DI) when the scan enable input (SE) is deasserted and to couple the mux output with the scan input (SI) when the scan enable input (SE) is asserted.

Clause 33. The semiconductor memory subsystem of any of the clauses 21 to 32, wherein:

a memory cell includes exactly one latch, configured as a static random-access memory cell (an SRAM cell).

Clause 34. The semiconductor memory subsystem of any of the clauses 21 to 33, wherein the sequence generator comprises:

a pulse shaper to derive a short pulse from the signal on the SCLK input; and a multi-tap delay line coupled with the at least N−1 scan sub-clock outputs, and with an input coupled with an output of the pulse shaper.

Clause 35. The semiconductor memory subsystem of any of the clauses 21 to 34, wherein the sequence generator comprises:

one of a frequency-locked loop (FLL), a phase-locked loop (PLL), and a delay-locked loop (DLL), with an input configured to receive the signal on the SCLK input; and a clock divider with multiple outputs coupled with the at least N−1 scan sub-clock outputs, and with an input coupled with the FLL, PLL, or DLL.

Clause 36. The semiconductor memory subsystem of any of the clauses 21 to 35, further comprising:

a multiplexer having a first input coupled with an output of a third chain segment, a second input coupled with an output of a fourth chain segment, and an output coupled with a scan input of a fifth chain segment, wherein the multiplexer is configured to select either an output signal of the third chain segment or an output signal of the fourth chain segment.

Described implementations of the subject matter can include one or more features, alone or in combination, of scan chains with flip-flops and latches, as described in the following clauses.

Clause 1. An electronic circuit comprising a flip-flop-based scan chain coupled with a latch-based scan chain, the electronic circuit further comprising:

a memory element coupled between a scan out (SO) output of the flip-flop-based scan chain and a scan in (SI) input of the latch-based scan chain;

wherein:

the memory element is configured to capture a value of a last flip-flop in the flip-flop-based scan chain and store the value for access by a first latch in the latch-based scan chain.

Clause 2. The electronic circuit of clause 1, wherein the memory element is an interface latch with a flush input (FSH input) that is asserted when a clock input (a CLK input) of a flip-flop in the flip-flop-based scan chain is de-asserted, and that is de-asserted when the CLK input of the flip-flop in the flip-flop-based scan chain is asserted.

Clause 3. The electronic circuit of clause 1 or clause 2, wherein the memory element is an interface flip-flop with a clock input (CLK input) that is asserted when a clock input (a CLK input) of a flip-flop in the flip-flop-based scan chain is asserted, and that is de-asserted when the CLK input of the flip-flop in the flip-flop-based scan chain is de-asserted.

Clause 4. The electronic circuit of any of the clauses 1 to 3, wherein the latch-based scan chain includes one or more chain segments.

Clause 5. An electronic circuit comprising a flip-flop-based scan chain coupled with a latch-based scan chain, the electronic circuit further comprising:

a sequence generator that generates a sequence of non-overlapping sub-clock pulses and outputs the non-overlapping sub-clock pulses to flush inputs (FSH inputs and/or/FSH inputs) or scan control inputs (SC inputs and/or/SC inputs) of latches in the latch-based scan chain;

a first circuit that delivers a scan start pulse that precedes a first scan clock pulse (a first SCLK pulse); and a combinational logic circuit that combines one of the non-overlapping sub-clock pulses with the scan start pulse to generate a combined pulse, and that delivers the combined pulse to a flush input of one of the latches in the latch-based scan chain.

Clause 6. The electronic circuit of clause 5, wherein the first circuit includes a pulse shaper configured to derive a short pulse from a scan enable (SE) signal.

Clause 7. The electronic circuit of clause 5 or clause 6, wherein the first circuit includes a pulse shaper configured to derive a short pulse from a scan control (SC) signal.

Clause 8. The electronic circuit of any of the clauses 5 to 7, wherein the latch-based scan chain includes one or more chain segments.

Clause 9. The electronic circuit of any of the clauses 5 to 8, wherein the one of the latches in the latch-based scan chain is a segment buffer cell.

Clause 10. A method to interface between a last flip-flop in a flip-flop-based part of a scan chain with a first latch in a latch-based part of the scan chain, the method comprising:

in an interface memory element, storing a value of the last flip-flop in the flip-flop-based part of the scan chain to obtain a stored value before or at a time of asserting clock inputs of flip-flops in the flip-flop-based part of the scan chain; and after the time of asserting the clock inputs of the flip-flops in the flip-flop-based part of the scan chain, using the stored value to set the value of the first latch in the latch-based part of the scan chain.

Clause 11. The method of clause 10, wherein the interface memory element is a flip-flop.

Clause 12. The method of clause 10 or clause 11, wherein the interface memory element is a latch with a flush input or a scan control input that is asserted when the clock inputs of the flip-flops are de-asserted, and that is de-asserted when the clock inputs of the flip-flops are asserted.

Clause 13. A method to interface between a last flip-flop in a flip-flop-based part of a scan chain with a first latch in a latch-based part of the scan chain, wherein the first latch in the latch-based part of the scan chain is not data carrying in a functional mode, the method comprising:
before a time of first asserting a clock input of the last flip-flop in the flip-flop-based part of the scan chain, deasserting a flush input or a scan control input of the first latch in the latch-based part of the scan chain to store a value of the last flip-flop in the flip-flop-based part of the scan chain; and
before a time of second asserting the clock input of the last flip-flop in the flip-flop-based part of the scan chain, asserting and deasserting flush inputs or scan control inputs of latches in the latch-based part of the scan chain using non-overlapping sub-clock pulses to assert and de-assert the flush inputs.

CONSIDERATIONS

We describe various implementations of a scannable memory array.

The technology disclosed can be practiced as a system, method, or article of manufacture. One or more features of an implementation can be combined with a base implementation. Implementations that are not mutually exclusive are taught to be combinable. One or more features of an implementation can be combined with other implementations. This disclosure periodically reminds the user of these options. Omission from some implementations of recitations that repeat these options should not be taken as limiting the combinations taught in the preceding sections—these recitations are hereby incorporated forward by reference into each of the implementations described herein.

Although the description has been described with respect to specific implementations thereof, these specific implementations are merely illustrative, and not restrictive. The description may reference specific structural implementations and methods and does not intend to limit the technology to the specifically disclosed implementations and methods. The technology may be practiced using other features, elements, methods and implementations. Implementations are described to illustrate the present technology, not to limit its scope, which is defined by the claims. Those of ordinary skill in the art recognize a variety of equivalent variations on the description above. For example, although the figures show signals, inputs and outputs that are asserted high, in other implementations any of the signals, inputs, or outputs may be asserted low (or vice versa). Where an example is given of a scan chain that is arranged along a row, in other implementations it may be arranged along a column (and vice versa). Although all examples are given showing scan chains or chain segments that are very short, these short chain segments simplify drawings and explanations, but in real-world implementations the scan chains or chain segments can be arbitrarily long. Although most examples show arrays of single-port memories, memories can have any number of write and read ports. Although the examples show memories that write and read full lines of data, other implementations can address a part of the columns or single columns, to write and read partial lines of data or even individual bits. Although the symbols in many drawings do not distinguish, memory cells may or may not be scannable.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although the description has been described with respect to specific implementations thereof, these specific implementations are merely illustrative, and not restrictive. For instance, many of the operations can be implemented in a System-on-Chip (SoC), application-specific integrated circuit (ASIC), programmable processor, in a programmable logic device such as a field-programmable gate array (FPGA), obviating a need for at least part of the dedicated hardware. Implementations may be as a single chip, or as a multi-chip module (MCM) packaging multiple semiconductor dies in a single package. All such variations and modifications are to be considered within the ambit of the present disclosed technology the nature of which is to be determined from the foregoing description.

Thus, while specific implementations have been described herein, latitudes of modification, various changes, and substitutions are intended in the foregoing disclosures, and it will be appreciated that in some instances some features of specific implementations will be employed without a corresponding use of other features without departing from the scope and spirit as set forth. Therefore, many modifications may be made to adapt a particular situation or material to the essential scope and spirit of the technology disclosed.

What is claimed is:

1. An array of memory cells, comprising:
a scan chain including a first chain segment that includes N memory cells of the array of memory cells;
wherein;
N is an integer number greater than 1;
the first chain segment is configured to receive a sequence of non-overlapping sub-clock pulses from a sequence generator, wherein the sequence generator has a scan clock input (an SCLK input) and at least N−1 scan sub-clock outputs;
each of the at least N−1 scan sub-clock outputs is coupled with one of the N memory cells;
upon receiving a pulse in a signal on the SCLK input, the sequence generator generates the sequence of non-overlapping sub-clock pulses and outputs the non-overlapping sub-clock pulses on respective individual scan sub-clock outputs of the at least N−1 scan sub-clock outputs; and
a total duration of the sequence of non-overlapping sub-clock pulses is equal to or less than a total duration of a cycle of the signal on the SCLK input.

2. The array of memory cells of claim 1, wherein one of the N memory cells is configured to receive the signal on the SCLK input of the sequence generator on a flush input (FSH or /FSH), wherein N−1 of the N memory cells have flush inputs (FSH or /FSH) respectively coupled with N−1 of the at least N−1 scan sub-clock outputs, and wherein the pulse in the signal on the SCLK input is included in the sequence of non-overlapping sub-clock pulses.

3. The array of memory cells of claim 1, wherein:
each memory cell includes at most one latch;
the memory cells are arranged in rows and columns; and
a row of the memory cells stores a data line including one or more successive data bytes.

4. The array of memory cells of claim 1, wherein:
the first chain segment is included in a row of the memory cells.

5. The array of memory cells of claim 1, wherein:
the first chain segment is included in a column of the memory cells.

6. The array of memory cells of claim 1, wherein:
the scan chain further includes a second chain segment, including M of the memory cells; and
at least a part of the sequence of non-overlapping sub-clock pulses is applied to the memory cells in the first chain segment and at least a part of the sequence of non-overlapping sub-clock pulses is applied to the memory cells in the second chain segment.

7. The array of memory cells of claim 6, wherein the first chain segment and the second chain segment are separated by a segment buffer memory cell.

8. The array of memory cells of claim 6, wherein an input buffer of the array of memory cells includes a segment buffer memory cell.

9. The array of memory cells of claim 1, wherein:
during the cycle of the signal on the SCLK input, bits stored in all memory cells in the scan chain are shifted one position in a direction from a scan chain input to a scan chain output;
the first chain segment includes a first memory cell and a second memory cell;
an output of the first memory cell is directly connected to an input of the second memory cell;
the first memory cell has a first flush input configured to receive a first non-overlapping sub-clock pulse and the second memory cell has a second flush input configured to receive a second non-overlapping sub-clock pulse; and
the second non-overlapping sub-clock pulse is earlier during the cycle of the signal on the SCLK input than the first non-overlapping sub-clock pulse.

10. The array of memory cells of claim 1, wherein:
a memory cell has a data input (DI), a data output (DO), a scan input (SI), a scan output (SO), a scan enable input (SE), and a flush input (FSH); and
a memory cell includes exactly one latch.

11. The array of memory cells of claim 10, wherein:
the memory cell further includes a scan input multiplexer with a first input coupled with the data input (DI), a second input coupled with the scan input (SI), a mux output coupled with a data input of the exactly one latch, and a select input coupled with the scan enable input (SE); and
the scan input multiplexer is configured to couple the mux output with the data input (DI) when the scan enable input (SE) is deasserted and to couple the mux output with the scan input (SI) when the scan enable input (SE) is asserted.

12. The array of memory cells of claim 1, wherein:
a memory cell includes exactly one latch, configured as a static random-access memory cell (an SRAM cell).

13. The array of memory cells of claim 1, wherein the sequence generator comprises:
a pulse shaper to derive a short pulse from the signal on the SCLK input; and
a multi-tap delay line coupled with the at least N−1 scan sub-clock outputs, and with an input coupled with an output of the pulse shaper.

14. The array of memory cells of claim 1, wherein the sequence generator comprises:
one of a frequency-locked loop (FLL), a phase-locked loop (PLL), and a delay-locked loop (DLL), with an input configured to receive the signal on the SCLK input; and
a clock divider with multiple outputs coupled with the at least N−1 scan sub-clock outputs, and with an input coupled with the FLL, PLL, or DLL.

15. The array of memory cells of claim 1, further comprising:
a multiplexer having a first input coupled with an output of a third chain segment, a second input coupled with an output of a fourth chain segment, and an output coupled with a scan input of a fifth chain segment, wherein the multiplexer is configured to select either an output signal of the third chain segment or an output signal of the fourth chain segment.

16. A method of scanning memory cells in a scan chain, the scan chain including N memory cells indexed 1 through N counting from a scan input (SI) of the scan chain towards a scan output (SO) of the scan chain, wherein N is an integer greater than one (1), the method comprising shifting scan bit values in the N memory cells by one index during a cycle of a scan clock signal (an SCLK signal), using a sequence of non-overlapping sub-clock pulses, wherein a duration of the sequence of non-overlapping sub-clock pulses is equal to or shorter than a duration of the cycle of the SCLK signal.

17. The method of claim 16, further comprising:
applying a first pulse in the sequence of non-overlapping sub-clock pulses to memory cell N to copy a scan bit value from memory cell N−1 to memory cell N; and
applying a second pulse in the sequence of non-overlapping sub-clock pulses to memory cell N−1 to copy a scan bit value from memory cell N−2 to memory cell N−1.

18. The method of claim 17, wherein:
a number of pulses in the sequence of non-overlapping sub-clock pulses is greater than or equal to N; and
the sub-clock pulses in the sequence of non-overlapping sub-clock pulses are derived from a pulse in the SCLK signal.

19. The method of claim 16, wherein the scan chain comprises two or more chain segments each including a chain of up to M storage memory cells indexed 1 through M from a segment scan input to a segment scan output, wherein two chain segments are separated by a segment buffer memory cell, wherein M is an integer greater than one (1), the method further comprising:
applying a first pulse in the sequence of non-overlapping sub-clock pulses to a flush input of the segment buffer memory cell; and
applying subsequent pulses in the sequence of non-overlapping sub-clock pulses to the up to M storage memory cells in each chain segment.

20. The method of claim 19, wherein applying subsequent pulses in the sequence of non-overlapping sub-clock pulses to the up to M storage memory cells in each chain segment comprises:
applying the subsequent pulses in the sequence of non-overlapping sub-clock pulses, starting at index M, counting backwards, and ending at index 1.

21. The method of claim 19, wherein:
a number of pulses in the sequence of non-overlapping sub-clock pulses is equal to or greater than M; and
the pulses in the sequence of non-overlapping sub-clock pulses are derived from a pulse in the SCLK signal.

22. A method of testing and repairing a memory array that includes memory cells in a scan chain, comprising:
applying a series of scan clock pulses to the scan chain;
converting each of the scan clock pulses to a sequence of non-overlapping scan sub-clock pulses;

applying the sequence of non-overlapping scan sub-clock pulses to flush inputs of the memory cells in the scan chain to shift read data out of the scan chain, wherein a total duration of the sequence of non-overlapping sub-clock pulses is equal to or less than a total duration of a cycle of a scan clock pulse;

determining from the read data whether a memory cell in the scan chain has a fault condition;

upon determining that a memory cell in the scan chain has a fault condition, determining a location of the memory cell with the fault condition; and upon determining the location, rerouting the scan chain to skip the location and to include redundant memory cells into the scan chain.

\* \* \* \* \*